(12) United States Patent
Kito et al.

(10) Patent No.: US 7,755,134 B2
(45) Date of Patent: Jul. 13, 2010

(54) NONVOLATILE SEMICONDUCTOR MEMORY DEVICE

(75) Inventors: Masaru Kito, Yokohama (JP);
Nobutoshi Aoki, Yokohama (JP);
Masaru Kidoh, Kawasaki (JP); Ryota Katsumata, Yokohama (JP); Masaki Kondo, Yokohama (JP); Naoki Kusunoki, Yokohama (JP); Toshiyuki Enda, Zushi (JP); Sanae Ito, Yokohama (JP); Hiroyoshi Tanimoto, Yokohama (JP); Hideaki Aochi, Kawasaki (JP); Akihiro Nitayama, Yokohama (JP); Riichiro Shirota, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 351 days.

(21) Appl. No.: 11/765,881

(22) Filed: Jun. 20, 2007

(65) Prior Publication Data

US 2007/0290253 A1 Dec. 20, 2007

(30) Foreign Application Priority Data

Jun. 20, 2006 (JP) .............................. 2006-170121

(51) Int. Cl.
*H01L 27/115* (2006.01)
(52) U.S. Cl. .............................. 257/316; 257/E21.681; 257/314
(58) Field of Classification Search ................. 257/314, 257/317, 316, E21.681
See application file for complete search history.

(56) References Cited

U.S. PATENT DOCUMENTS

| | | | |
|---|---|---|---|
| 5,889,304 A * | 3/1999 | Watanabe et al. | 257/321 |
| 2005/0242388 A1 * | 11/2005 | Willer et al. | 257/314 |
| 2005/0260814 A1 * | 11/2005 | Cho et al. | 438/257 |
| 2006/0038220 A1 * | 2/2006 | Kusters et al. | 257/315 |
| 2006/0145228 A1 | 7/2006 | Kito et al. | |
| 2006/0289905 A1 | 12/2006 | Kito et al. | |

FOREIGN PATENT DOCUMENTS

| | | |
|---|---|---|
| JP | 8-88285 | 4/1996 |
| JP | 2001-176989 | 6/2001 |
| JP | 2001-244351 | 9/2001 |

OTHER PUBLICATIONS

M. Kito, et al. "Vertex Channel Array Transistor (VCAT) Featuring sub-60nm High Performance and Highly manufacturable Trench Capacitor DRAM", Symposium on VLSI Technology Digest of Technical Papers, 2005, 3B-1, pp. 32-33.

* cited by examiner

*Primary Examiner*—Jerome Jackson, Jr.
*Assistant Examiner*—Paul A Budd
(74) *Attorney, Agent, or Firm*—Oblon, Spivak, McClelland, Maier & Neustadt, L.L.P.

(57) ABSTRACT

A nonvolatile semiconductor memory device includes: a semiconductor region; device isolation regions placed in the semiconductor region and extending in a column direction; a semiconductor layer placed on the semiconductor region and between the device isolation regions, and having a convex shape in cross section along a row direction; source/drain regions placed in the semiconductor layer and spaced from each other; a gate insulating film placed on the semiconductor layer between the source/drain regions; a floating gate electrode layer placed on the gate insulating film; an intergate insulating film placed on the floating gate electrode layer and upper surfaces of the device isolation regions; and a control gate electrode layer placed on the intergate insulating film and extending in the row direction.

6 Claims, 68 Drawing Sheets

NONVOLATILE SEMICONDUCTOR MEMORY DEVICE

CROSS-REFERENCE TO RELATED APPLICATIONS

This application is based upon and claims the benefit of priority from Japanese Patent Application No. 2006-170121, filed on Jun. 20, 2006, the entire contents of which are incorporated herein by reference.

BACKGROUND

1. Technical Field

The present invention relates to a nonvolatile semiconductor memory device and a manufacturing method thereof.

2. Description of Related Art

As a memory device (particularly, a flash memory) has a larger capacity, the short channel effect caused by a finer transistor increases. It becomes to make difficult to control threshold voltage, which causes remarkable degradation of the memory cell characteristic of operations such as writing, reading, etc. Accordingly, it is difficult to manufacture a large-capacity memory. As a memory cell becomes finer, the contact area between a floating gate electrode (FG) and a control gate electrode (CG) formed via an intergate insulation film decreases. Thus, the capacitance between the CG and the FG lowers, and a large CG bias is required to apply a sufficient potential to a channel, which may cause degradation of the insulating film between the CG and the FG and increase leak current. Thus, there is a large problem of how to improve a writing efficiency and lower the CG voltage during a writing operation.

To obtain a finer transistor, it is necessary to reduce the gate width and the channel length of a memory cell transistor. However, it is difficult to thin a gate insulating film, a floating gate polysilicon electrode layer, and an intergate insulating film formed between the floating and control gates which are stacked in a vertical direction because of the electric characteristic. Thus, the electric gate insulating film thickness viewed from the control gate electrode cannot be thinned. Consequently, the cutoff characteristic of the transistor is degraded, which is a problem in making the transistor finer.

A vertex channel array transistor (VCAT) formed on a bulk silicon substrate is applied to a trench capacitor DRAM for the first time (see M. Kito et al., "Vertex Channel Array Transistor (VCAT) Featuring sub-60 nm High Performance and manufacturable Trench Capacitor DRAM," 2005 Symposium on VLSI Technology Digest of Technical Papers, 3B-1, pp. 32-33). The VCAT utilizes vertexes as a channel between a top surface and (111) facet of a selective epitaxial silicon grown on active areas. The VCAT can be fabricated with a much simpler process than FIN array transistor and fit to the process integration of a trench capacitor DRAM cell. According to this VCAT, almost 2 times higher on-current, smaller sub-threshold swing and less body effect than a planar array transistor are demonstrated.

SUMMARY

According to a first aspect of the invention, there is provided a nonvolatile semiconductor memory device including: a semiconductor region; device isolation regions placed in the semiconductor region and extending in a column direction; a semiconductor layer placed on the semiconductor region and between the device isolation regions, and having a convex shape in cross section along a row direction; source/drain regions placed in the semiconductor layer and spaced from each other; a gate insulating film placed on the semiconductor layer between the source/drain regions; a floating gate electrode layer placed on the gate insulating film; an intergate insulating film placed on the floating gate electrode layer and upper surfaces of the device isolation regions; and a control gate electrode layer placed on the intergate insulating film and extending in the row direction.

According to a second aspect of the invention, there is provided a nonvolatile semiconductor memory device including: a semiconductor region; device isolation regions placed in the semiconductor region and extending in a column direction; a semiconductor layer placed on the semiconductor region and between the device isolation regions, and having a convex shape in cross section along a row direction; source/drain regions placed in the semiconductor layer and spaced from each other; a charge trap insulating film placed on the semiconductor layer between the source/drain regions; and a control gate electrode layer placed on the charge trap insulating film and extending in the row direction.

According to a third aspect of the invention, there is provided a manufacturing method of a nonvolatile semiconductor memory device, including: forming a first insulting film on a semiconductor region; etching predetermined regions of the first insulting film and the semiconductor region to form grooves; burying the grooves with a second insulating film to form device isolation regions; planarizing an entire semiconductor device surface; etching back the device isolation regions; removing the first insulating film to expose an upper surface of the semiconductor region; forming a semiconductor layer on the upper surface of the semiconductor region to have a convex shape in cross section along a row direction; forming a gate insulating film on the semiconductor layer; forming a floating gate electrode layer on the gate insulating film and the device isolation regions; forming an intergate insulating film on the floating gate electrode layer and the device isolation regions; and forming a control gate electrode layer on the intergate insulating film to extend in the row direction.

BRIEF DESCRIPTION OF THE DRAWINGS

FIG. 5A is a schematic drawing of a potential distribution during data retention, FIG. 5B is a schematic drawing of a band structure of a vertex, and FIG. 5C is a schematic drawing of a potential distribution during the writing operation;

FIG. 23A is a drawing to show the schematic sectional structure of a NAND-type memory cell array section taken on line I-I in FIG. 3; FIG. 23B is a drawing to show the schematic sectional structure of the NAND-type memory cell array section taken on line II-II in FIG. 3; and FIG. 23C is a drawing to show the schematic sectional structure of the NAND-type memory cell array section taken on line III-III in FIG. 3;

FIG. 24A is a drawing to show the schematic sectional structure of the NAND-type memory cell array section taken on line I-I in FIG. 3; FIG. 24B is a drawing to show the schematic sectional structure of the NAND-type memory cell array section taken on line II-II in FIG. 3; and FIG. 24C is a drawing to show the schematic sectional structure of the NAND-type memory cell array section taken on line III-III in FIG. 3;

FIG. 25A is a drawing to show the schematic sectional structure of the NAND-type memory cell array section taken on line I-I in FIG. 3; FIG. 25B is a drawing to show the schematic sectional structure of the NAND-type memory cell array section taken on line II-II in FIG. 3; and FIG. 25C is a drawing to show the schematic sectional structure of the NAND-type memory cell array section taken on line III-III in FIG. 3;

FIG. 35A is a drawing to show the schematic sectional structure of each memory cell transistor taken on line I-I in FIG. 3; FIG. 35B is a drawing to show the schematic sectional structure of each memory cell transistor taken on line III-III in FIG. 3; FIG. 35C is a schematic planar pattern drawing of a selective epitaxial layer of each memory cell transistor; and FIG. 35D is a drawing to show the schematic three-dimensional sectional structure of each memory cell transistor;

FIG. 36A is a schematic planar pattern drawing of dummy NAND cells; FIG. 36B is a drawing of a dummy cell nitrogen film formation process; FIG. 36C is a drawing of a dummy cell patterning process; and FIG. 36D is a drawing of a dummy cell memory cell transistor formation process;

FIG. 37A is a drawing to show the schematic sectional structure of a NAND-type memory cell array section taken on line I-I in FIG. 3; FIG. 37B is a drawing to show the schematic sectional structure of the NAND-type memory cell array section taken on line II-II in FIG. 3; and FIG. 37C is a drawing to show the schematic sectional structure of the NAND-type memory cell array section taken on line III-III in FIG. 3;

FIG. 38A is a drawing to show the schematic sectional structure of the NAND-type memory cell array section taken on line I-I in FIG. 3; FIG. 38B is a drawing to show the schematic sectional structure of the NAND-type memory cell array section taken on line II-II in FIG. 3; and FIG. 38C is a drawing to show the schematic sectional structure of the NAND-type memory cell array section taken on line III-III in FIG. 3;

FIG. 39A is a drawing to show the schematic sectional structure of the NAND-type memory cell array section taken on line I-I in FIG. 3; FIG. 39B is a drawing to show the schematic sectional structure of the NAND-type memory cell array section taken on line II-II in FIG. 3; and FIG. 39C is a drawing to show the schematic sectional structure of the NAND-type memory cell array section taken on line III-III in FIG. 3;

FIG. 40A is a drawing to show the schematic sectional structure of the NAND-type memory cell array section taken on line I-I in FIG. 3; FIG. 40B is a drawing to show the schematic sectional structure of the NAND-type memory cell array section taken on line II-II in FIG. 3; and FIG. 40C is a drawing to show the schematic sectional structure of the NAND-type memory cell array section taken on line III-III in FIG. 3;

FIG. 41A is a drawing to show the schematic sectional structure of the NAND-type memory cell array section taken on line I-I in FIG. 3; FIG. 41B is a drawing to show the schematic sectional structure of the NAND-type memory cell array section taken on line II-II in FIG. 3; and FIG. 41C is a drawing to show the schematic sectional structure of the NAND-type memory cell array section taken on line III-III in FIG. 3;

FIG. 42A is a drawing to show the schematic sectional structure of a NAND-type memory cell array section taken on line I-I in FIG. 3; FIG. 42B is a drawing to show the schematic sectional structure of the NAND-type memory cell array section taken on line II-II in FIG. 3; and FIG. 42C is a drawing to show the schematic sectional structure of the NAND-type memory cell array section taken on line III-III in FIG. 3;

FIG. 43A is a drawing to show the schematic sectional structure of a NAND-type memory cell array section taken on line I-I in FIG. 3; FIG. 43B is a drawing to show the schematic sectional structure of the NAND-type memory cell array section taken on line II-II in FIG. 3; and FIG. 43C is a drawing to show the schematic sectional structure of the NAND-type memory cell array section taken on line III-III in FIG. 3;

DETAILED DESCRIPTION

Figure 1:
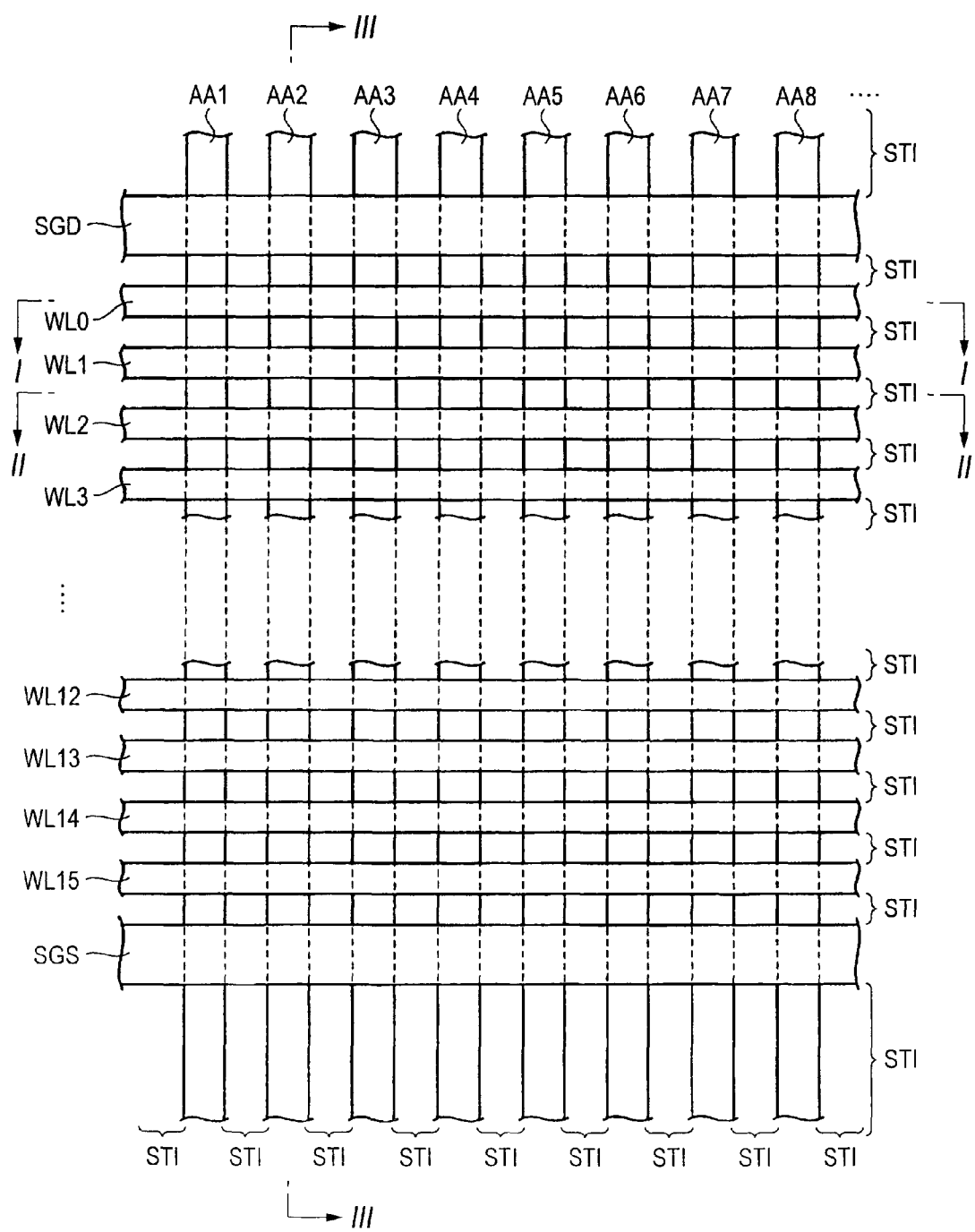
FIG. 1 is a drawing to show the schematic planar pattern configuration of a NAND-type nonvolatile semiconductor memory device according to first to fifth embodiments of the invention.

First to ninth embodiments of the invention will be described with reference to the accompanying drawings. The identical parts or similar parts described below with reference to the accompanying drawings are denoted by the same or similar reference numerals. However, it should be noted that the accompanying drawings are schematic and the relationship between the thickness and plane dimensions, the ratio among the thicknesses of layers, and the like are different from those which are actual. Therefore, the specific thicknesses and dimensions should be determined in consideration of the description to follow. The accompanying drawings contain portions where mutual dimension relationship and ratio differ, of course.

The following first to ninth embodiments illustrate apparatus and methods for embodying the technical idea of the invention and the technical idea of the invention does not limit the materials, shapes, structures, placement, etc., of components to those described below. Various changes can be applied without departing from the spirit and scope of the invention.

In a nonvolatile semiconductor memory device according to the embodiments of the invention, a convex shape is placed in a semiconductor region and a channel region is formed like a convex shape, whereby the cutoff characteristic of a memory cell transistor improves and the on-current also improves. The nonvolatile semiconductor memory device can be applied to various structures such as a stacked gate structure and a sidewall control gate structure which have a floating gate, and a MONOS structure and a SONOS structure which have a charge trapping insulating film. In the nonvolatile semiconductor memory device having a floating gate of the embodiments of the invention, the floating gate has an inverted Y shape, whereby it is possible to increase the coupling ratio with a control gate and obtain the characteristic improvement effect.

Various kinds of shapes such as a triangle, a trapezoid, etc. are applicable to the convex shape. Such a convex channel allows an electric field to concentrate on the corner of the vertex during the writing operation, thus electrons easily tunnel. As a result, the writing efficiency can be raised, and further the writing voltage can be reduced. At the same time, the cutoff characteristic of a memory cell transistor is improved and the on-current can also be increased. Since the electric field in the opposite direction (floating gate direction from the semiconductor substrate) is dispersed in the corner of the convex vertex, the electric field strength is weakened and the retaining characteristic is improved.

First Embodiment (Planar Pattern Configuration)

FIG. 1 shows a schematic planar pattern configuration in a memory cell array of a nonvolatile semiconductor memory device according to a first embodiment of the invention. The configuration includes: active regions AA1, AA2, AA3, AA4, AA5, AA6, AA7, AA8, . . . each extending in the column direction; device isolation regions (STI: Shallow Trench Isolation) each extending in the column direction for isolating the active regions AA1, AA2, AA3, AA4, AA5, AA6, AA7, AA8, . . . ; word lines WL0, WL1, WL2, WL3, . . . , WL15 each extending in the row direction; and selection gate lines SGD and SGS each extending in the row direction. Each of the selection gate lines SGD and SGS may include a plurality of lines.

In FIG. 1, line I-I represents a cut line along the row direction on the word line WL0, line II-II represents a cut line along the row direction on the device isolation region between the word lines WL1 and WL2, and line III-III represents a cut line along the column direction on the active region AA2.

(NAND-Type Circuit Configuration)

Figure 2:
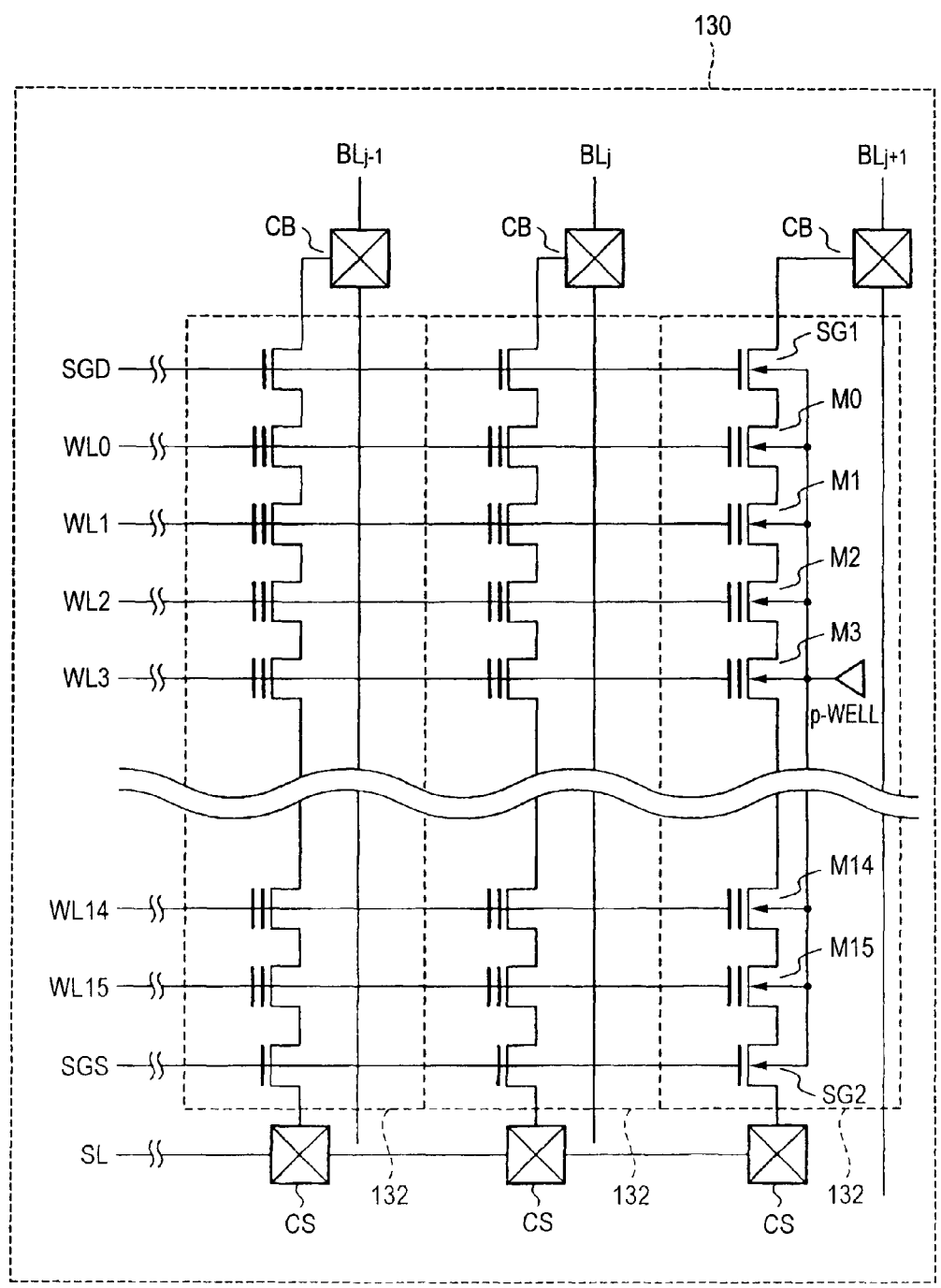
FIG. 2 is a drawing to show the schematic circuit configuration of the NAND-type nonvolatile semiconductor memory device according to the first to fifth embodiments of the invention.

A Memory Cell Array 130 of the Nonvolatile semiconductor memory device according to the first embodiment of the invention includes the schematic circuit configuration of a NAND-type memory cell array, as shown in FIG. 2. The circuit configuration of the NAND-type memory cell array in FIG. 2 is shown corresponding to the planar pattern configuration in FIG. 1.

A NAND cell unit 132 includes memory cell transistors M0 to M15 and selection gate transistors SG1 and SG2, as shown in FIG. 2. A drain of the selection gate transistor SG1 is connected to bit line $BL_{j-1}$, $BL_j$, $BL_{j+1}$ . . . through a bit line contact CB, and a source of the selection gate transistor SG2 is connected to a common source line SL through a source line contact CS.

The memory cell transistors M0 to M15 are connected in series through the source and drain regions of the memory cell transistors M0 to M15 in the column direction in which the bit line $BL_{j-1}$, $BL_j$, $BL_{j+1}$ extends. The selection gate transistors SG1 and SG2 are placed at both ends of a series connection of the memory cell transistors M0 to M15 so that the memory cell transistors M0 to M15 are connected to the bit line contact CB and the source line contact CS through the selection gate transistors SG1 and SG2. Consequently, one NAND cell unit 132 is formed. A plurality of NAND cell units 132 are placed side by side in the row direction in which the word lines WL0, WL1, WL2, WL3, . . . , WL14, WL15 extend orthogonal to the bit lines $BL_{j-1}$, $BL_j$, $BL_{j+1}$ . . .

(Device Structure)

Figure 3:
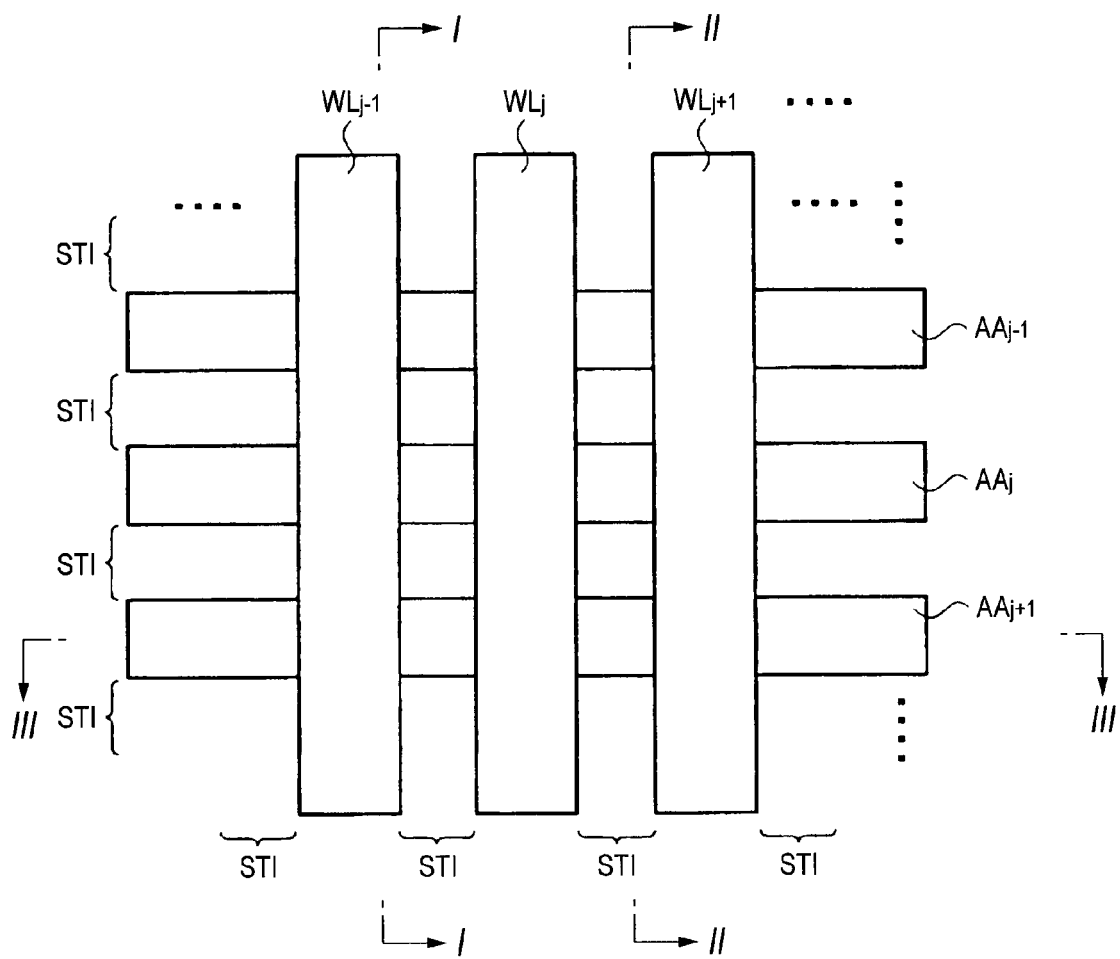
FIG. 3 is a drawing to show the enlarged schematic planar pattern configuration of a NAND-type memory cell array section, of the planar pattern configuration of the nonvolatile semiconductor memory device according to the first to fifth embodiments of the invention.

FIG. 3 shows the enlarged schematic planar pattern configuration of the NAND-type memory cell array section, of the planar pattern configuration of the nonvolatile semiconductor memory device according to the first embodiment of the invention. As shown in FIG. 3, the memory cell array includes: active regions AAj−1, AAj, AAj+1, . . . extending in the column direction; device isolation regions (STI) extending in the column direction for isolating the active regions AAj−1, AAj, AAj+1, . . . ; and word lines WLj−1, WLj, WLj+1, . . . extending in the row direction. In FIG. 3, as in FIG. 1, line I-I represents a cut line along the row direction on the word line WLj−1, line II-II represents a cut line along the row direction on the device isolation region between the word lines WLj and WLj+1, and line III-III represents a cut line along the column direction on the active region AAj+1.

Figure 4:
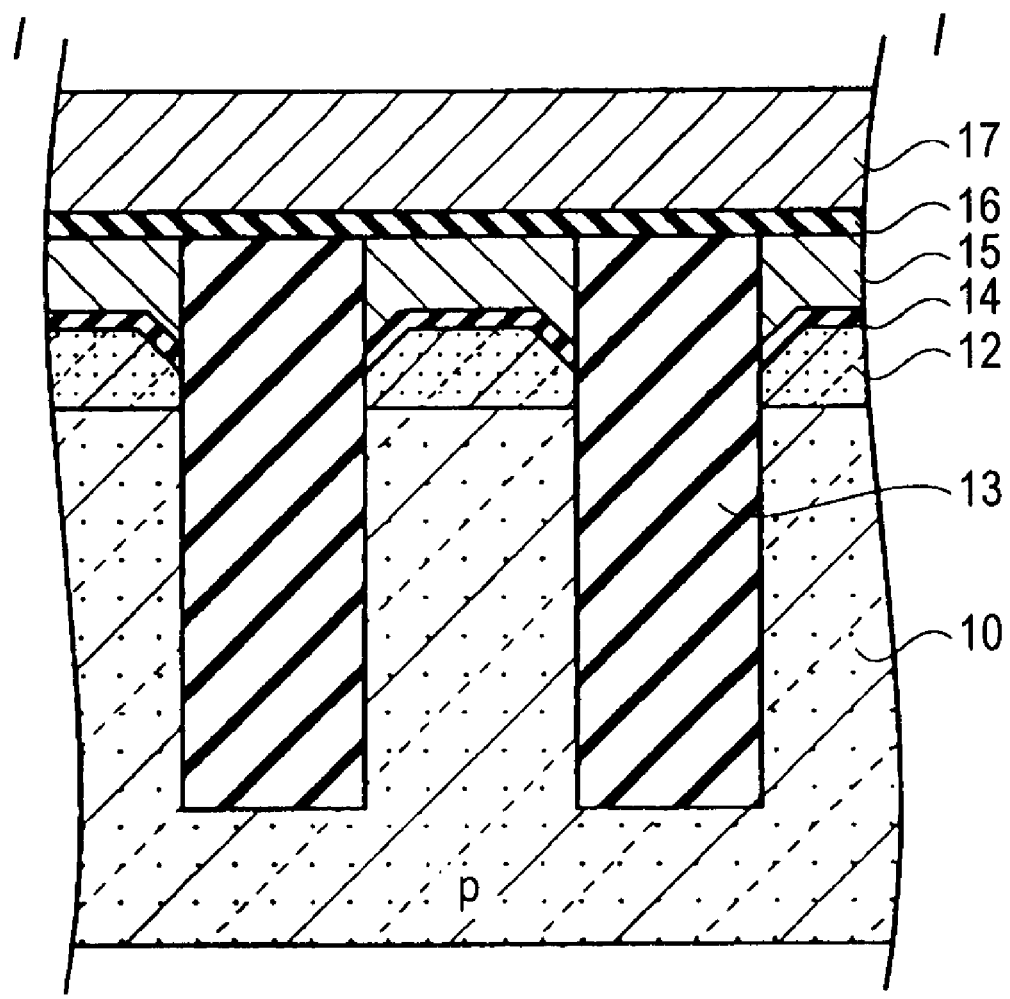
FIG. 4 is a drawing to show the schematic sectional structure of the NAND-type memory cell array section taken on line I-I in FIG. 3, of the nonvolatile semiconductor memory device according to the first embodiment of the invention.

FIG. 4 shows the schematic sectional structure of the NAND-type memory cell array section taken on line I-I in FIG. 3, of the sectional configuration of the nonvolatile semiconductor memory device according to the first embodiment. As shown in FIG. 4, the nonvolatile semiconductor memory device includes: a semiconductor region 10; device isolation regions (STI) 13 placed in the semiconductor region 10 and extending in the column direction; a selective epitaxial layer 12 placed on the semiconductor region 10 between the device isolation regions 13 and having a convex shape in cross section along the row direction; source/drain regions (not shown) placed in the selective epitaxial layer 12; a gate insulating film 14 placed between the device isolation regions 13 and placed on a region between the source/drain regions of the selective epitaxial layer 12; a floating gate polysilicon electrode layer (FG) 15 placed between the device isolation regions 13, having substantially the same height as (i.e., is substantially flush with) the upper surface of the device isolation region 13, and placed on the gate insulating film 14; an intergate insulating film 16 placed on the upper surfaces of the device isolation regions 13 and the floating gate polysilicon electrode layer (FG) 15; and a control gate polysilicon electrode layer (CG) 17 placed on the intergate insulating film 16 and extending in the row direction. The semiconductor region 10 may be a semiconductor substrate or may be a well region formed in a semiconductor substrate. The source/drain regions are placed in the selective epitaxial layer 12 interposed between the word lines when viewed from the upper surface of the memory cell array although the source/drain regions are not shown in FIG. 4. Further, the source/drain regions are spaced with respect to the column direction, similar to source/drain diffusion layers 40 shown in FIG. 41C. The gate insulating film 14 is formed on a region between adjacent source/drain regions of the selective epitaxial layer 12.

The selective epitaxial layer 12 is formed to have the convex shape having at least one or more wedge shape (in FIG. 4, has two wedge parts). Since an upper portion of the active region of the selective epitaxial layer 12 is formed to have a convex shape, the electric field at each wedge part strengthens, the floating gate polysilicon electrode layer (FG) 15 can obtain larger dominion over the channel region, so that the short channel characteristic improves. Since the substantial channel width increases, the cell current also increases. Further, not only the writing characteristic from the channel region into the floating gate polysilicon electrode layer (FG) 15 improves, but also the retention characteristic of retaining the charges in the floating gate polysilicon electrode layer (FG) 15, which are written into the floating gate polysilicon electrode layer (FG) 15, improves.

Figure 5:
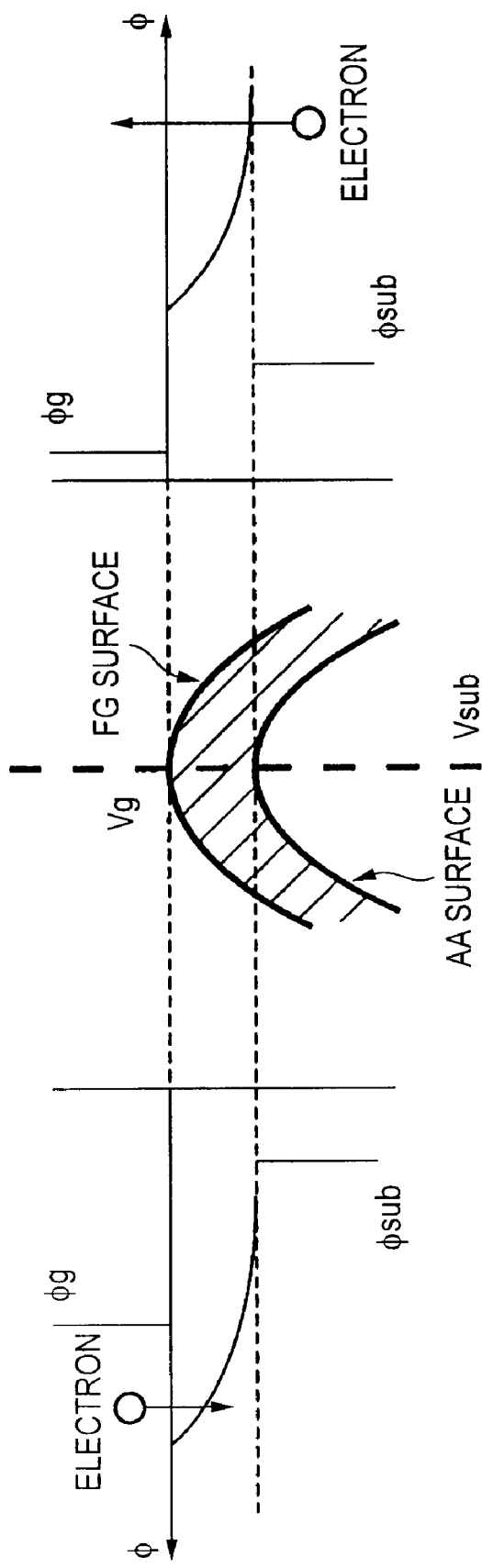
FIGS. 5A to 5C are operation schematic diagrams of a VCAT memory cell transistor of the nonvolatile semiconductor memory device according to the first embodiment of the invention.

FIGS. 5A to 5C are operation schematic diagrams to show the potential distribution of the vertex of the memory cell transistor of the nonvolatile semiconductor memory device according to the first embodiment of the invention. FIG. 5A is a schematic drawing of the potential distribution at the retention, FIG. 5B is a schematic drawing of a band structure of the vertex, and FIG. 5C is a schematic drawing of the potential distribution at the writing operation.

The improvement effects of the writing characteristic and the retention characteristic of the memory cell transistor of the nonvolatile semiconductor memory device of the first embodiment will be described.

As shown in FIG. 5C, if a positive bias is applied to the floating gate polysilicon electrode layer (FG) 15 to write an electron from the semiconductor region of the selective epitaxial layer 12 into the floating gate polysilicon electrode layer (FG) 15, an electric field increases in the vicinity of the silicon interface in a structure of selective epitaxial layer 12—gate insulating film 14—floating gate polysilicon electrode layer (FG) 15, and the potential barrier width decreases. Thus, the Fowler-Nordheim tunneling probability from the selective epitaxial layer 12 to the floating gate polysilicon electrode layer (FG) 15 increases. Therefore, the voltage applied to the floating gate polysilicon electrode layer (FG) 15 can be reduced as compared with a memory cell transistor of a flat structure. At the retention, as seen in FIG. 5A, the potential barrier width increases in the vicinity of the floating gate polysilicon electrode layer (FG) 15 interface in the structure of selective epitaxial layer 12—gate insulating film 14—floating gate polysilicon electrode layer (FG) 15. Thus, the tunneling probability of carriers from the floating gate polysilicon electrode layer (FG) 15 to the selective epitaxial layer 12 and the semiconductor region 10 decreases. Therefore, it is possible to suppress the leak current during the retention.

(Manufacturing Method)

A manufacturing method of the nonvolatile semiconductor memory device according to the first embodiment includes: forming a nitrogen film 22 as a first insulting film on a semiconductor region 10; etching parts of the nitrogen film 22 and the semiconductor region 10 to form grooves for device isolation regions 13; burying the grooves with an insulating material as a second insulting material to form the device isolation regions 13; planarizing an entire semiconductor device surface; etching back the second insulting material; removing the first insulating film to expose the upper surface of the semiconductor region 10; forming a selective epitaxial layer 12 as a semiconductor layer on the upper surface of the semiconductor region 10 to have a convex shape in a cross section along the row direction; forming a gate insulating film 14 on the semiconductor layer; forming a floating gate polysilicon electrode layer 15 on the gate insulating film 14 and the device isolation regions 13 and planarizing the entire semiconductor device surface; forming an intergate insulating film 16 on the floating gate polysilicon electrode layer 15 and the device isolation regions 13; and forming a control gate polysilicon electrode layer 17 on the intergate insulating film 16 and extending in the row direction.

The manufacturing process of the nonvolatile semiconductor memory device will be described in detail with reference to FIGS. 6 to 10. FIGS. 6 to 10 represent the schematic sectional structure taken on line I-I in FIG. 3.

Figure 6:
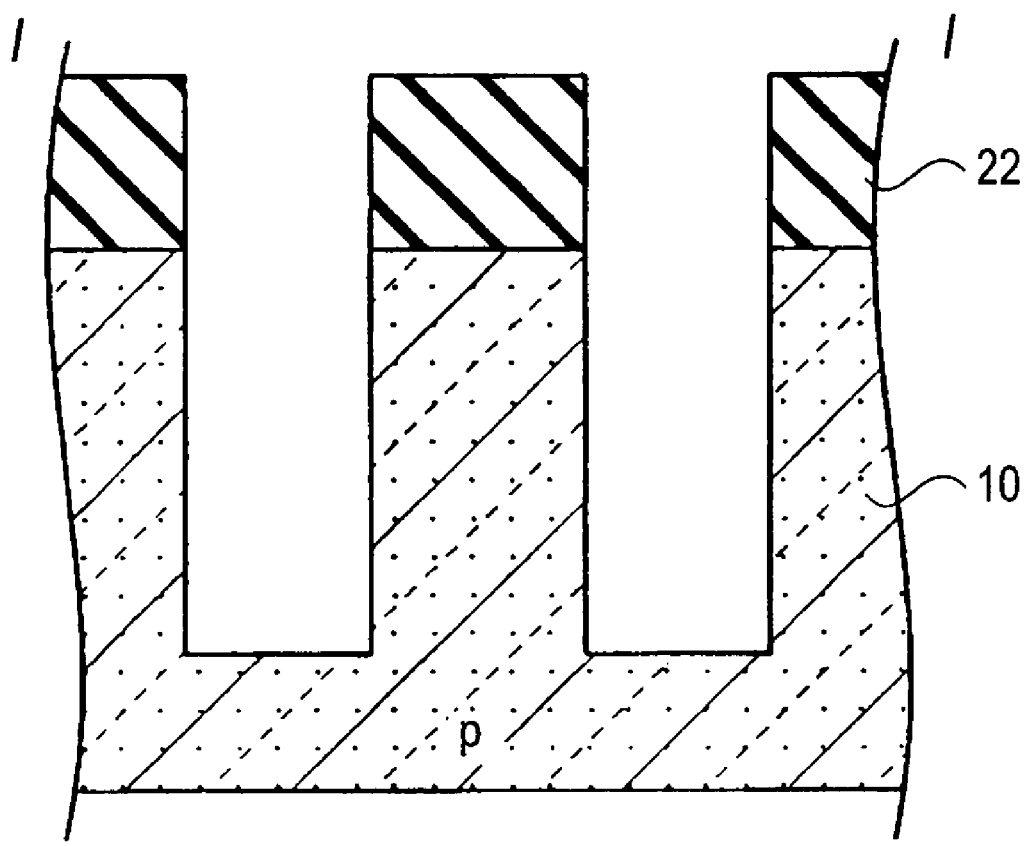
FIG. 6 shows a process of a manufacturing method of the nonvolatile semiconductor memory device according to the first embodiment of the invention and is a drawing to show the schematic sectional structure taken on line I-I in FIG. 3.

(a) First, a nitrogen film 22 having a thickness of about 150 nm as a cap film on a semiconductor region 10, as shown in FIG. 6. Here, thermal oxidation may be executed on the semiconductor region 10 to form a thermal oxide film having a thickness of about 2 nm before the nitrogen film 22 is formed. The semiconductor region 10 may be a semiconductor substrate or may be a well region formed in a semiconductor substrate.

(b) Further, a resist pattern is formed on a device formation region using lithography, and then the nitrogen film 22 and the semiconductor region 10 are etched with the resist pattern as a mask to form device isolation regions 13. The etching depth in this etching process is about 300 nm, for example. Although the nitrogen film 22 is used as the first insulating film, any material can be used if it can be selectively etched with the burying material used for the device isolation regions 13 such as a silicon oxide, tetraethoxydisilane (TEOS), etc.

Figure 7:
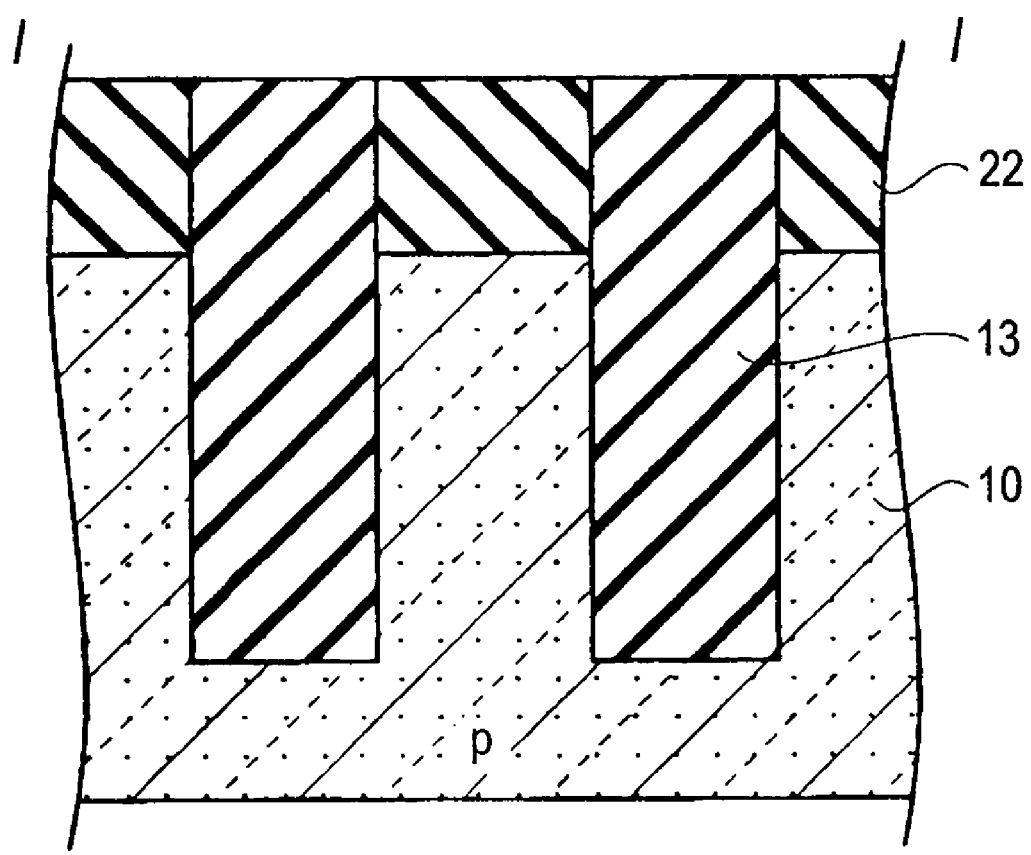
FIG. 7 shows a process of the manufacturing method of the nonvolatile semiconductor memory device according to the first embodiment of the invention and is a drawing to show the schematic sectional structure taken on line I-I in FIG. 3.

(c) Next, grooves for the device isolation regions 13 are buried with an insulating material, such as a silicon oxide, HTO (High Temperature Oxide), TEOS, etc., to form the device isolation regions 13, as shown in FIG. 7. Although a silicon oxide, HTO (High Temperature Oxide), TEOS, etc., is used as the buried insulating film, any material can be used if it is an insulting film having selectivity when the nitrogen film 22 is etched.

(d) Further, the semiconductor device surface is planarized by chemical-mechanical polishing (CMP), as shown in FIG. 7.

(e) Next, the buried oxides of the device isolation regions 13 are etched with a dilute sulfuric acid and are etched back to any desired height.

Figure 8:
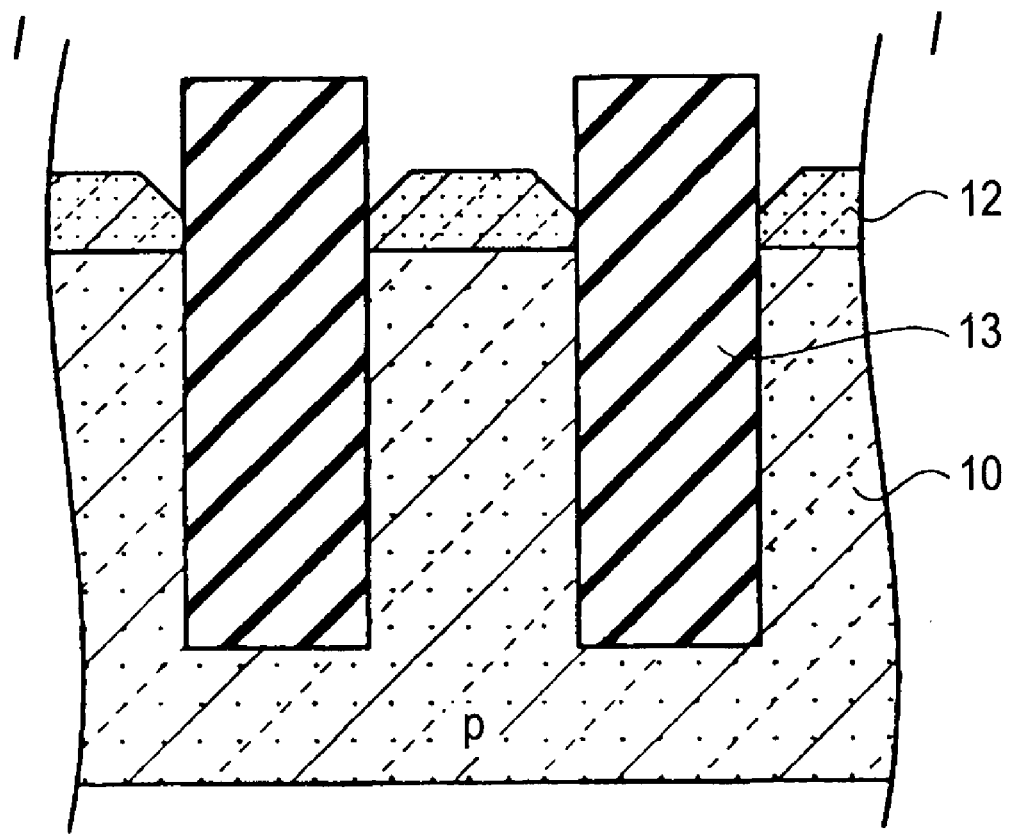
FIG. 8 shows a process of the manufacturing method of the nonvolatile semiconductor memory device according to the first embodiment of the invention and is a drawing to show the schematic sectional structure taken on line I-I in FIG. 3.

(f) Next, the nitrogen film 22 on the semiconductor region 10 is peeled off by etching removal in a chemical solution such as a thermal phosphoric acid ($H_3PO_4$) to expose the upper surface of the semiconductor region 10, as shown in FIG. 8.

(g) Further, the thermal oxide film on the semiconductor region 10 is removed in a chemical solution based on a hydrofluoric acid and then a selective epitaxial layer 12 is epitaxially grown only on the upper surface of the semiconductor region 10 by selective epitaxial growth (SEG), as shown in FIG. 8. In this time, trapezoidal or triangular shaped selective epitaxial layer 12 can be formed on the flat semiconductor region 10 by controlling temperature, pressure, gas flow rate, etc. The semiconductor region which will become an active region is not limited to the epitaxial growth layer and may be formed using a bulk semiconductor if they are of the same shape.

Figure 13:
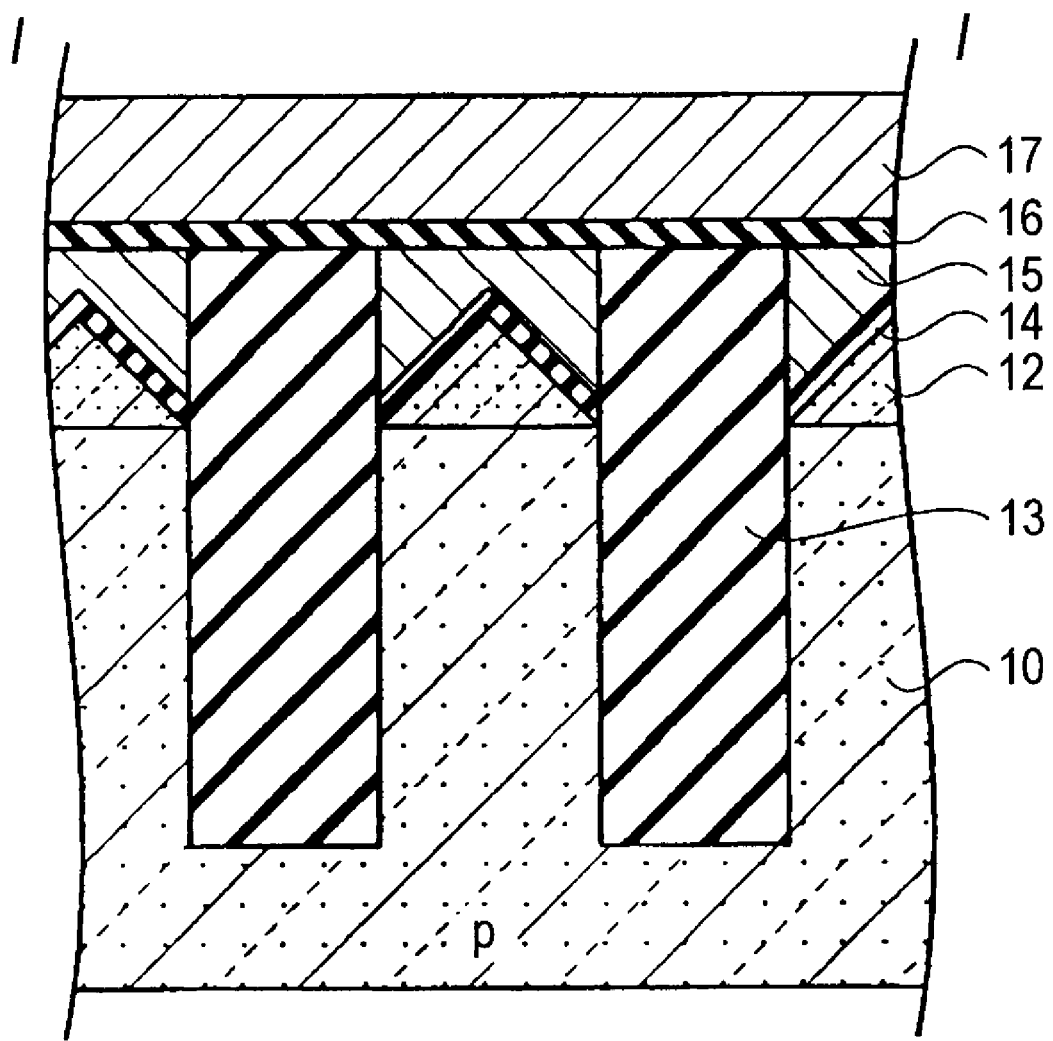
FIG. 13 is a drawing to show the schematic sectional structure of a NAND-type memory cell array section taken on line I-I in FIG. 3, of a nonvolatile semiconductor memory device according to modified example 3 of the first embodiment of the invention.
Figure 14:
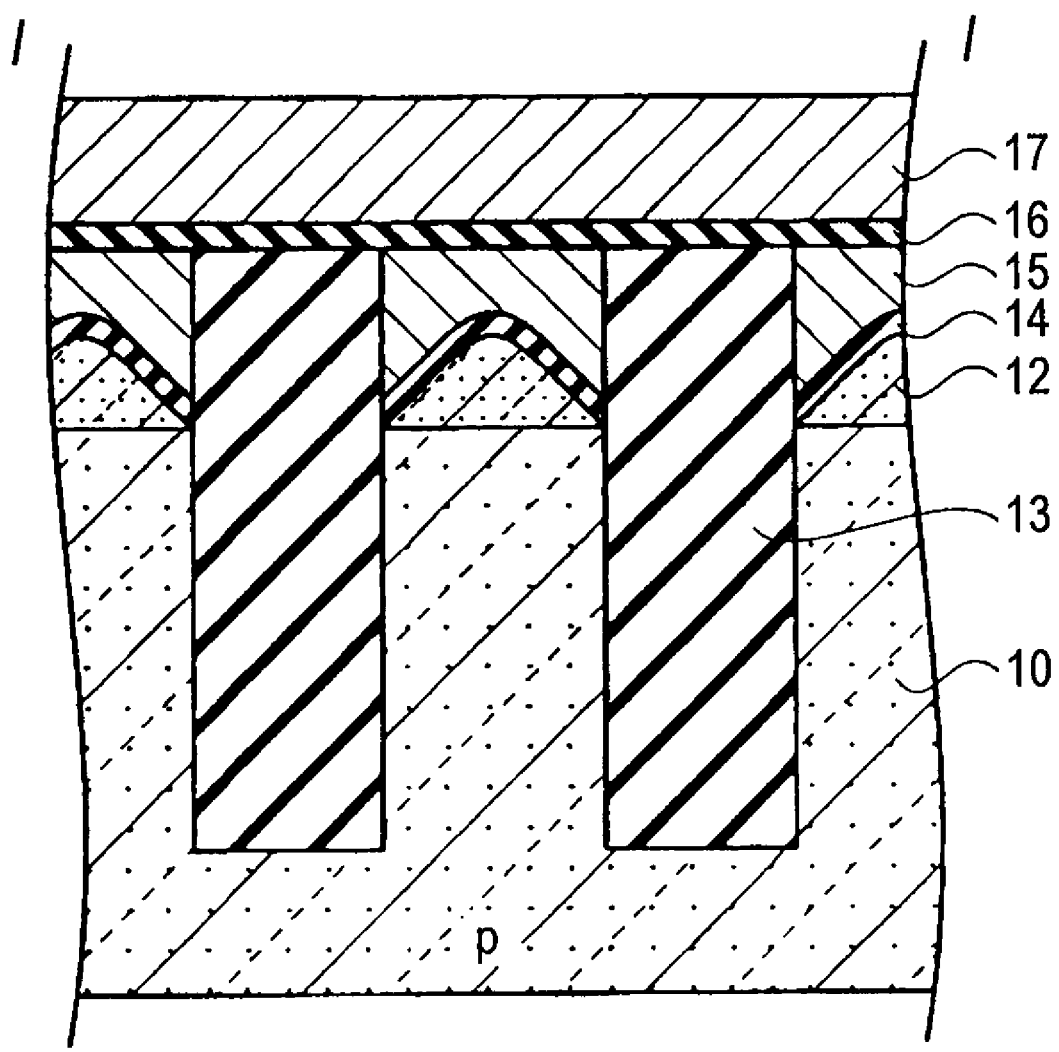
FIG. 14 is a drawing to show the schematic sectional structure of a NAND-type memory cell array section taken on line I-I in FIG. 3, of a nonvolatile semiconductor memory device according to modified example 4 of the first embodiment of the invention.
Figure 15:
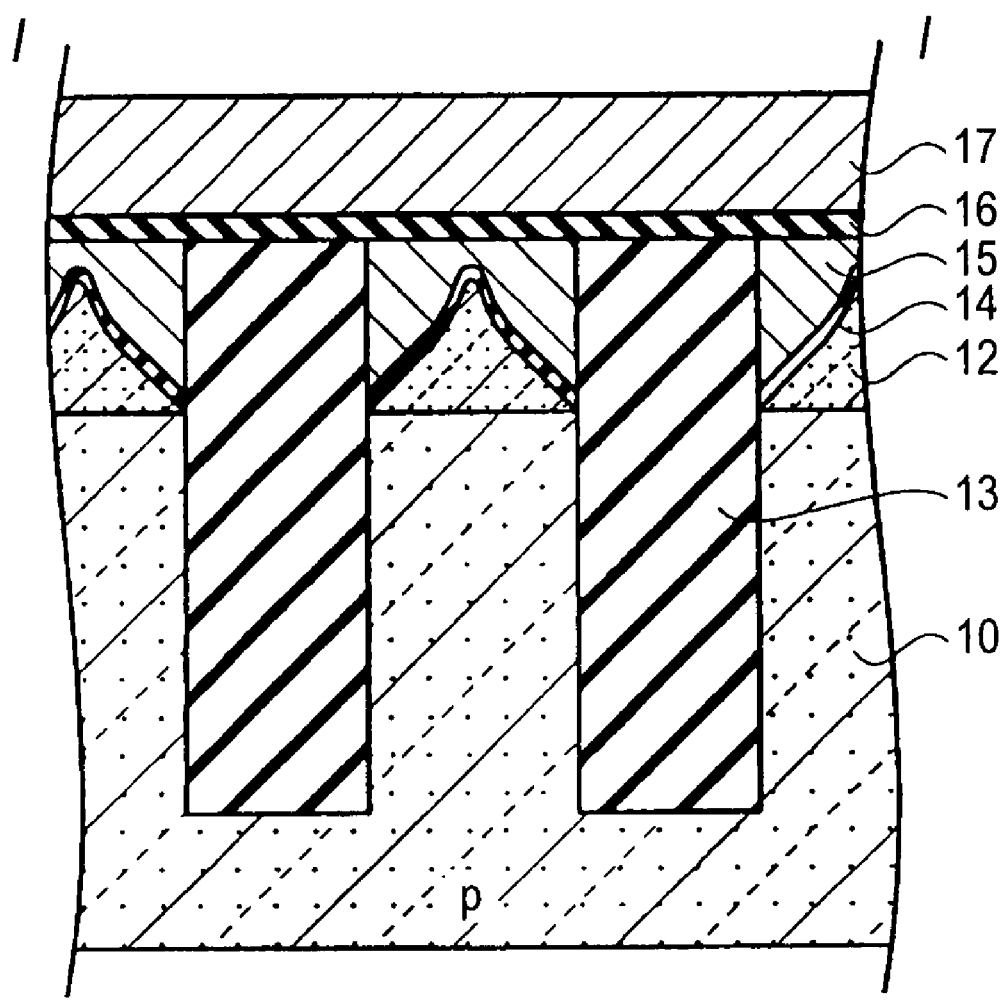
FIG. 15 is a drawing to show the schematic sectional structure of a NAND-type memory cell array section taken on line I-I in FIG. 3, of a nonvolatile semiconductor memory device according to modified example 5 of the first embodiment of the invention.

In the first embodiment of the invention, the sectional shape of the selective epitaxial layer 12 taken on line I-I in FIG. 3 is a trapezoid, but may be a triangle as shown in FIG. 13. After the selective epitaxial layer 12 is formed, the wedge part can also be rounded by oxidation treatment or wet treatment as shown in FIG. 14, or the oblique sides of a triangle can also be dented as shown in FIG. 15.

In the first embodiment of the invention, the convex shape of the active region is formed by the selective epitaxial growth. However, the semiconductor region 10 with the convex shape may be formed by other methods such as a selective etching method using the fact that a (wet) etching rate varies depending on a plane direction.

Figure 9:
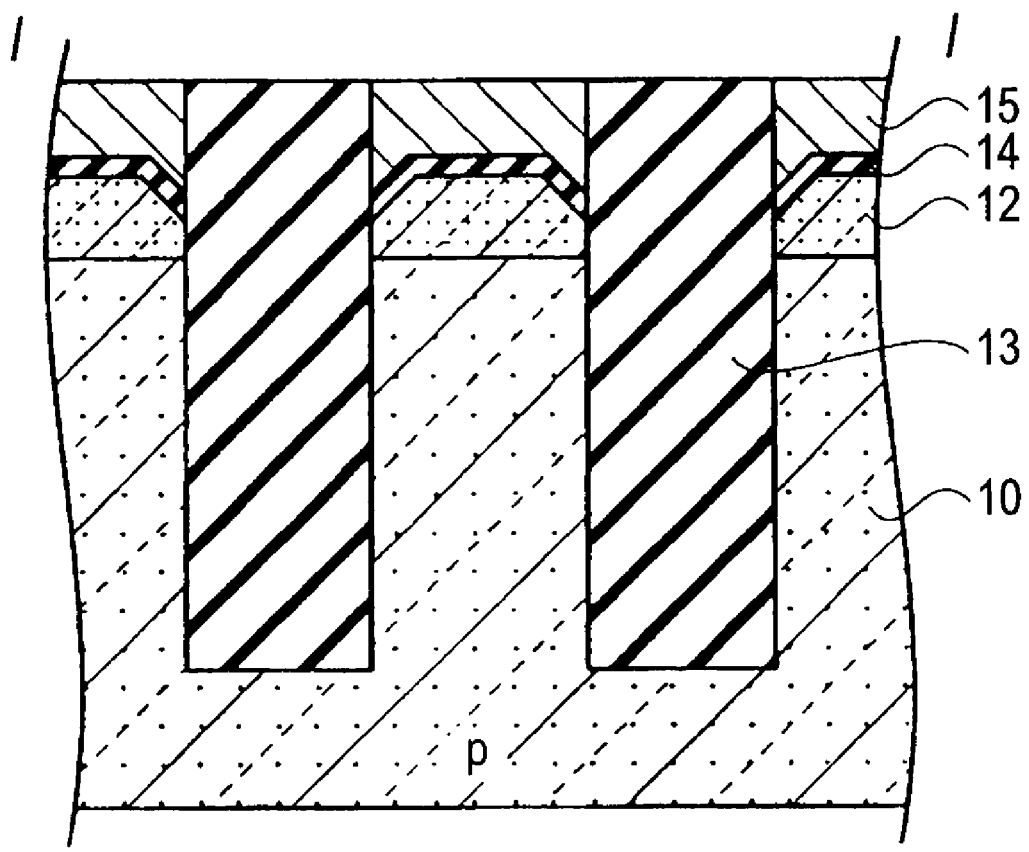
FIG. 9 shows a process of the manufacturing method of the nonvolatile semiconductor memory device according to the first embodiment of the invention and is a drawing to show the schematic sectional structure taken on line I-I in FIG. 3.

(f) Next, the gate insulating film 14 is formed as shown in FIG. 9. The gate insulating film 14 may be formed by depositing an insulating film or may be formed by heat treatment of an oxidation process. The oxidation process may be used together as a process of rounding a vertex of the convex shape.

(g) Further, polysilicon is deposited on the upper surface of the gate insulating film 14 and the device isolation regions 13 and then is planarized by CMP as shown in FIG. 9. The polysilicon may be doped with impurities at the deposition or may be doped by ion implantation after forming the polysilicon film. Consequently, the floating gate polysilicon electrode layer (FG) 15 is formed as shown in FIG. 9. In the first embodiment of the invention, polysilicon is used as the floating gate electrode layer (FG) as an example.

Figure 10:
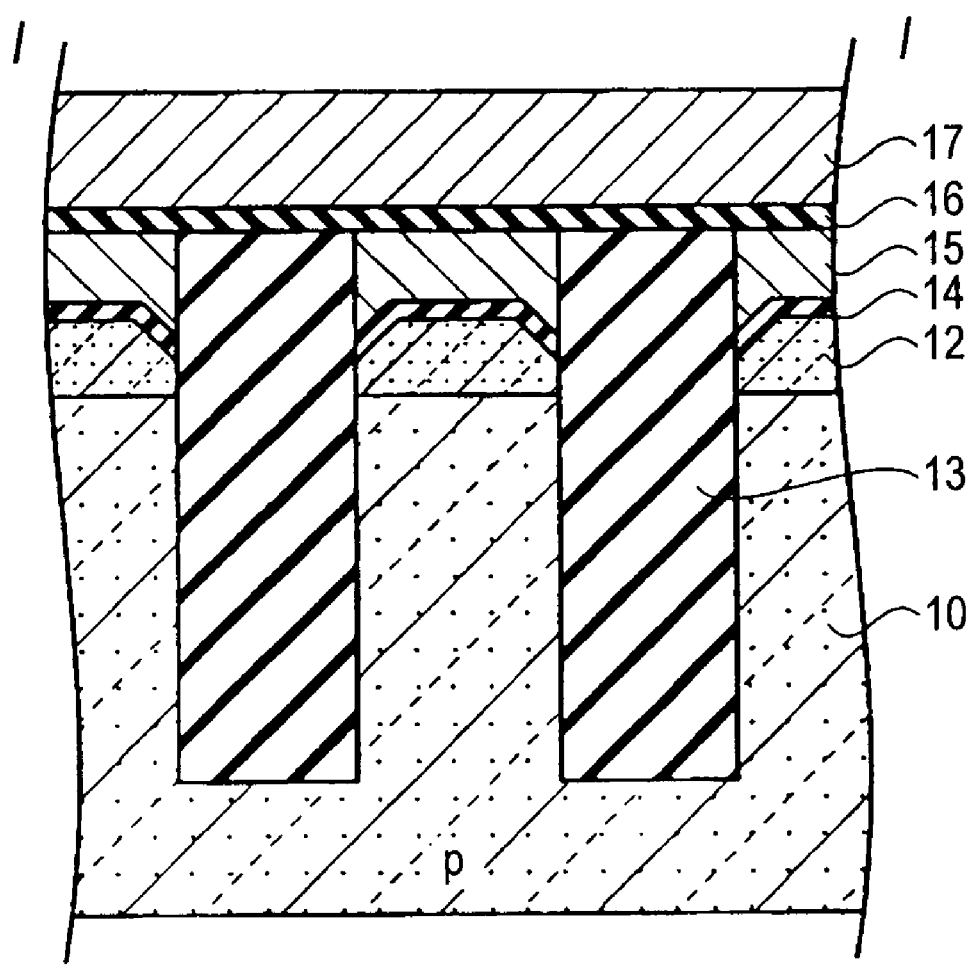
FIG. 10 shows a process of the manufacturing method of the nonvolatile semiconductor memory device according to the first embodiment of the invention and is a drawing to show the schematic sectional structure taken on line I-I in FIG. 3.

(h) Next, an intergate insulating film 16 is formed on the upper surface of the floating gate polysilicon electrode layer (FG) 15 and the device isolation regions 13, and then a control gate polysilicon electrode layer (CG) 17 is formed as shown in FIG. 10. In the first embodiment of the invention, polysilicon is used as the control gate electrode layer (CG) 17 as an example.

The intergate insulating film 16 formed between the floating gate polysilicon electrode layer (FG) 15 and the control gate polysilicon electrode layer (CG) 17 is called inter-poly-Si dielectrics (IPD). An oxide film, a nitrogen film, a deposition film of oxide and nitrogen films, or the like is used as the material of the intergate insulating film 16. In the first embodiment of the invention, polysilicon material is used for both of the floating gate polysilicon electrode layer (FG) 15 and the control gate polysilicon electrode layer (CG) 17, but metal such as silicide may be used.

(i) Next, gate working and diffusion layer formation are performed according to a usual electrode formation method, whereby the nonvolatile semiconductor memory device of the first embodiment is completed.

MODIFIED EXAMPLE 1

Figure 11:
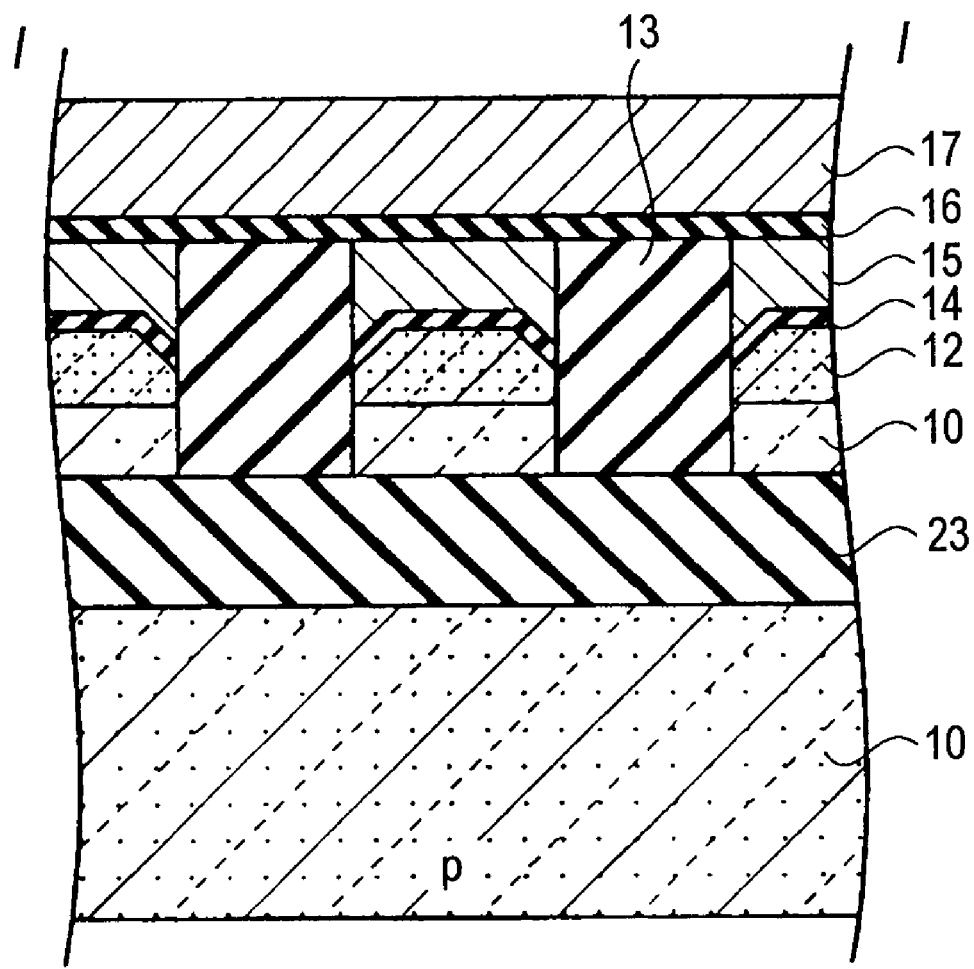
FIG. 11 is a drawing to show the schematic sectional structure of a NAND-type memory cell array section taken on line I-I in FIG. 3, of a nonvolatile semiconductor memory device according to modified example 1 of the first embodiment of the invention.

FIG. 11 shows a schematic sectional structure of a NAND-type memory cell array section taken on line I-I in FIG. 3, of a nonvolatile semiconductor memory device according to modified example 1 of the first embodiment. As shown in FIG. 11, the nonvolatile semiconductor memory device includes: a semiconductor region 10; a buried oxide (BOX) 23 placed in the semiconductor region 10; device isolation regions 13 placed in the semiconductor region 10 that is positioned on the buried oxide (BOX) 23, and extending in the column direction; a selective epitaxial layer 12 placed between the device isolation regions 13, placed on the semiconductor region 10 and above the buried oxide (BOX) 23, and having a trapezoidal shape in cross section along the row direction; source/drain regions (not shown) placed in the selective epitaxial layer 12; a gate insulating film 14 placed between the device isolation regions 13 and placed on a region between the source/drain regions of the selective epitaxial layer 12; a floating gate polysilicon electrode layer (FG) 15 placed between the device isolation regions 13, having substantially the same height as the upper surface of the device isolation region 13, and placed on the gate insulating film 14; an intergate insulating film 16 placed on the upper surface of the device isolation regions 13 and the floating gate polysilicon electrode layer (FG) 15; and a control gate polysilicon electrode layer (CG) 17 placed on the intergate insulating film 16 and extending in the row direction. The semiconductor region 10 may be a semiconductor substrate or may be a well region formed in a semiconductor substrate. The source/drain regions are placed in the selective epitaxial layer 12 interposed between the word lines when viewed from the upper surface of the memory cell array although the source/drain regions are not shown in FIG. 11.

The semiconductor region 10 on the buried oxide 23 becomes an active region AA. A method for forming a convex shape formed on the upper surface of the semiconductor region 10 on the buried oxide 23 can be performed by selective epitaxial growth (SEG), a selective etching method, etc, as with a bulk semiconductor substrate.

MODIFIED EXAMPLE 2

Figure 12:
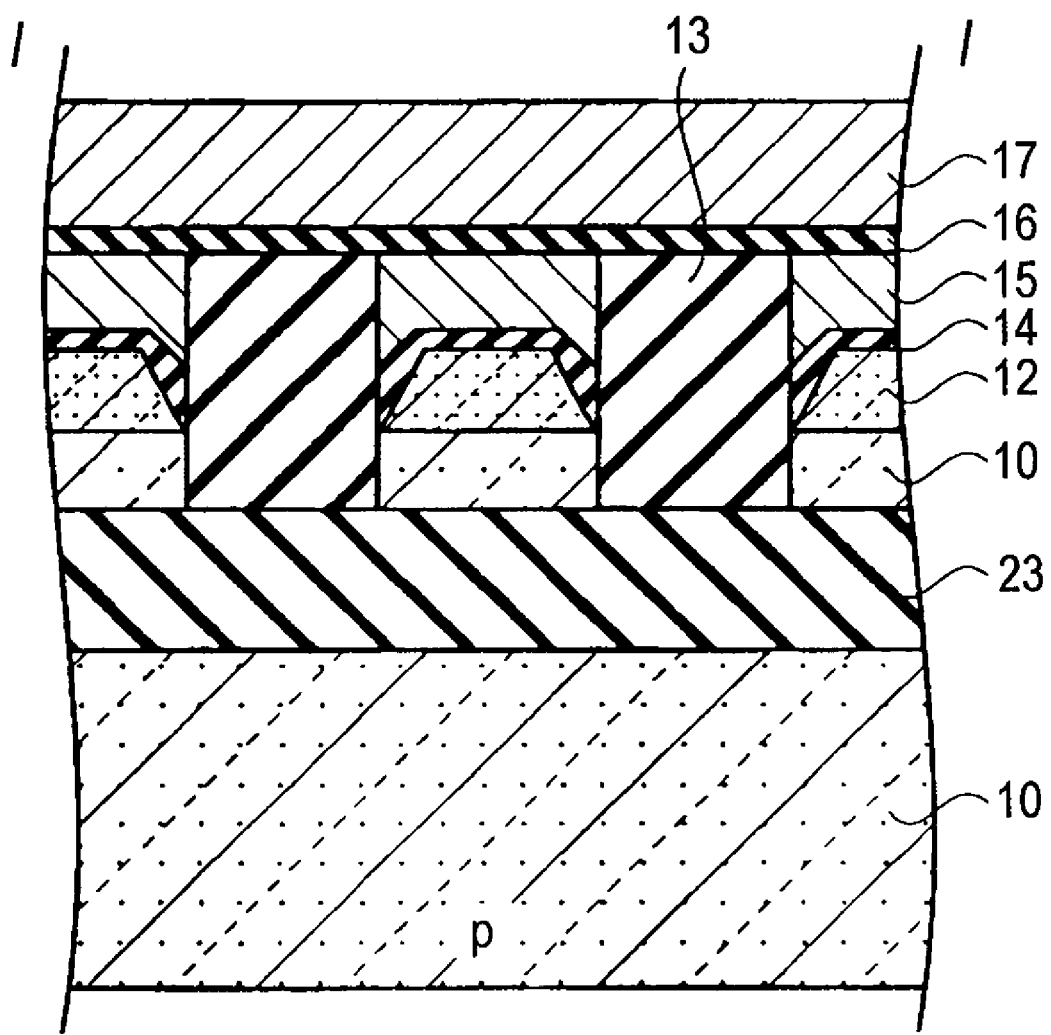
FIG. 12 is a drawing to show the schematic sectional structure of a NAND-type memory cell array section taken on line I-I in FIG. 3, of a nonvolatile semiconductor memory device according to modified example 2 of the first embodiment of the invention.

FIG. 12 shows a schematic sectional structure of a NAND-type memory cell array section taken on line I-I in FIG. 3, of a nonvolatile semiconductor memory device according to modified example 2 of the first embodiment. As shown in FIG. 12, the nonvolatile semiconductor memory device includes: a semiconductor region 10; a buried oxide 23 placed in the semiconductor region 10; device isolation regions 13 placed in the semiconductor region 10 that is positioned on the buried oxide 23, and extending in the column direction; a selective epitaxial layer 12 placed between the device isolation regions 13, placed on the semiconductor region 10 and above the buried oxide 23, and having a trapezoidal shape in cross section along the row direction; source/drain regions (not shown) placed in the selective epitaxial layer 12; a gate insulating film 14 placed between the device isolation regions 13 and placed on a region between the source/drain regions of the selective epitaxial layer 12; a floating gate polysilicon electrode layer (FG) 15 placed between the device isolation regions 13, having substantially the same height as the upper surface of the device isolation region 13, and placed on the gate insulating film 14; an intergate insulating film 16 placed on the upper surfaces of the device isolation regions 13 and the floating gate polysilicon electrode layer (FG) 15; and a control gate polysilicon electrode layer (CG) 17 placed on the intergate insulating film 16 and extending in the row direction. The gate insulating film 14 placed on a side wall of the selective epitaxial layer 12, especially in a vicinity of an interface between the trapezoidal selective epitaxial growth layer 12 and the semiconductor region 10, is formed thicker than the gate insulating film 14 placed on the upper surface of the selective epitaxial layer 12.

Accordingly, a capacitance between the floating gate polysilicon electrode layer (FG) 15 and the selective epitaxial layer 12 can be effectively reduced, and the controllability of the floating gate polysilicon electrode layer (FG) 15 to the selective epitaxial layer 12 can be improved by a capacitance division of the voltage applied to the control gate polysilicon electrode layer (CG) 17.

The semiconductor region 10 may be a semiconductor substrate or may be a well region formed in a semiconductor substrate. The source/drain regions are placed in the selective epitaxial layer 12 interposed between the word lines when viewed from the upper surface of the memory cell array although the source/drain regions are not shown in FIG. 12.

The semiconductor region 10 on the buried oxide 23 becomes an active region AA. A method for forming a convex shape formed on the upper surface of the semiconductor region 10 on the buried oxide 23 can be performed by selective epitaxial growth (SEG), a selective etching method, etc, as with a bulk semiconductor substrate.

MODIFIED EXAMPLE 3

FIG. 13 shows a schematic sectional structure of a NAND-type memory cell array section taken on line I-I in FIG. 3, of a nonvolatile semiconductor memory device according to modified example 3 of the first embodiment. As shown in FIG. 13, the nonvolatile semiconductor memory device includes: a semiconductor region 10; device isolation regions 13 placed in the semiconductor region 10 and extending in the column direction; a selective epitaxial layer 12 placed between the device isolation regions 13, placed on the semiconductor region 10, and having a triangular shape in cross section along the row direction; source/drain regions (not shown) placed in the selective epitaxial layer 12; a gate insulating film 14 placed between the device isolation regions 13 and placed on a region between the source/drain regions of the selective epitaxial layer 12; a floating gate polysilicon electrode layer (FG) 15 placed between the device isolation regions 13, having substantially the same height as the upper surface of the device isolation region 13, and placed on the gate insulating film 14; an intergate insulating film 16 placed on the upper surfaces of the device isolation regions 13 and the floating gate polysilicon electrode layer (FG) 15; and a control gate polysilicon electrode layer (CG) 17 placed on the intergate insulating film 16 and extending in the row direction.

The semiconductor region 10 may be a semiconductor substrate or may be a well region formed in a semiconductor substrate. The source/drain regions are placed in the selective epitaxial layer 12 interposed between the word lines when viewed from the upper surface of the memory cell array although the source/drain regions are not shown in FIG. 13.

MODIFIED EXAMPLE 4

FIG. 14 shows a schematic sectional structure of a NAND-type memory cell array section taken on line I-I in FIG. 3, of a nonvolatile semiconductor memory device according to modified example 4 of the first embodiment. As shown in FIG. 14, the nonvolatile semiconductor memory device includes: a semiconductor region 10; device isolation regions 13 placed in the semiconductor region 10 and extending in the column direction; a selective epitaxial layer 12 placed between the device isolation regions 13, placed on the semiconductor region 10, and having a triangular shape in cross section along the row direction; source/drain regions (not shown) placed in the selective epitaxial layer 12; a gate insulating film 14 placed between the device isolation regions 13 and placed on a region between the source/drain regions of the selective epitaxial layer 12; a floating gate polysilicon electrode layer (FG) 15 placed between the device isolation regions 13, having substantially the same height as the upper surface of the device isolation region 13, and placed on the gate insulating film 14; an intergate insulating film 16 placed on the upper surfaces of the device isolation regions 13 and the floating gate polysilicon electrode layer (FG) 15; and a control gate polysilicon electrode layer (CG) 17 placed on the intergate insulating film 16 and extending in the row direction.

The triangular shape of the selective epitaxial layer 12 has a rounded vertex. After the selective epitaxial layer 12 is formed, the vertex of the triangular selective epitaxial layer 12 is rounded by oxidation treatment or wet treatment.

The semiconductor region 10 may be a semiconductor substrate or may be a well region formed in a semiconductor substrate. The source/drain regions are placed in the selective epitaxial layer 12 interposed between the word lines when viewed from the upper surface of the memory cell array although the source/drain regions are not shown in FIG. 14.

MODIFIED EXAMPLE 5

FIG. 15 shows a schematic sectional structure of a NAND-type memory cell array section taken on line I-I in FIG. 3, of a nonvolatile semiconductor memory device according to modified example 5 of the first embodiment. As shown in FIG. 15, the nonvolatile semiconductor memory device includes: a semiconductor region 10; device isolation regions 13 placed in the semiconductor region 10 and extending in the column direction; a selective epitaxial layer 12 placed between the device isolation regions 13, placed on the semiconductor region 10, and having a triangular shape in cross section along the row direction; source/drain regions (not shown) placed in the selective epitaxial layer 12; a gate insulating film 14 placed between the device isolation regions 13 and placed on a region between the source/drain regions of the selective epitaxial layer 12; a floating gate polysilicon electrode layer (FG) 15 placed between the device isolation regions 13, having substantially the same height as the upper surface of the device isolation region 13, and placed on the gate insulating film 14; an intergate insulating film 16 placed on the upper surfaces of the device isolation regions 13 and the floating gate polysilicon electrode layer (FG) 15; and a control gate polysilicon electrode layer (CG) 17 placed on the intergate insulating film 16 and extending in the row direction.

A dent portion is formed on each oblique side of the triangular shape of the selective epitaxial layer 12. The dent portion on the oblique side can be formed by oxidation treatment or wet treatment after the selective epitaxial layer 12 is formed.

The semiconductor region 10 may be a semiconductor substrate or may be a well region formed in a semiconductor substrate. The source/drain regions are placed in the selective epitaxial layer 12 interposed between the word lines when viewed from the upper surface of the memory cell array although the source/drain regions are not shown in FIG. 15.

MODIFIED EXAMPLE 6

Figure 16:
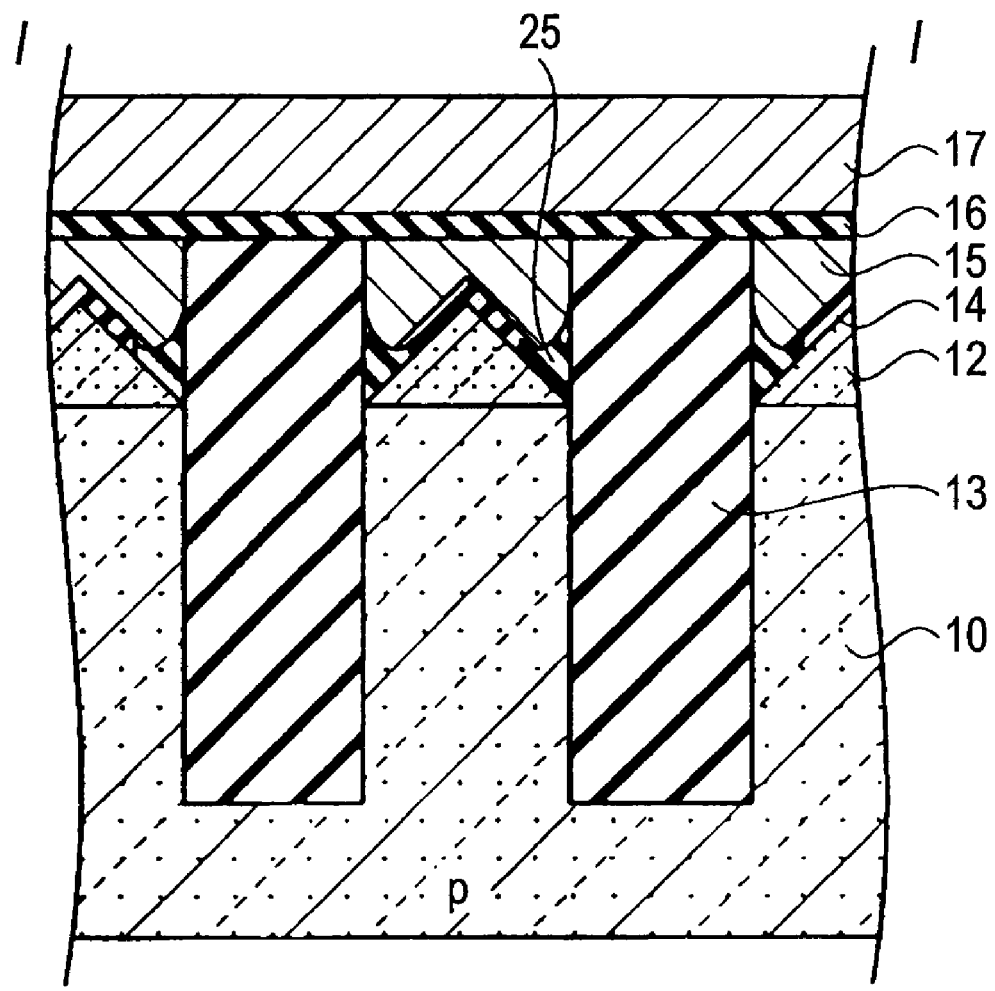
FIG. 16 is a drawing to show the schematic sectional structure of a NAND-type memory cell array section taken on line I-I in FIG. 3, of a nonvolatile semiconductor memory device according to modified example 6 of the first embodiment of the invention.

FIG. 15 shows a schematic sectional structure of a NAND-type memory cell array section taken on line I-I in FIG. 3, of a nonvolatile semiconductor memory device according to modified example 6 of the first embodiment. As shown in FIG. 16, the nonvolatile semiconductor memory device includes: a semiconductor region 10; device isolation regions 13 placed in the semiconductor region 10 and extending in the column direction; a selective epitaxial layer 12 placed between the device isolation regions 13, placed on the semiconductor region 10, and having a triangular shape in cross section along the row direction; source/drain regions (not shown) placed in the selective epitaxial layer 12; a gate insulating film 14 placed between the device isolation regions 13 and placed on a region between the source/drain regions of the selective epitaxial layer 12; a floating gate polysilicon electrode layer (FG) 15 placed between the device isolation regions 13, having substantially the same height as the upper surface of the device isolation region 13, and placed on the gate insulating film 14; an intergate insulating film 16 placed on the upper surfaces of the device isolation regions 13 and the floating gate polysilicon electrode layer (FG) 15; and a control gate polysilicon electrode layer (CG) 17 placed on the intergate insulating film 16 and extending in the row direction.

The semiconductor region 10 may be a semiconductor substrate or may be a well region formed in a semiconductor substrate. The source/drain regions are placed in the selective epitaxial layer 12 interposed between the word lines when viewed from the upper surface of the memory cell array although the source-drain regions are not shown in FIG. 16.

In the nonvolatile semiconductor memory device of the modified example 6 of the first embodiment, a buried insulating film 25 is formed to have larger thickness compared with the gate insulating film 14 in the vicinity of the vertex of the convex region, on a part of the convex region of the selective epitaxial layer 12 which will become an active region AA, particularly in the vicinity of a bottom part of the convex region. According to this structure, the electric field accompanying the voltage applied to the selective epitaxial layer 12 from the floating gate polysilicon electrode layer (FG) 15 is lowered in the bottom portion of the convex region. That is, the electric field accompanying the voltage applied to the selective epitaxial layer 12 from the floating gate polysilicon electrode layer (FG) 15 is lowered in the vicinity of the buried insulating film 25 in the bottom portion of the convex region, but is concentrated in the vicinity of the vertex of the selective epitaxial layer 12.

In this modified example 6, for example, an oxide film at a high peel rate as compared with the buried oxide film of the device isolation region 13 is used as the buried insulating film 25. After the active region AA of the convex shape such as the selective epitaxial layer 12 is formed, the gate insulating film 14 and the buried insulating film 25 are deposited, and then only the buried insulating film 25 is etched and the buried insulating film 25 is left only in the vicinity of the bottom portion of the convex shape, thereby forming the device structure in FIG. 16.

MODIFIED EXAMPLE 7

Figure 17:
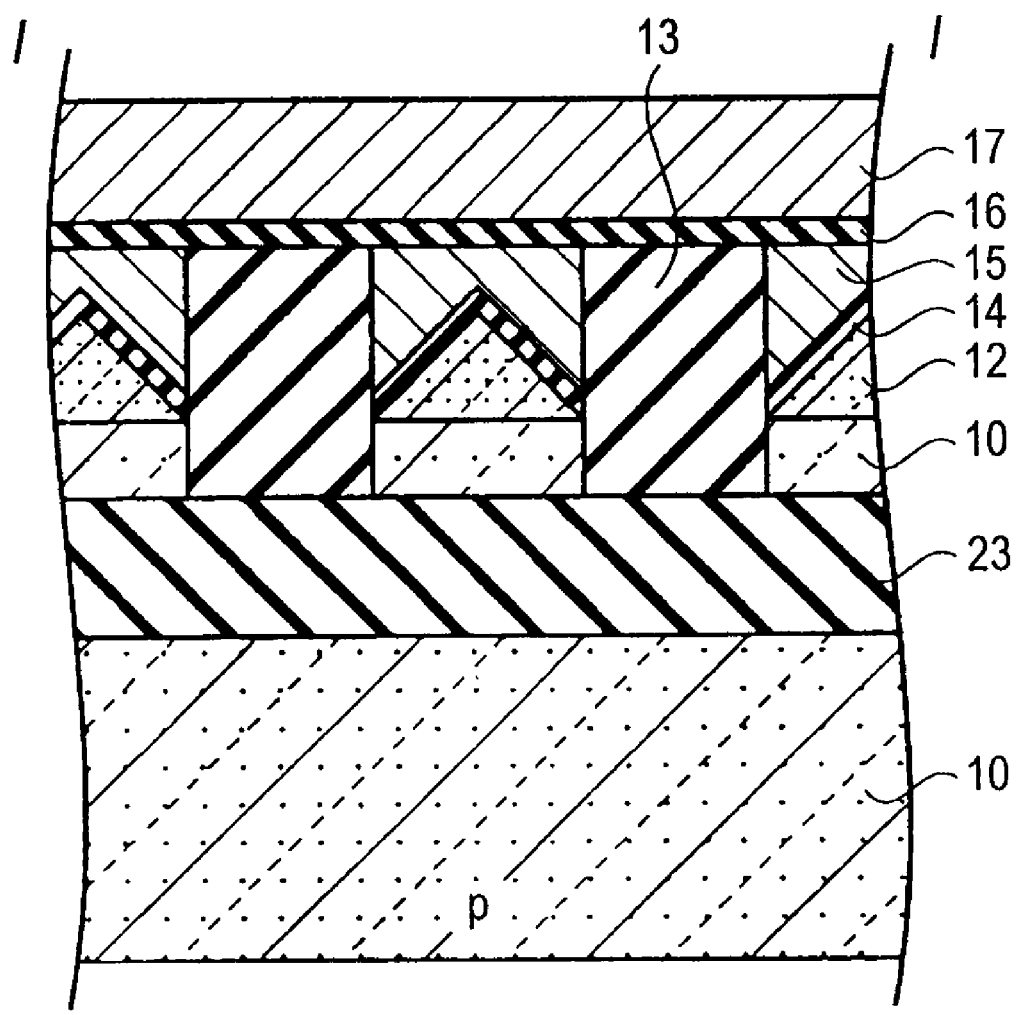
FIG. 17 is a drawing to show the schematic sectional structure of a NAND-type memory cell array section taken on line I-I in FIG. 3, of a nonvolatile semiconductor memory device according to modified example 7 of the first embodiment of the invention.

FIG. 17 shows a schematic sectional structure of a NAND-type memory cell array section taken on line I-I in FIG. 3, of a nonvolatile semiconductor memory device according to modified example 7 of the first embodiment. As shown in FIG. 17, the nonvolatile semiconductor memory device includes: a semiconductor region 10; a buried oxide 23 placed in the semiconductor region 10; device isolation regions 13 placed in the semiconductor region 10 that is positioned on the buried oxide 23, and extending in the column direction; a selective epitaxial layer 12 placed between the device isolation regions 13, placed on the semiconductor region 10 and above the buried oxide 23, and having a triangular shape in cross section along the row direction; source/drain regions (not shown) placed in the selective epitaxial layer 12; a gate insulating film 14 placed between the device isolation regions 13 and placed on a region between the source/drain regions of the selective epitaxial layer 12; a floating gate polysilicon electrode layer (FG) 15 placed between the device isolation regions 13, having substantially the same height as the upper surface of the device isolation region 13, and placed on the gate insulating film 14; an intergate insulating film 16 placed on the upper surfaces of the device isolation regions 13 and the floating gate polysilicon electrode layer (FG) 15; and a control gate polysilicon electrode layer (CG) 17 placed on the intergate insulating film 16 and extending in the row direction.

The semiconductor region 10 may be a semiconductor substrate or may be a well region formed n a semiconductor substrate. The source/drain regions are placed in the selective epitaxial layer 12 interposed between the word lines when viewed from the upper surface of the memory cell array although the source/drain regions are not shown in FIG. 17.

Each semiconductor region 10 on the buried oxide 23 becomes an active region AA. A method for forming a convex shape formed on the upper surface of the semiconductor region 10 on the buried oxide 23 can be performed by selective epitaxial growth (SEG), a selective etching method, etc, as with a bulk semiconductor substrate.

MODIFIED EXAMPLE 8

Figure 18:
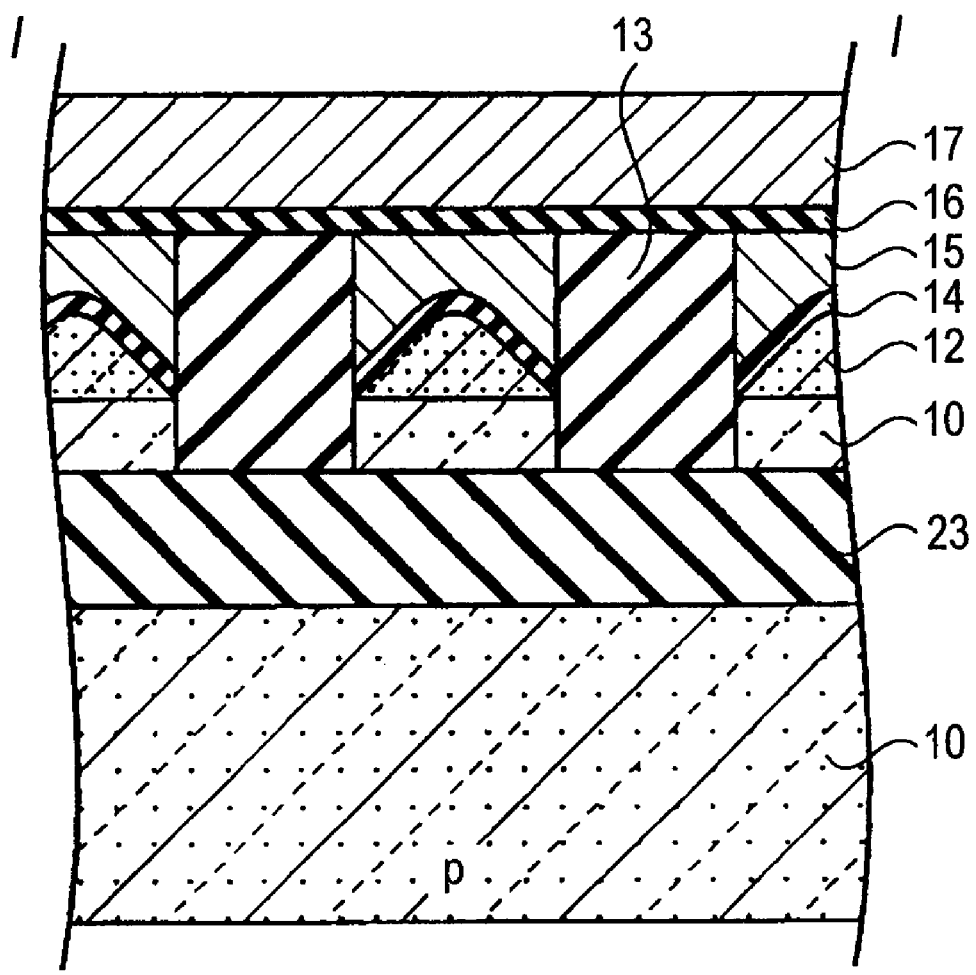
FIG. 18 is a drawing to show the schematic sectional structure of a NAND-type memory cell array section taken on line I-I in FIG. 3, of a nonvolatile semiconductor memory device according to modified example 8 of the first embodiment of the invention.

FIG. 18 shows the schematic sectional structure of a NAND-type memory cell array section taken on line I-I in FIG. 3, of a nonvolatile semiconductor memory device according to modified example 8 of the first embodiment. As shown in FIG. 18, the nonvolatile semiconductor memory device includes: a semiconductor region 10; a buried oxide 23 placed in the semiconductor region 10; device isolation regions 13 placed in the semiconductor region 10 that is positioned on the buried oxide 23, and extending in the column direction; a selective epitaxial layer 12 placed between the device isolation regions 13, placed on the semiconductor region 10 and above the buried oxide 23, and having a triangular shape in cross section along the row direction; source/drain regions (not shown) placed in the selective epitaxial layer 12; a gate insulating film 14 placed between the device isolation regions 13 and placed on a region between the source/drain regions of the selective epitaxial layer 12; a floating gate polysilicon electrode layer (FG) 15 placed between the device isolation regions 13, having substantially the same height as the upper surface of the device isolation region 13, and placed on the gate insulating film 14; an intergate insulating film 16 placed on the upper surfaces of the device isolation regions 13 and the floating gate polysilicon electrode layer (FG) 15; and a control gate polysilicon electrode layer (CG) 17 placed on the intergate insulating film 16 and extending in the row direction.

The triangular shape of the selective epitaxial layer 12 has a rounded vertex. After the selective epitaxial layer 12 is formed, the vertex of the triangular selective epitaxial layer 12 is rounded by oxidation treatment or wet treatment.

The semiconductor region 10 may be a semiconductor substrate or may be a well region formed in a semiconductor substrate. The source/drain regions are placed in the selective epitaxial layer 12 interposed between the word lines when viewed from the upper surface of the memory cell array although the source/drain regions are not shown in FIG. 18.

The semiconductor region 10 on the buried oxide 23 becomes an active region AA. A method for forming a convex shape formed on the upper surface of the semiconductor region 10 on the buried oxide 23 can be performed by selective epitaxial growth (SEG), a selective etching method, etc, as with a bulk semiconductor substrate.

MODIFIED EXAMPLE 9

Figure 19:
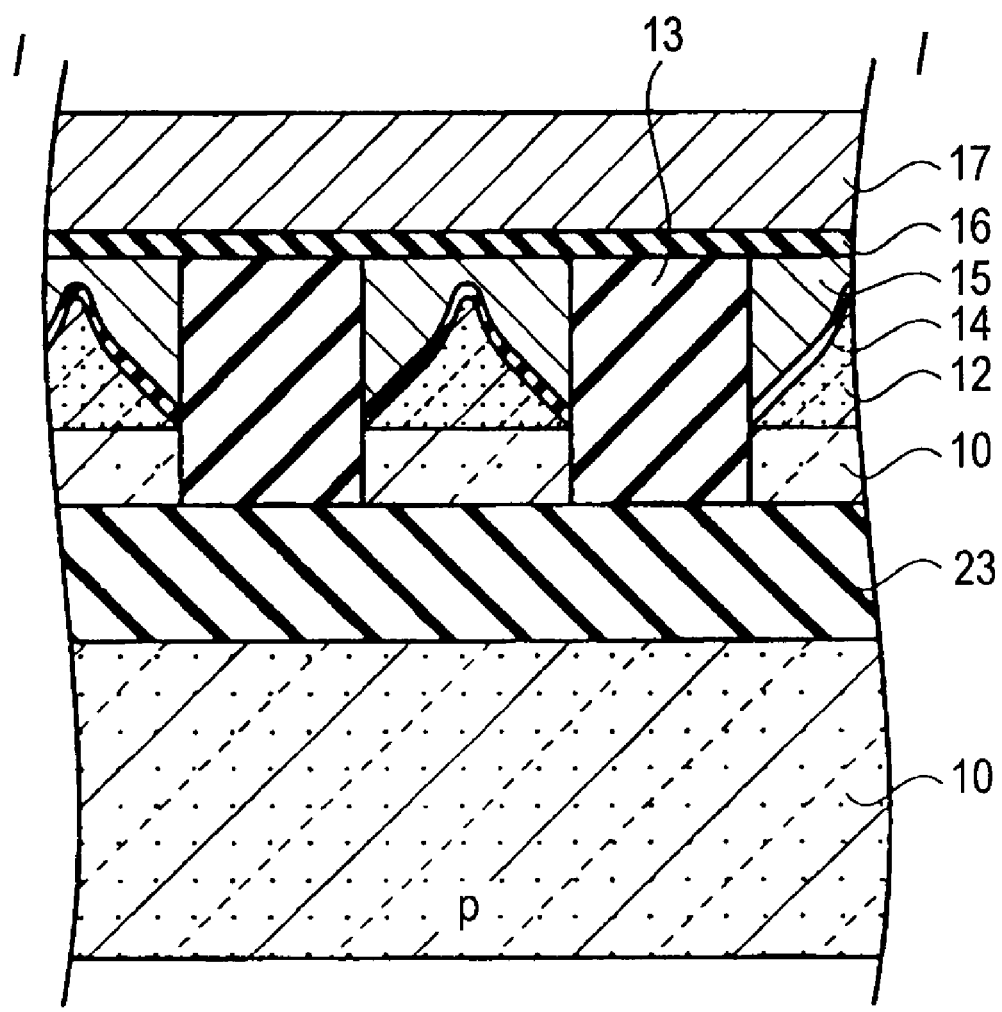
FIG. 19 is a drawing to show the schematic sectional structure of a NAND-type memory cell array section taken on line I-I in FIG. 3, of a nonvolatile semiconductor memory device according to modified example 9 of the first embodiment of the invention.

FIG. 19 shows a schematic sectional structure of a NAND-type memory cell array section taken on line I-I in FIG. 3, of a nonvolatile semiconductor memory device according to modified example 9 of the first embodiment. As shown in FIG. 19, the nonvolatile semiconductor memory device includes: a semiconductor region 10; a buried oxide 23 placed in the semiconductor region 10; device isolation regions 13 placed in the semiconductor region 10 that is positioned on the buried oxide 23, and extending in the column direction; a selective epitaxial layer 12 placed between the device isolation regions 13, placed on the semiconductor region 10 and above the buried oxide 23, and having a triangular shape in cross section along the row direction; source/drain regions (not shown) placed in the selective epitaxial layer 12; a gate insulating film 14 placed between the device isolation regions 13 and placed on a region between the source/drain regions of the selective epitaxial layer 12; a floating gate polysilicon electrode layer (FG) 15 placed between the device isolation regions 13, having substantially the same height as the upper surface of the device isolation region 13, and placed on the gate insulating film 14; an intergate insulating film 16 placed on the upper surfaces of the device isolation regions 13 and the floating gate polysilicon electrode layer (FG) 15; and a control gate polysilicon electrode layer (CG) 17 placed on the intergate insulating film 16 and extending in the row direction.

A dent portion is formed on each oblique side of the triangular shape of the selective epitaxial layer 12. The dent portion on the oblique side can be formed by oxidation treatment or wet treatment after the selective epitaxial layer 12 is formed.

The semiconductor region 10 may be a semiconductor substrate or may be a well region formed in a semiconductor substrate. The source/drain regions are placed in the selective epitaxial layer 12 interposed between the word lines when viewed from the upper surface of the memory cell array although the source/drain regions are not shown in FIG. 19.

The semiconductor region 10 on the buried oxide 23 becomes an active region AA. A method for forming a convex shape formed on the upper surface of the semiconductor region 10 on the buried oxide 23 can be performed by selective epitaxial growth (SEG), a selective etching method, etc, as with a bulk semiconductor substrate.

MODIFIED EXAMPLE 10

Figure 20:
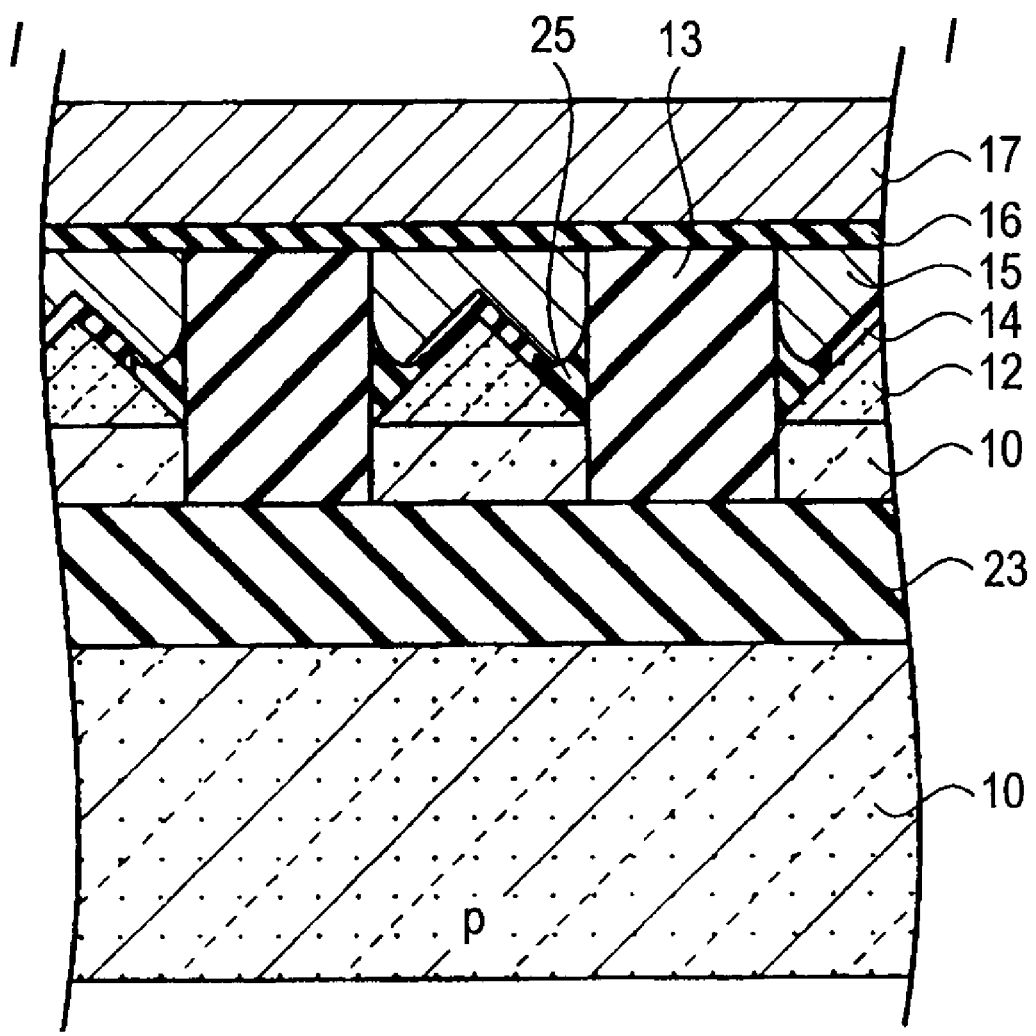
FIG. 20 is a drawing to show the schematic sectional structure of a NAND-type memory cell array section taken on line I-I in FIG. 3, of a nonvolatile semiconductor memory device according to modified example 10 of the first embodiment of the invention.

FIG. 20 shows a schematic sectional structure of a NAND-type memory cell array section taken on line I-I in FIG. 3, of a nonvolatile semiconductor memory device according to modified example 10 of the first embodiment. As shown in FIG. 20, the nonvolatile semiconductor memory device includes: a semiconductor region 10; a buried oxide 23 placed in the semiconductor region 10; device isolation regions 13 placed in the semiconductor region 10 that is positioned on the buried oxide 23, and extending in the column direction, a selective epitaxial layer 12 placed between the device isolation regions 13, placed on the semiconductor region 10 and above the buried oxide 23, and having a triangular shape in cross section along the row direction; source/drain regions (not shown) placed in the selective epitaxial layer 12; a gate insulating film 14 placed between the device isolation regions 13 and placed on a region between the source/drain regions of the selective epitaxial layer 12; a floating gate polysilicon electrode layer (FG) 15 placed between the device isolation regions 13, having substantially the same height as the upper surface of the device isolation region 13, and placed on the gate insulating film 14; an intergate insulating film 16 placed on the upper surfaces of the device isolation regions 13 and the floating gate polysilicon electrode layer (FG) 15; and a control gate polysilicon electrode layer (CG) 17 placed on the intergate insulating film 16 and extending in the row direction.

The semiconductor region 10 may be a semiconductor substrate or may be a well region formed in a semiconductor substrate. The source/drain regions are placed in the selective epitaxial layer 12 interposed between the word lines when viewed from the upper surface of the memory cell array although the source/drain regions are not shown in FIG. 20.

The semiconductor region 10 on the buried oxide 23 becomes an active region AA. A method for forming a convex shape formed on the upper surface of the semiconductor region 10 on the buried oxide 23 can be performed by selective epitaxial growth (SEG), a selective etching method, etc, as with a bulk semiconductor substrate.

In the nonvolatile semiconductor memory device of the modified example 10 of the first embodiment, a buried insulating film 25 is formed to have larger thickness compared with the gate insulating film 14 in the vicinity of the vertex of the convex region, on a part of the convex region of the selective epitaxial layer 12 which will become an active region AA, particularly in the vicinity of a bottom part of the convex region. According to this structure, the electric field accompanying the voltage applied to the selective epitaxial layer 12 from the floating gate polysilicon electrode layer (FG) 15 is lowered in the bottom part of the convex region. That is, the electric field accompanying the voltage applied to the selective epitaxial layer 12 from the floating gate polysilicon electrode layer (FG) 15 is lowered in the vicinity of the buried insulating film 25 in the bottom part of the convex region, but is concentrated in the vicinity of the vertex of the selective epitaxial layer 12.

In this modified example 10, for example, an oxide film at a high peel rate as compared with the buried oxide film of the device isolation region 13 is used as the buried insulating film 25. After the active region AA of the convex shape such as the selective epitaxial layer 12 is formed, the gate insulating film 14 and the buried insulating film 25 are deposited, and then only the buried insulating film 25 is etched and the buried insulating film 25 is left only in the vicinity of the bottom part of the convex shape, thereby forming the device structure in FIG. 20.

According to the nonvolatile semiconductor memory device and the manufacturing method of the nonvolatile semiconductor memory device according to the first embodiment of the invention, since the upper portion of the active region is formed to have a convex shape in cross section, the electric field at the corner (vertex) strengthens, thus increasing the current density. Therefore, the depletion layer width in the convex channel vicinity widens, thereby improving the sub-threshold factor. Further, the back gate effect decreases, thereby providing an excellent short channel characteristic. Since the upper portion of the active region is formed to have the convex shape, the coupling ratio is improved, and the electric field during the writing operation strengthens. Therefore, the writing efficiency improves. Further, the electric field during data retention tends to disperse, so that the electrons injected into the floating gate electrode layer become hard to tunnel and an excellent retention characteristic is provided.

Second Embodiment

Figure 21:
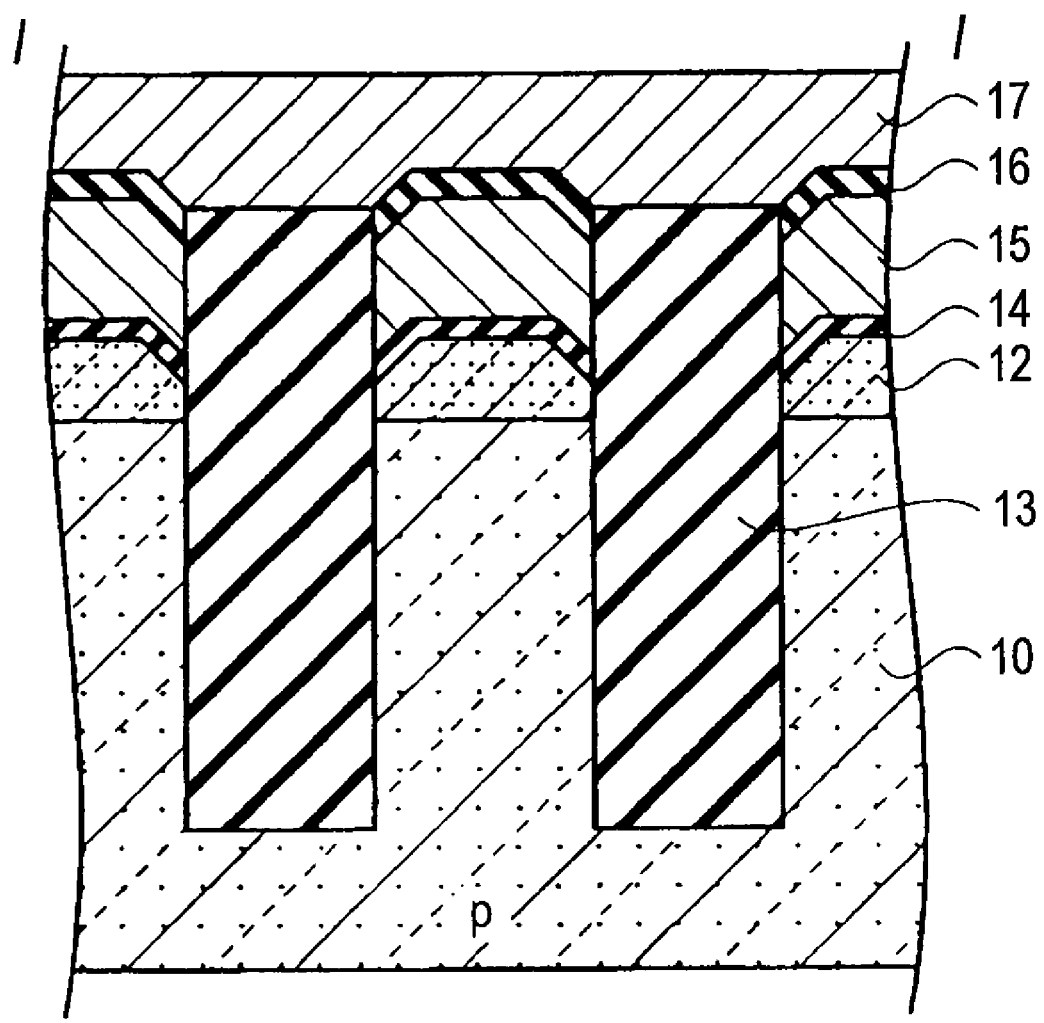
FIG. 21 is a drawing to show the schematic sectional structure of a NAND-type memory cell array section taken on line I-I in FIG. 3, of a nonvolatile semiconductor memory device according to a second embodiment of the invention.

FIG. 21 shows a schematic sectional structure of a NAND-type memory cell array section taken on line I-I in FIG. 3, of a nonvolatile semiconductor memory device according to a second embodiment. As shown in FIG. 21, the nonvolatile semiconductor memory device includes: a semiconductor region 10; device isolation regions 13 placed in the semiconductor region 10 and extending in the column direction; a selective epitaxial layer 12 placed between the device isolation region 13, placed on the semiconductor region 10, and being trapezoidal in cross section along the row direction; source/drain regions (not shown) placed in the selective epitaxial layer 12; a gate insulating film 14 placed between the device isolation regions 13 and placed on a region between source/drain regions of the selective epitaxial layer 12; a floating gate polysilicon electrode layer (FG) 15 placed between the device isolation regions 13, placed on the gate insulating film 14, and having a convex shape in cross section along the row direction; an intergate insulating film 16 placed between the device isolation regions 13 and placed on the upper surface of the floating gate polysilicon electrode layer (FG) 15; and a control gate polysilicon electrode layer (CG) 17 placed on the upper surfaces of the device isolation regions 13 and the intergate insulating film 16 and extending in the row direction. The semiconductor region 10 may be a semiconductor substrate or may be a well region formed in a semiconductor substrate. The source/drain regions are placed in the selective epitaxial layer 12 interposed between the word lines when viewed from the upper surface of the memory cell array although the source/drain regions are not shown in FIG. 21. Further, the source/drain regions are spaced with respect to the column direction, similar to source/drain diffusion layers 40 shown in FIG. 41C. The gate insulating film 14 is formed on a region between adjacent source/drain regions of the selective epitaxial layer 12.

In the nonvolatile semiconductor memory device according to the second embodiment, the floating gate polysilicon electrode layer (FG) 15 has an upper portion of a convex shape in cross section along the row direction. That is, the floating gate polysilicon electrode layer (FG) 15 and the intergate insulating film 16 have uniform thicknesses, respectively. It is possible to form a polysilicon layer having convex shape in cross section along the row direction on the surface of the floating gate polysilicon electrode layer (FG) 15 by the following processes: for example, after the floating gate polysilicon electrode layer (FG) 15 shown in FIG. 9 is formed, a polysilicon layer is deposited. Accordingly, it is possible to increase the capacitance between the CG and the FG, and the coupling ratio can be increased. It is possible to apply a large voltage to the floating gate polysilicon electrode layer (FG) 15 by a capacitance division of the voltage applied to the control gate polysilicon electrode layer (CG) 17. Accordingly, it is possible to improve the controllability of the control gate polysilicon electrode layer (CG) 17 over the floating gate polysilicon electrode layer (FG) 15.

Figure 22:
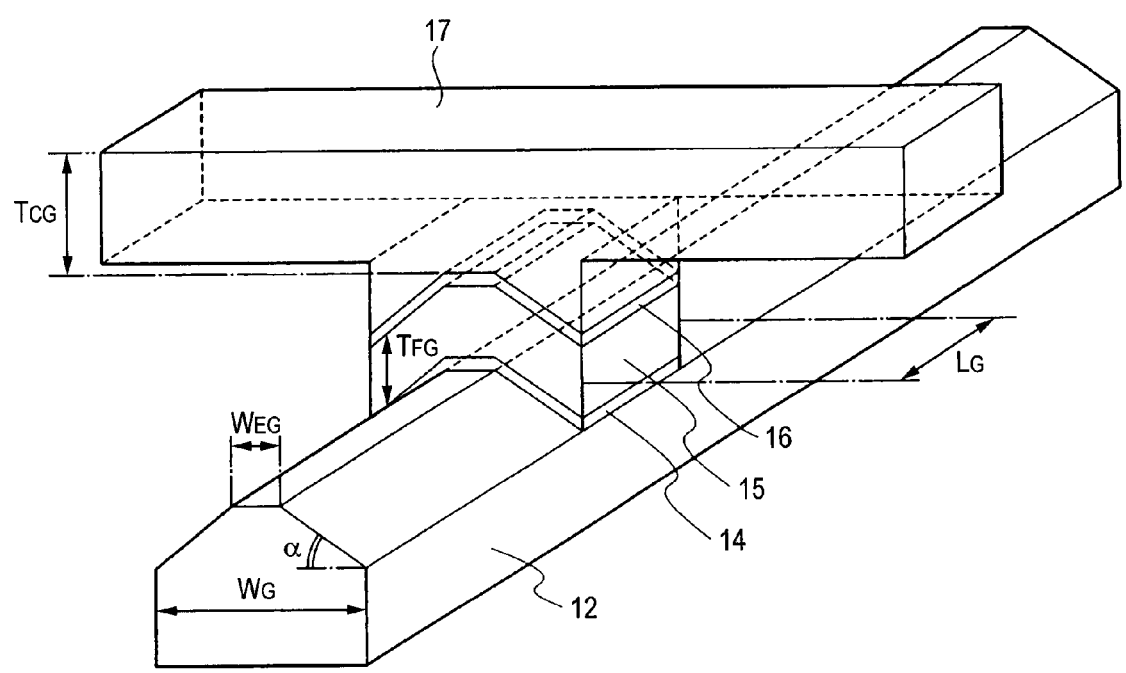
FIG. 22 is a drawing to show the schematic three-dimensional configuration of the nonvolatile semiconductor memory device according to the second embodiment of the invention.

FIG. 22 shows a schematic three-dimensional configuration of the nonvolatile semiconductor memory device shown in FIG. 21.

As shown in FIG. 22, the control gate polysilicon electrode layer (CG) 17 extends in a direction in which the word line WL extends, i.e., the row direction. On the other hand, the selective epitaxial layer 12 serving as an active region AA extends in a direction in which a bit line BL extends, i.e., the column direction. At an intersection point of the control gate polysilicon electrode layer (CG) 17 and the selective epitaxial layer 12 when viewed from the upper surface of the control gate polysilicon electrode layer 17, a stacked structure is placed. The stacked structure includes: the selective epitaxial layer 12 having a convex shape in cross section along the row direction; the gate insulating film 14 placed on the selective epitaxial layer 12; the floating gate polysilicon electrode layer (FG) 15 placed on the gate insulating film 14 and having a convex shape in cross section along the row direction; the intergate insulating film 16 placed on the floating gate polysilicon electrode layer (FG) 15; and the control gate polysilicon electrode layer (CG) 17 placed on the intergate insulating film 16.

The intergate insulating film 16 may be a single layer such as a $SiO_2$ layer, or may be a multi-layered film of $SiO_2/SiN/SiO_2$. A thickness $T_{CG}$ of the control gate polysilicon electrode layer (CG) 17 placed on the intergate insulating film 16 is about 100 nm, for example. A thickness of the floating gate polysilicon electrode layer (FG) 15 is about 40 nm, for example. A width of the floating gate polysilicon electrode layer (FG) 15 in the column direction, namely, a gate length $L_G$ of a memory cell transistor is about 50 nm or less, for example.

An upper base width $W_{EG}$ of the trapezoidal shape of the selective epitaxial layer 12 is about 20 nm or less, for example. On the other hand, a lower base width $W_G$ of the trapezoidal shape of the selective epitaxial layer 12 is about 50 nm or less, for example.

If a plane direction of the side of the trapezoidal shape of the selective epitaxial layer 12 is (111), angle α is formed between (111) plane and the plane direction of the upper surface (100). In this case, a value of the angle α is about 54 degrees.

(Manufacturing Method)

The manufacturing process of the nonvolatile semiconductor memory device according to the second embodiment will be described with reference to FIGS. 23A to 23C, 24A to 24C and 25A to 25C. The processes until a completion of forming the selective epitaxial layer 12 are similar to the processes of the nonvolatile semiconductor memory device according to the first embodiment previously described with reference to FIGS. 6 to 8 and therefore will not be described again.

Figure 23A:
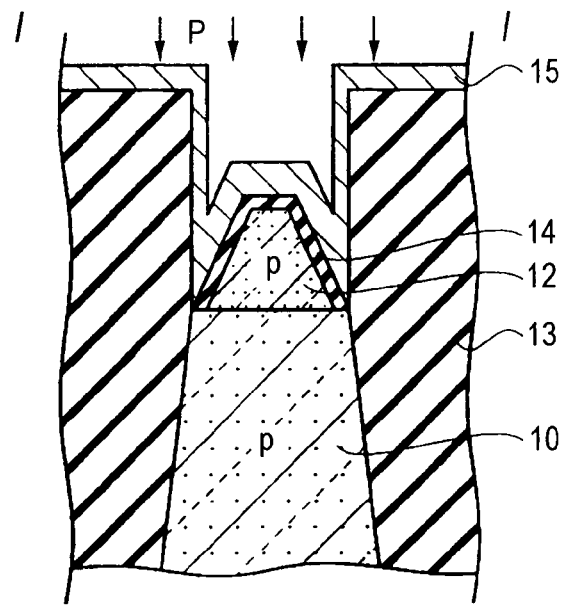
FIGS. 23A to 23C show a process of a manufacturing method of the nonvolatile semiconductor memory device according to the second embodiment of the invention.
Figure 23B:
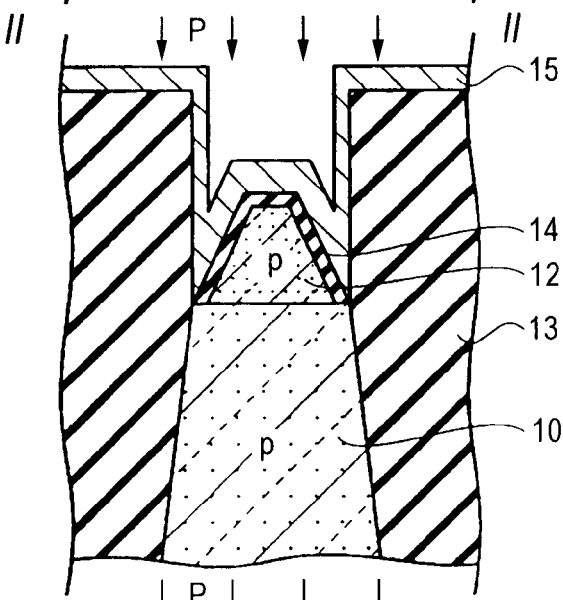
Figure 23C:
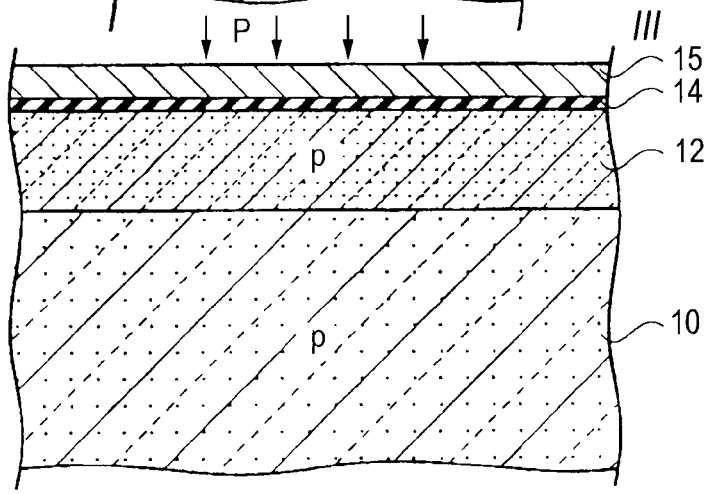
Figure 24A:
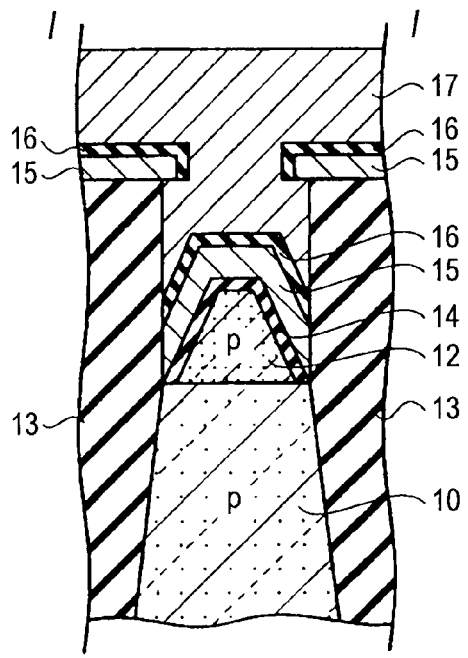
FIGS. 24A to 24C show a process of the manufacturing method of the nonvolatile semiconductor memory device according to the second embodiment of the invention.
Figure 24B:
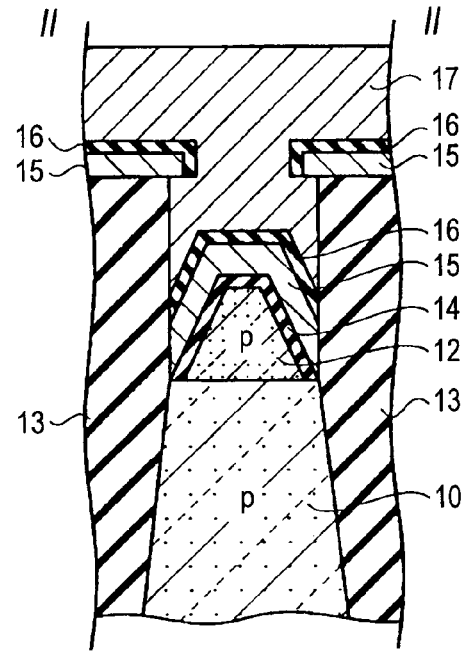
Figure 24C:
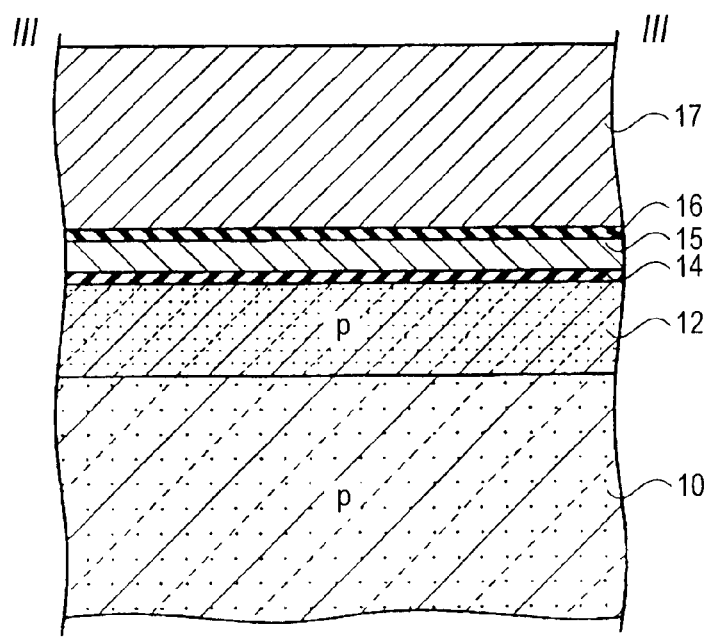
Figure 25A:
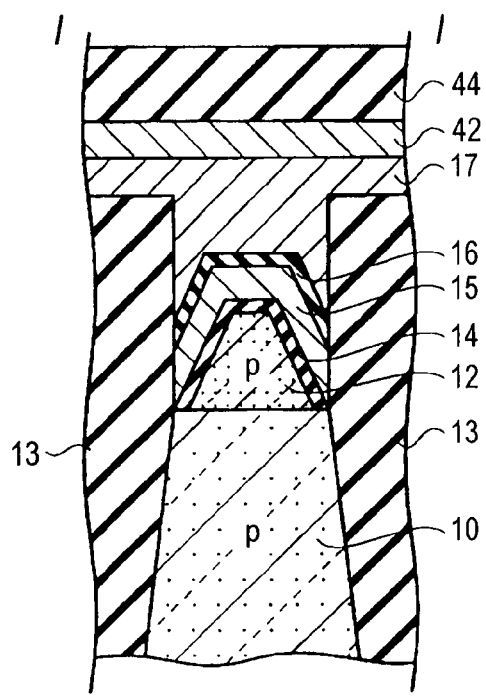
FIGS. 25A to 25C show a process of the manufacturing method of the nonvolatile semiconductor memory device according to the second embodiment of the invention.
Figure 25B:
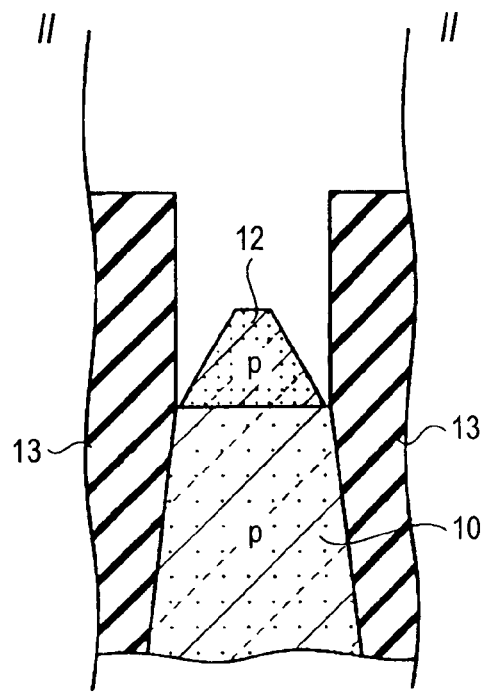
Figure 25C:
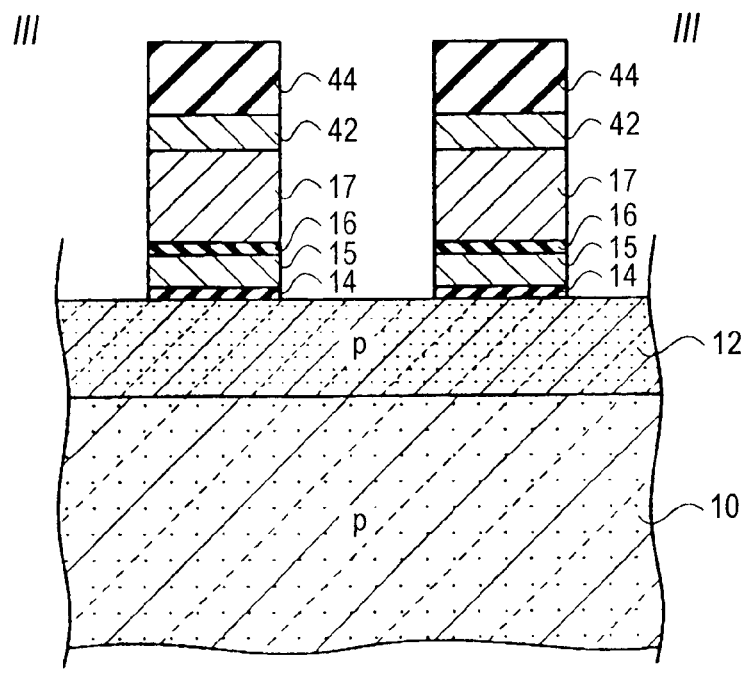

FIGS. 23A, 24A, and 25A show the schematic sectional structure taken on line I-I in FIG. 3; FIGS. 23B, 24B, and 25B show the schematic sectional structure taken on line II-II in FIG. 3; and FIGS. 23C, 24C, and 25C show the schematic sectional structure taken on line III-III in FIG. 3.

(a) After selective epitaxial layer 12 is formed, a gate insulating film 14 is formed on the selective epitaxial layer 12 as shown in FIGS. 23A to 23C. The gate insulating film 14 may be formed by depositing an insulating film or may be formed by heat treatment of an oxidation process. The oxidation process may be used together as a process of rounding a vertex of the convex shape.

(b) Further, polysilicon to be a floating gate polysilicon electrode layer (FG) 15 is deposited on the gate insulating film 14 and upper surfaces and side walls of device isolation regions 13 as shown in FIGS. 23A to 23C. In the second embodiment of the invention, polysilicon is used as the floating gate electrode layer (FG) 15 by way of an example.

(i) Further, using ion implantation technique, an ion implantation is performed under an acceleration condition that allows P (phosphorous) ions to be implanted only into the polysilicon from the vertical direction, as shown in FIGS. 23A to 23C.

(h) Next, alkaline chemical solution etching is performed for leaving only a region into which P ions are implanted and removing the polysilicon on the side walls of the device isolation region 13, as shown in FIGS. 23A to 23C. Consequently, a floating gate polysilicon electrode layer (FG) 15 is formed as shown in FIGS. 23A to 23C.

(j) Further, an intergate insulating film 16 and a control gate polysilicon electrode layer (CG) 17 are formed on the entire semiconductor device surface as shown in FIGS. 24A to 24C. In the second embodiment of the invention, polysilicon is used as the control gate electrode layer (CG) 17 by way of an example.

The intergate insulating film 16 may contain an oxide film, a nitrogen film, a multi-layered film of oxide and nitrogen, or the like. In the second embodiment of the invention, polysilicon material is used for both of the floating gate polysilicon electrode layer (FG) 15 and the control gate polysilicon electrode layer (CG) 17, but metal such as silicide may be used.

(k) Next, planarization is executed by CMP to remove the floating gate polysilicon electrode layer (FG) 15 on the device isolation regions 13, the intergate insulating film 16 on the device isolation regions 13, and the control gate polysilicon electrode layer (CG) 17 on the device isolation regions 13.

(l) Next, a control gate polysilicon electrode layer (CG) 17 is further deposited on the entire semiconductor device surface, and then a metal silicide film 42 and a nitrogen film 44 are deposited in order, as shown in FIGS. 25A to 25C. For example, a tungsten silicide, a nickel silicide, or a cobalt silicide can be applied as material of the metal silicide film 42.

(m) Further, a gate electrode resist pattern is formed using photolithography, and the control gate polysilicon electrode layer (CG) 17 and the floating gate polysilicon electrode layer (FG) 15 are etched and removed with the resist pattern as a mask to form a gate pattern, as shown in FIGS. 25A to 25C.

(o) Next, the side walls of the gate electrode polysilicon are oxidized by thermal oxidation and source/drain regions are formed by ion implantation of As (arsenic).

Then, a similar process to a usual nonvolatile semiconductor memory device manufacturing method is executed. Accordingly, there is formed a nonvolatile memory including: the active region of the selective epitaxial layer 12 having a convex shape in cross section along the row direction; and the floating gate polysilicon electrode layer (FG) 15 having a convex shape in cross section along the row direction.

In the second embodiment of the invention, the cross sectional shape of the selective epitaxial layer 12 taken on line I-I in FIG. 3 is a trapezoid, but may be a triangle as shown in FIG. 13. After the selective epitaxial layer 12 is formed, the wedge part can also be rounded by oxidation treatment or wet treatment as shown in FIG. 14, or the oblique sides of a triangle can also be dented as shown in FIG. 15.

In the second embodiment of the invention, the convex shape of the active region is formed by the selective epitaxial growth. However, the semiconductor region 10 with the convex shape may be formed by other methods such as a selective etching method using the fact that a (wet) etching rate varies depending on a plane direction.

MODIFIED EXAMPLE 1

Figure 26:
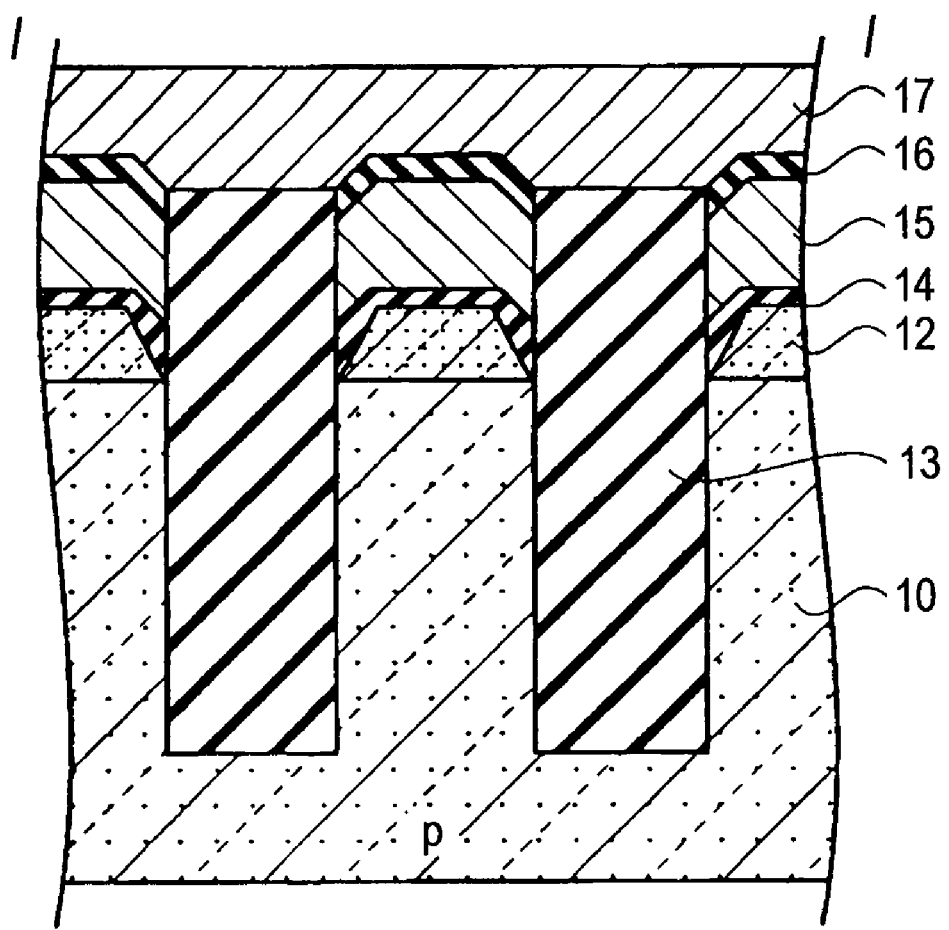
FIG. 26 is a drawing to show the schematic sectional structure of a NAND-type memory cell array section taken on line I-I in FIG. 3, of a nonvolatile semiconductor memory device according to modified example 1 of the second embodiment of the invention.

FIG. 26 shows a schematic sectional structure of a NAND-type memory cell array section taken on line I-I in FIG. 3, of a nonvolatile semiconductor memory device according to modified example 1 of the second embodiment. As shown in FIG. 26, the nonvolatile semiconductor memory device includes: a semiconductor region 10; device isolation regions 13 placed in the semiconductor region 10 and extending in the column direction; a selective epitaxial layer 12 placed between the device isolation regions 13, placed on the semiconductor region 10, and having a trapezoidal shape in cross section along the row direction; source/drain regions (not shown) placed in the selective epitaxial layer 12; a gate insulating film 14 placed between the device isolation regions 13 and placed on a region between the source/drain regions of the selective epitaxial layer 12; a floating gate polysilicon electrode layer (FG) 15 placed between the device isolation regions 13, placed on the gate insulating film 14, and having a convex shape in cross section along the row direction; an intergate insulating film 16 placed between the device isolation regions 13 and placed on the upper surface of the floating gate polysilicon electrode layer (FG) 15; and a control gate polysilicon electrode layer (CG) 17 placed on the upper surfaces of the device isolation regions 13 and the intergate insulating film 16 and extending in the row direction.

The gate insulating film 14 placed on the side wall of the selective epitaxial layer 12, especially in a vicinity of an interface between the trapezoidal selective epitaxial layer 12 and the semiconductor region 10, is formed thicker than the gate insulating film 14 placed on the upper surface of the selective epitaxial layer 12.

The thickness of the gate insulating film 14 is thus formed nonuniformly, whereby the capacitance between the floating gate polysilicon electrode layer (FG) 15 and the selective epitaxial layer 12 can be effectively reduced, and it is possible to relatively increase the capacitance between the CG and the FG, and the coupling ratio can be increased. Accordingly, it is possible to apply a large voltage to the floating gate polysilicon electrode layer (FG) 15 by a capacitance division of the voltage applied to the control gate polysilicon electrode layer (CG) 17, thus improving the controllability of the control gate polysilicon electrode layer (CG) 17 over the floating gate polysilicon electrode layer (FG) 15. Thereafter, the intergate insulating film 16 is formed, and then the control gate polysilicon electrode layer (CG) 17 is formed, whereby the memory cell structure shown in FIG. 26 is formed. Accordingly, it is possible to increase the capacitance between the CG and the FG, the coupling ratio can be increased, thus improving the controllability of the control gate polysilicon electrode layer (CG) 17.

The semiconductor region 10 may be a semiconductor substrate or may be a well region formed in a semiconductor substrate. The source/drain regions are placed in the selective epitaxial layer 12 interposed between the word lines when viewed from the upper surface of the memory cell array although the source/drain regions are not shown in FIG. 26.

MODIFIED EXAMPLE 2

Figure 27:
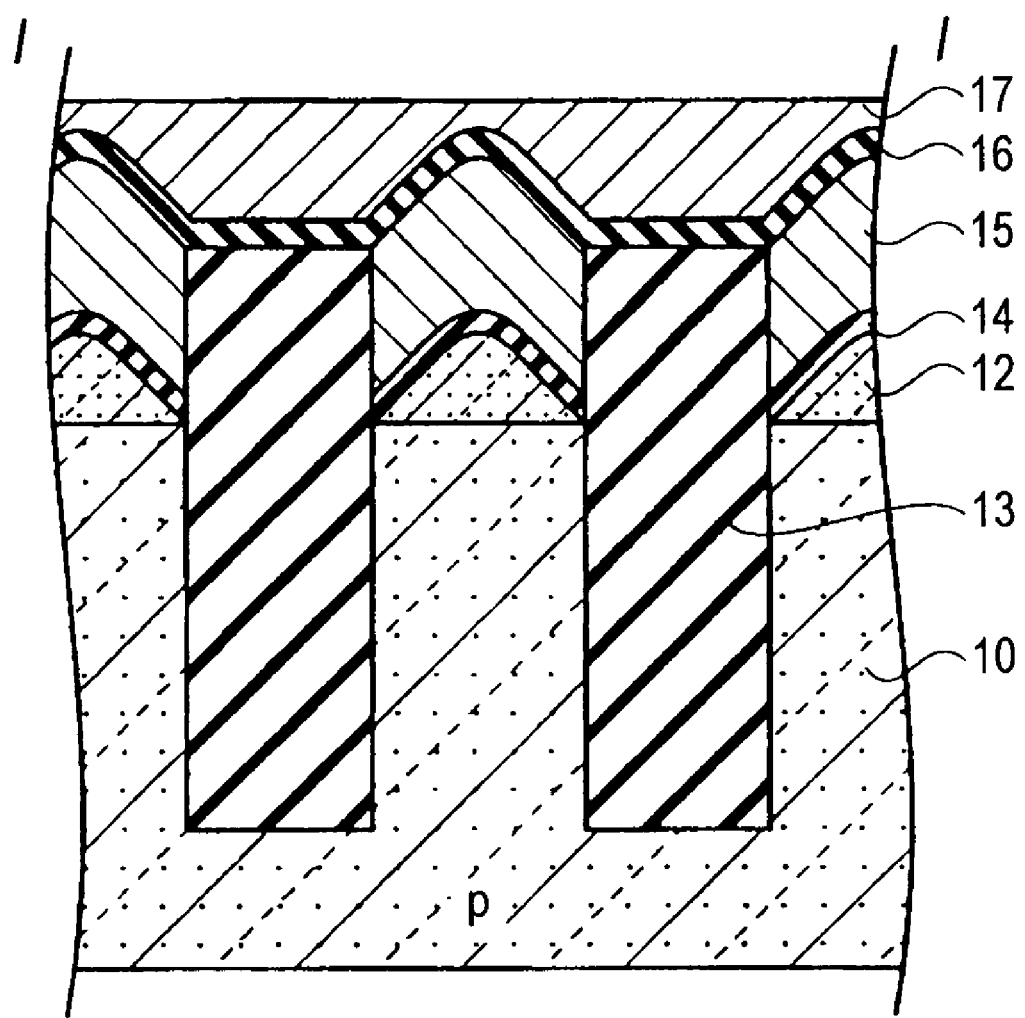
FIG. 27 is a drawing to show the schematic sectional structure of a NAND-type memory cell array section taken on line I-I in FIG. 3, of a nonvolatile semiconductor memory device according to modified example 2 of the second embodiment of the invention.

FIG. 27 shows a schematic sectional structure of a NAND-type memory cell array section taken on line I-I in FIG. 3, of a nonvolatile semiconductor memory device according to modified example 2 of the second embodiment. As shown in FIG. 27, the nonvolatile semiconductor memory device includes: a semiconductor region 10; device isolation regions 13 placed in the semiconductor region 10 and extending in the column direction; a selective epitaxial layer 12 placed between the device isolation regions 13, placed on the semiconductor region 10, and having a triangular shape in cross section along the row direction; source/drain regions (not shown) placed in the selective epitaxial layer 12; a gate insulating film 14 placed between the device isolation regions 13 and placed on a region between the source/drain regions of the selective epitaxial layer 12; a floating gate polysilicon electrode layer (FG) 15 placed between the device isolation regions 13, placed on the gate insulating film 14, and having a triangular convex shape in cross section along the row direction in an upper portion thereof; an intergate insulating film 16 placed on the upper surfaces of the device isolation regions 13 and the floating gate polysilicon electrode layer (FG) 15; and a control gate polysilicon electrode layer (CG) 17 placed on the intergate insulating film 16 and extending in the row direction.

The triangular shape of the selective epitaxial layer 12 has a rounded vertex. After the selective epitaxial layer 12 is formed, the vertex of the triangular selective epitaxial layer 12 is rounded by oxidation treatment or wet treatment.

For example, after forming the floating gate polysilicon electrode layer (FG) 15 as shown in FIG. 9, selective epitaxial growth process of semiconductor layer is again performed to form the upper portion of the floating gate polysilicon electrode layer (FG) 15 to have the triangular shape having the rounded vertex in the cross section. Then, the intergate insulating film 16 is formed and the control gate polysilicon electrode layer (CG) 17 is formed, whereby the memory cell structure shown in FIG. 27 is formed. Accordingly, it is possible to increase the capacitance between the CG and the FG, the coupling ratio can be increased, thus improving the controllability of the control gate polysilicon electrode layer (CG) 17.

The semiconductor region 10 may be a semiconductor substrate or may be a well region formed in a semiconductor substrate. The source/drain regions are placed in the selective epitaxial layer 12 interposed between the word lines when viewed from the upper surface of the memory cell array although the source/drain regions are not shown in FIG. 27.

MODIFIED EXAMPLE 3

Figure 28:
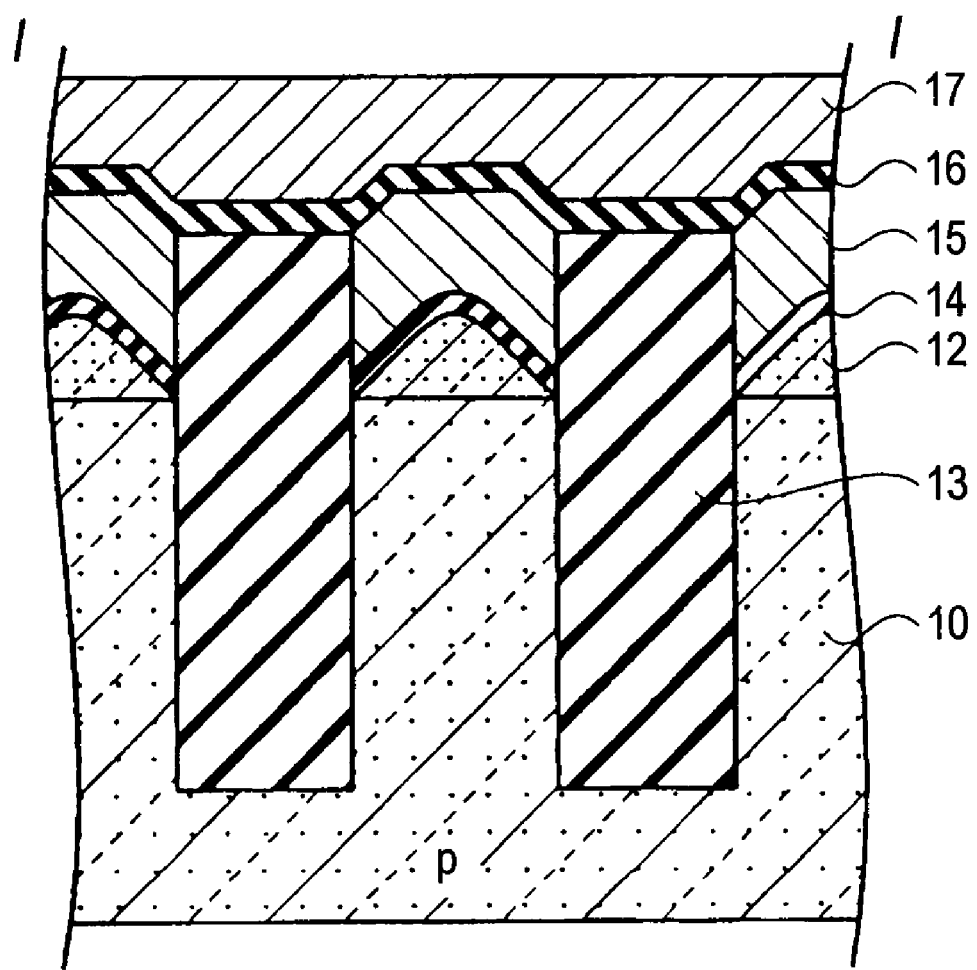
FIG. 28 is a drawing to show the schematic sectional structure of a NAND-type memory cell array section taken on line I-I in FIG. 3, of a nonvolatile semiconductor memory device according to modified example 3 of the second embodiment of the invention.

FIG. 28 shows a schematic sectional structure of a NAND-type memory cell array section taken on line I-I in FIG. 3, of a nonvolatile semiconductor memory device according to modified example 3 of the second embodiment. As shown in FIG. 28, the nonvolatile semiconductor memory device includes: a semiconductor region 10; device isolation regions 13 placed in the semiconductor region 10 and extending in the column direction; a selective epitaxial layer 12 placed between the device isolation regions 13, placed on the semiconductor region 10, and having a triangular shape in cross section along the row direction; source/drain regions (not shown) placed in the selective epitaxial layer 12; a gate insulating film 14 placed between the device isolation regions 13 and placed on a region between the source/drain regions of the selective epitaxial layer 12; a floating gate polysilicon electrode layer (FG) 15 placed between the device isolation regions 13, having a trapezoidal convex shape at an upper portion thereof and placed on the gate insulating film 14, an intergate insulating film 16 placed on the upper surfaces of the device isolation regions 13 and the floating gate polysilicon electrode layer (FG) 15; and a control gate polysilicon electrode layer (CG) 17 placed on the intergate insulating film 16 and extending in the row direction.

The triangular shape of the selective epitaxial layer 12 has a rounded vertex. After the selective epitaxial layer 12 is formed, the vertex of the triangular selective epitaxial layer 12 is rounded by oxidation treatment or wet treatment.

For example, after forming the floating gate polysilicon electrode layer (FG) 15 shown as in FIG. 9, selective epitaxial growth process of semiconductor layer is again performed to form the upper portion of the floating gate polysilicon electrode layer (FG) 15 to have a trapezoidal convex shape in cross section. Then, the intergate insulating film 16 is formed and then the control gate polysilicon electrode layer (CG) 17 is formed, whereby the memory cell structure shown in FIG. 28 is formed. Accordingly, it is possible to increase the capacitance between the CG and the FG, the coupling ratio can be increased, thus improving the controllability of the control gate polysilicon electrode layer (CG) 17.

The semiconductor region 10 may be a semiconductor substrate or may be a well region formed in a semiconductor substrate. The source/drain regions are placed in the selective epitaxial layer 12 interposed between the word lines when viewed from the upper surface of the memory cell array although the source/drain regions are not shown in FIG. 28.

MODIFIED EXAMPLE 4

Figure 29:
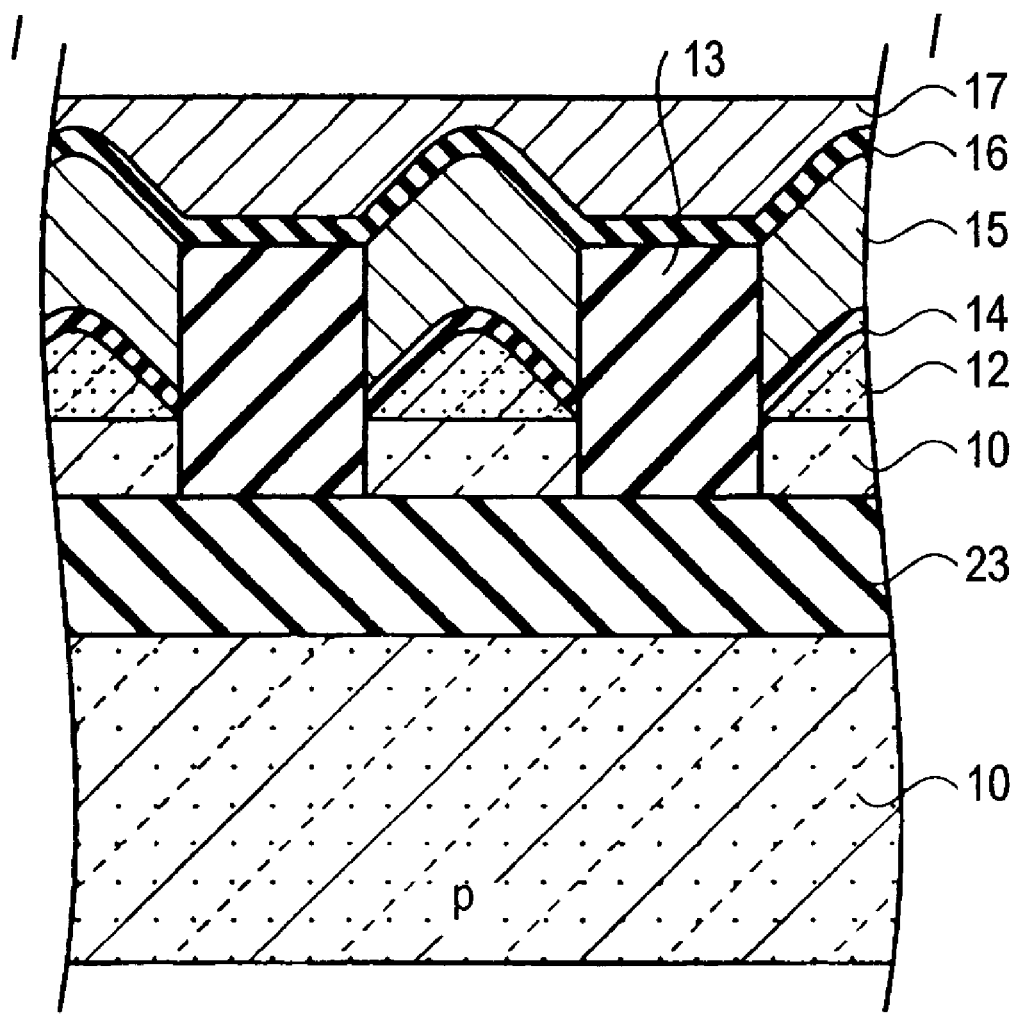
FIG. 29 is a drawing to show the schematic sectional structure of a NAND-type memory cell array section taken on line I-I in FIG. 3, of a nonvolatile semiconductor memory device according to modified example 4 of the second embodiment of the invention.

FIG. 29 shows a schematic sectional structure of a NAND-type memory cell array section taken on line I-I in FIG. 3, of a nonvolatile semiconductor memory device according to modified example 4 of the second embodiment. The nonvolatile semiconductor memory includes: a semiconductor region 10; a buried oxide 23 placed in the semiconductor region 10; device isolation regions 13 placed in the semiconductor region 10 that is positioned on the buried oxide 23, and extending in the column direction; a selective epitaxial layer 12 placed between the device isolation regions 13, placed on the semiconductor region 10 and above the buried oxide 23, and having a triangular shape in cross section along the row direction; source/drain regions (not shown) placed in the selective epitaxial layer 12; a gate insulating film 14 placed between the device isolation regions 13 and placed on a region between the source/drain regions of the selective epitaxial layer 12; a floating gate polysilicon electrode layer (FG) 15 placed between the device isolation regions 13, having a triangular convex shape at an upper portion thereof, and placed on the gate insulating film 14; an intergate insulating film 16 placed on the upper surfaces of the device isolation regions 13 and the floating gate polysilicon electrode layer (FG) 15; and a control gate polysilicon electrode layer (CG) 17 placed on the intergate insulating film 16 and extending in the row direction.

The triangular shape of the selective epitaxial layer 12 has a rounded vertex. After the selective epitaxial layer 12 is formed, the vertex of the triangular selective epitaxial layer 12 is rounded by oxidation treatment or wet treatment.

For example, after forming the floating gate polysilicon electrode layer (FG) 15 is formed, selective epitaxial growth process of semiconductor layer is again performed to form the upper portion of the floating gate polysilicon electrode layer (FG) 15 to have the triangular shape. Then, the intergate insulating film 16 is formed and the control gate polysilicon electrode layer (CG) 17 is formed, whereby the memory cell structure shown in FIG. 29 is formed. Accordingly, it is possible to increase the capacitance between the CG and the FG, the coupling ratio can be increased, thus improving the controllability of the control gate polysilicon electrode layer (CG) 17.

The semiconductor region 10 may be a semiconductor substrate or may be a well region formed in a semiconductor substrate. The source/drain regions are placed in the selective epitaxial layer 12 interposed between the word lines when viewed from the upper surface of the memory cell array although the source/drain regions are not shown in FIG. 29.

MODIFIED EXAMPLE 5

Figure 30:
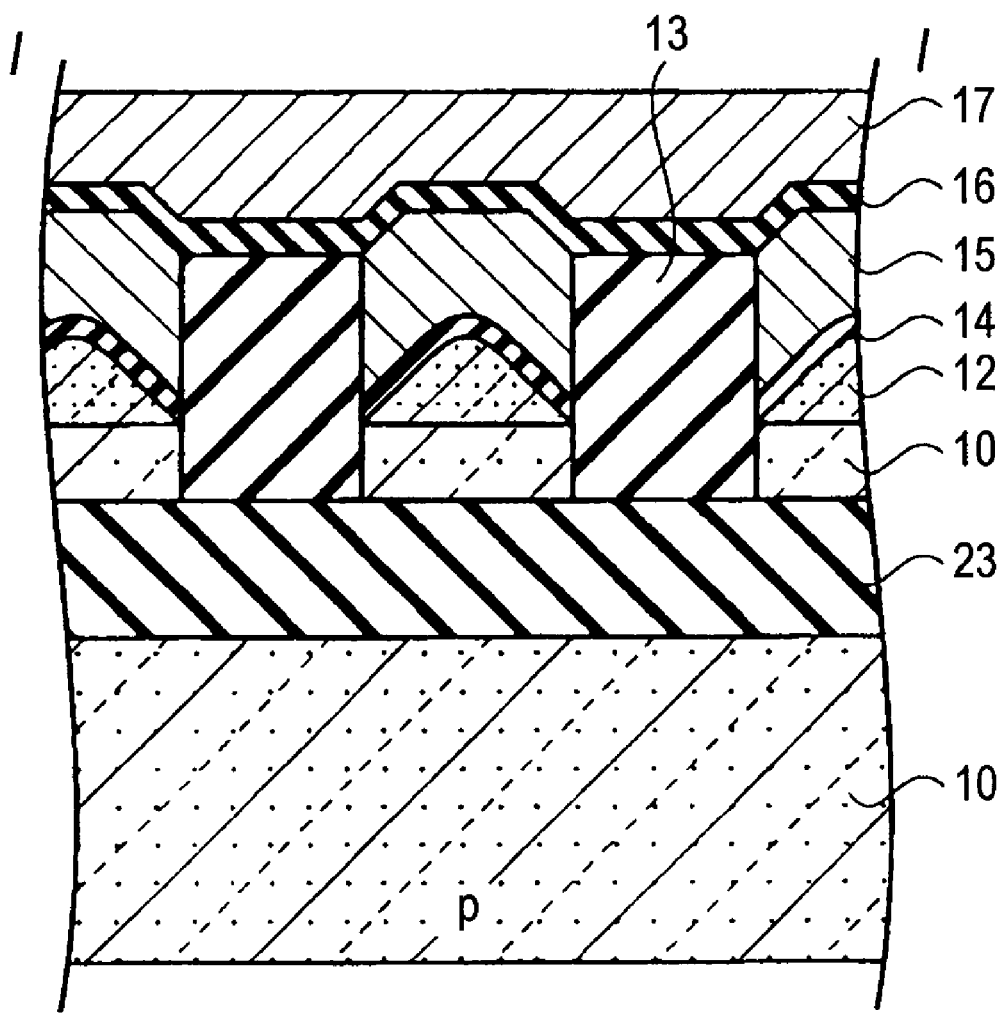
FIG. 30 is a drawing to show the schematic sectional structure of a NAND-type memory cell array section taken on line I-I in FIG. 3, of a nonvolatile semiconductor memory device according to modified example 5 of the second embodiment of the invention.

FIG. 30 shows a schematic sectional structure of a NAND-type memory cell array section taken on line I-I in FIG. 3, of a nonvolatile semiconductor memory device according to modified example 5 of the second embodiment. As shown in FIG. 30, the nonvolatile semiconductor memory device includes: a semiconductor region 10; a buried oxide 23 buried in the semiconductor region 10; device isolation regions 13 placed in the semiconductor region 10 that is positioned on the buried oxide 23, and extending in the column direction; a selective epitaxial layer 12 placed between the device isolation regions 13, placed on the semiconductor region 10 and above the buried oxide 23, and having a triangular shape in cross section along the row direction; source/drain regions (not shown) placed in the selective epitaxial layer 12; a gate insulating film 14 placed between the device isolation regions 13 and placed on a region between the source/drain regions of selective epitaxial layer 12; a floating gate polysilicon electrode layer (FG) 15 placed between the device isolation regions 13, having a trapezoidal convex shape at an upper portion thereof, and placed on the gate insulating film 14; an intergate insulating film 16 placed on the upper surfaces of the device isolation regions 13 and the floating gate polysilicon electrode layer (FG) 15; and a control gate polysilicon electrode layer (CG) 17 placed on the intergate insulating film 16 and extending in the row direction.

The triangular shape of the selective epitaxial layer 12 has a rounded vertex. After the selective epitaxial layer 12 is formed, the vertex of the triangular selective epitaxial layer 12 is rounded by oxidation treatment or wet treatment.

For example, after forming the floating gate polysilicon electrode layer (FG) 15, selective epitaxial growth process of semiconductor layer is again performed to form the upper portion of the floating gate polysilicon electrode layer (FG) 15 to have the trapezoidal shape. Then, the intergate insulating film 16 is formed and the control gate polysilicon electrode layer (CG) 17 is formed, whereby the memory cell structure shown in FIG. 30 is formed. Accordingly, it is possible to increase the capacitance between the CG and the FG, the coupling ratio can be increased, thus improving the controllability of the control gate polysilicon electrode layer (CG) 17.

The semiconductor region 10 may be a semiconductor substrate or may be a well region formed in a semiconductor substrate. The source/drain regions are placed in the selective epitaxial layer 12 interposed between the word lines when viewed from the upper surface of the memory cell array although the source/drain regions are not shown in FIG. 30.

According to the nonvolatile semiconductor memory device and the manufacturing method of the nonvolatile semiconductor memory device according to the second embodiment of the invention, since the upper portion of the active region is formed to have a convex shape in cross section, the electric field at the corner (vertex) strengthens, thus increasing the current density. Therefore, the depletion layer width in the convex channel vicinity widens, thereby improving the sub-threshold factor. Further, the back gate effect decreases, thereby providing an excellent short channel characteristic. Since the upper portion of the active region is formed to have the convex shape, the coupling ratio is improved, and the electric field during the writing operation strengthens. Therefore, the writing efficiency improves. Further, the electric field during data retention tends to disperse, so that the electrons injected into the floating gate electrode layer become hard to tunnel and an excellent retention characteristic is provided.

In the nonvolatile semiconductor memory device according to the second embodiment of the invention, the cross section along the row direction is convex at the upper portion of the floating gate polysilicon electrode layer (FG) 15, so that it is possible to increase the capacitance between the CG and the FG, the coupling ratio can be increased, thus further improving the controllability of the control gate polysilicon electrode layer (CG) 17 over the floating gate polysilicon electrode layer (FG) 15.

Third Embodiment

The first and second embodiments have been described by taking as an example the nonvolatile semiconductor memory device for switching a writing state and an erasing state by controlling the stored charges of the floating gate polysilicon electrode layer (FG) 15. However, the invention can also be applied to a memory cell for controlling the charge amount trapped in a gate insulating film rather than controlling the stored charges of the floating gate polysilicon electrode layer (FG) 15. A charge trap insulating film having a charge trap is disposed on a convex active region, and a control gate electrode is placed on the charge trap insulating film, thereby providing a nonvolatile semiconductor memory device having excellent short channel effect and writing and erasing characteristics without providing a floating gate polysilicon electrode layer (FG). As the charge trap insulating film, an ONO (Oxide-Nitride-Oxide) film 24, etc., for implementing a SONOS structure or a MONOS structure can be applied, for example. A MANOS (Metal-$Al_2O_3$—SiN—$SiO_2$—Si) structure can also be applied.

Figure 31:
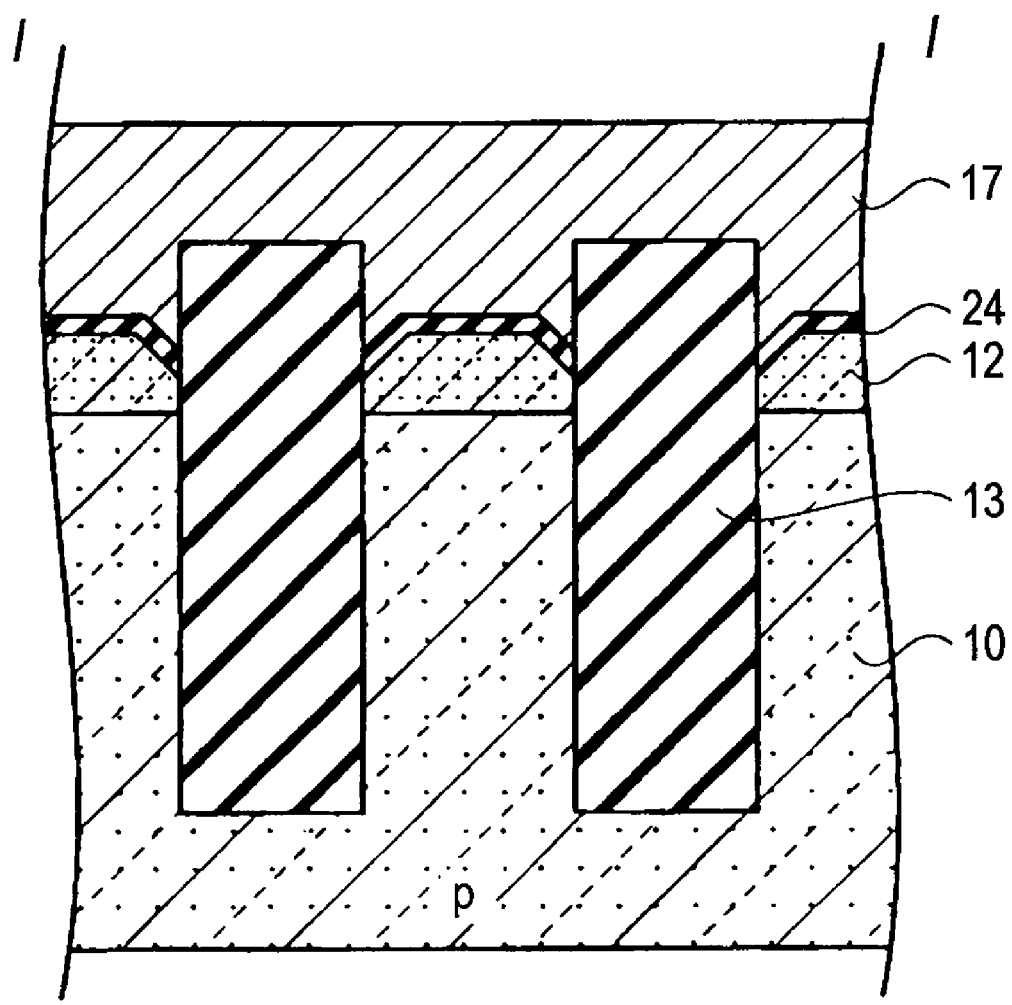
FIG. 31 is a drawing to show the schematic sectional structure of a NAND-type memory cell array section taken on line I-I in FIG. 3, of a nonvolatile semiconductor memory device according to a third embodiment of the invention.

FIG. 31 shows a schematic sectional structure of a NAND-type memory cell array section taken on line I-I in FIG. 3, of a nonvolatile semiconductor memory device according to a third embodiment. As shown in FIG. 31, the nonvolatile semiconductor memory device includes: a semiconductor region 10; device isolation regions 13 placed in the semiconductor region 10 and extending in the column direction; a selective epitaxial layer 12 placed on the semiconductor region 10 and between the device isolation regions 13, and having a trapezoidal shape in cross section along the row direction; source/drain regions (not shown) placed in the selective epitaxial layer 12; an ONO film 24 placed between the device isolation regions 13 and placed on a region between the source/drain regions of the selective epitaxial layer 12; and a control gate polysilicon electrode layer (CG) 17 placed on the upper surfaces of the device isolation regions 13 and the ONO film 24, and extending in the row direction.

The semiconductor region 10 may be a semiconductor substrate or may be a well region formed in a semiconductor substrate. The source/drain regions are placed in the selective epitaxial layer 12 interposed between the word lines when viewed from the upper surface of the memory cell array although the source/drain regions are not shown in FIG. 31. Further, the source/drain regions are spaced with respect to the column direction, similar to source/drain diffusion layers 40 shown in FIG. 41C. The gate insulating film 14 is formed on a region between adjacent source/drain regions of the selective epitaxial layer 12.

In the nonvolatile semiconductor memory device according to the third embodiment, a deposition film of $SiO_2$/SiN/$SiO_2$ is used as an insulating film for trapping carriers. The intermediate SiN film functions as an electron trap. FIG. 31 shows a case where the control gate polysilicon electrode layer (CG) 17 is formed after the deposition film of $SiO_2$/SiN/$SiO_2$ (ONO film) 24 is formed instead of formation of the gate insulating film 14 shown in FIG. 9.

The trapezoidal convex shape of the selective epitaxial layer 12 has two wedge parts. Since an upper portion of the active region of the selective epitaxial layer 12 is formed to have a trapezoidal convex shape, the electric field in each wedge part (vertex) strengthens, the charge trap potential in the ONO film 24 can obtain larger dominion over the channel region, so that the short channel characteristic improves. Since the substantial channel width increases, the cell current also increases. Further, not only the writing characteristic from the channel region into the charge trap level in the ONO film 24 improves, but also the retention characteristic of retaining the charges written into the charge trap level in the ONO film 24 at the charge trap level improves.

MODIFIED EXAMPLE 1

Figure 32:
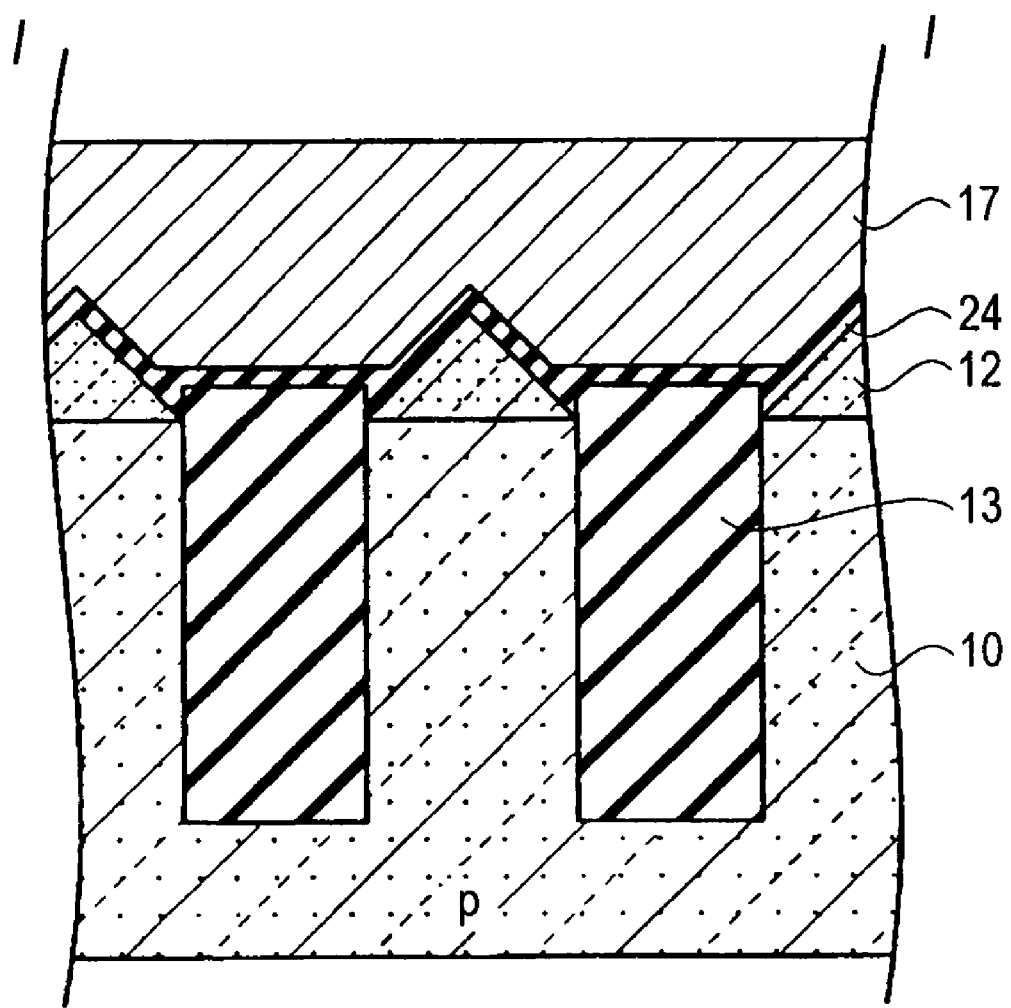
FIG. 32 is a drawing to show the schematic sectional structure of a NAND-type memory cell array section taken on line I-I in FIG. 3, of a nonvolatile semiconductor memory device according to modified example 1 of the third embodiment of the invention.

FIG. 32 shows a schematic sectional structure of a NAND-type memory cell array section taken on line I-I in FIG. 3, of a nonvolatile semiconductor memory device according to modified example 1 of the third embodiment. As shown in FIG. 32, the nonvolatile semiconductor memory device includes: a semiconductor region 10; device isolation regions 13 placed in the semiconductor region 10 and extending in the column direction; a selective epitaxial layer 12 placed on the semiconductor region 10 and between the device isolation regions 13, and having triangular shape in cross section along the row direction; source/drain regions (not shown) placed in the selective epitaxial layer 12; an ONO film 24 placed on an upper surface of the selective epitaxial layer 12 between the source/drain regions and the device isolation region 13; and a control gate polysilicon electrode layer (CG) 17 placed on the ONO film 24 and extending in the row direction. The semiconductor region 10 may be a semiconductor substrate or may be a well region formed in a semiconductor substrate. The source/drain regions are placed in the selective epitaxial layer 12 interposed between the word lines when viewed from the upper surface of the memory cell array although the source/drain regions are not shown in FIG. 32.

The nonvolatile semiconductor memory device according to modified example 1 of the third embodiment can be formed by etching back the height of each device isolation region 13 to about a height of the semiconductor region 10 before forming the selective epitaxial layer 12 and then forming the selective epitaxial layer 12 having a triangular convex shape, the laminated film of $SiO_2$/SiN/$SiO_2$ (ONO film) 24, and the control gate polysilicon electrode layer (CG) 17 in this order.

Since an upper portion of the active region of the selective epitaxial layer 12 is formed to have a triangle shape, the electric field in the wedge part (vertex) strengthens, the charge trap potential in the ONO film 24 can obtain larger dominion over the channel region, so that the short channel characteristic improves. Since the substantial channel width increases, the cell current also increases. Further, not only the writing characteristic from the channel region into the charge trap level in the ONO film 24 improves, but also the retention characteristic of retaining the charges written into the charge trap level in the ONO film 24 at the charge trap level improves.

MODIFIED EXAMPLE 2

Figure 33:
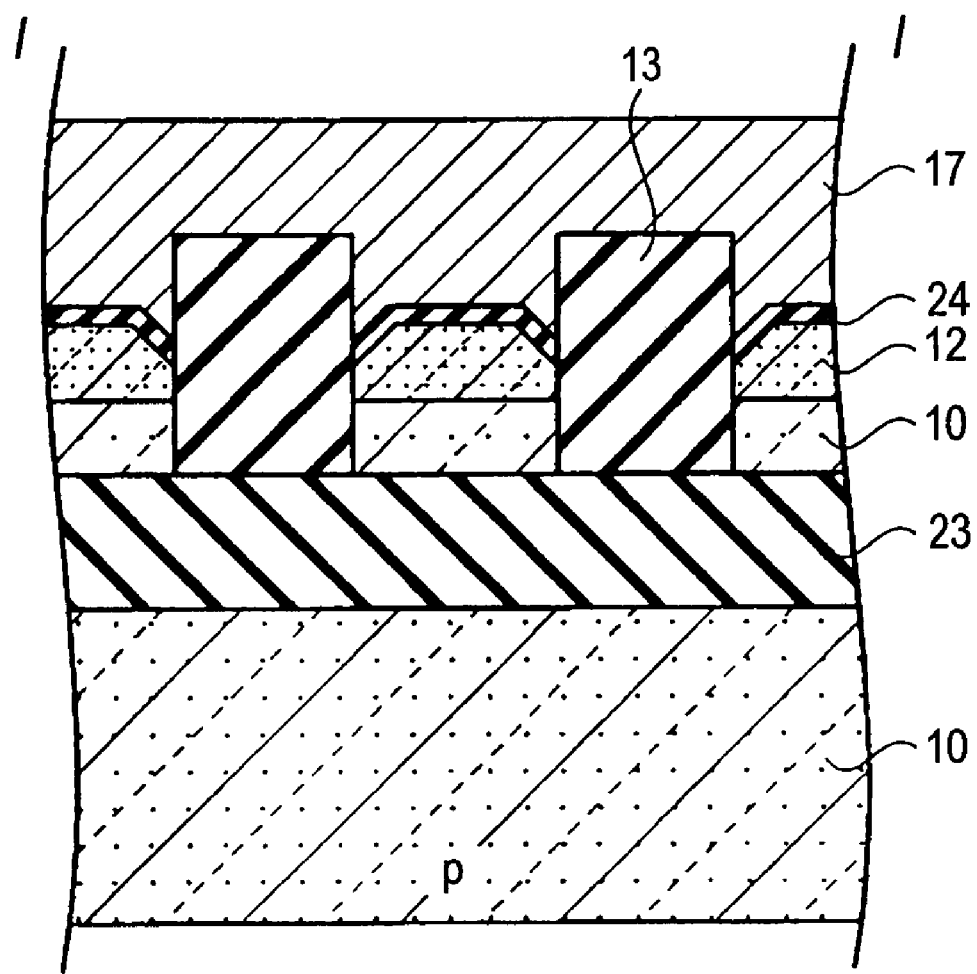
FIG. 33 is a drawing to show the schematic sectional structure of a NAND-type memory cell array section taken on line I-I in FIG. 3, of a nonvolatile semiconductor memory device according to modified example 2 of the third embodiment of the invention.

FIG. 33 shows a schematic sectional structure of a NAND-type memory cell array section taken on line I-I in FIG. 3, of a nonvolatile semiconductor memory device according to modified example 2 of the third embodiment. As shown in FIG. 33, the nonvolatile semiconductor memory device includes: a semiconductor region 10; a buried oxide 23 placed in the semiconductor region 10; device isolation regions 13 placed in the semiconductor region 10 that is positioned on the buried oxide 23, and extending in the column direction; a selective epitaxial layer 12 placed on the semiconductor region 10 and between the device isolation regions 13, and having a trapezoidal shape in cross section along the row direction; source/drain regions (not shown) placed in the selective epitaxial layer 12; an ONO film 24 placed between the device isolation regions 13 and placed on an upper surface of the selective epitaxial layer 12 between the source/drain regions; and a control gate polysilicon electrode layer (CG) 17 placed on the ONO film 24 and the upper surfaces of the device isolation regions 13 and extending in the row direction, as shown in FIG. 33.

The semiconductor region 10 may be a semiconductor substrate or may be a well region formed in a semiconductor substrate. The source/drain regions are placed in the selective epitaxial layer 12 interposed between the word lines when viewed from the upper surface of the memory cell array although the source/drain regions are not shown in FIG. 33.

The trapezoidal convex shape of the selective epitaxial layer 12 has two wedge parts. Since an upper portion of the active region of the selective epitaxial layer 12 is formed to have a trapezoidal convex shape, the electric field in each wedge part (vertex) strengthens, and the charge trap potential in the ONO film 24 can obtain larger dominion over the channel region, so that the short channel characteristic improves. Since the substantial channel width increases, the cell current also increases. Further, not only the writing characteristic from the channel region into the charge trap level in the ONO film 24 improves, but also the retention characteristic of retaining the charges written into the charge trap level in the ONO film 24 at the charge trap level improves.

MODIFIED EXAMPLE 3

Figure 34:
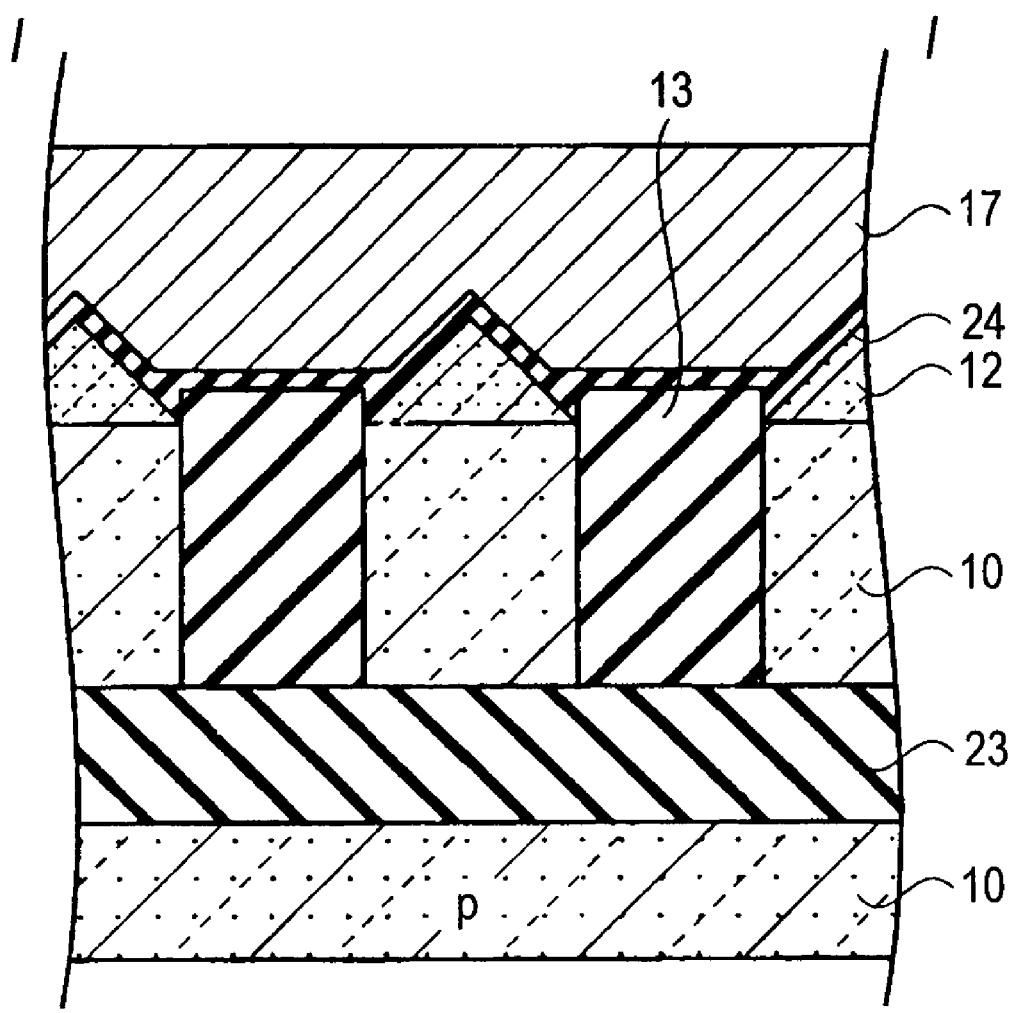
FIG. 34 is a drawing to show the schematic sectional structure of a NAND-type memory cell array section taken on line I-I in FIG. 3, of a nonvolatile semiconductor memory device according to modified example 3 of the third embodiment of the invention.

FIG. 34 shows schematic sectional structure of a NAND-type memory cell array section taken on line I-I in FIG. 3, of a nonvolatile semiconductor memory device according to modified example 3 of the third embodiment. As shown in FIG. 34, the nonvolatile semiconductor memory device includes: a semiconductor region 10; a buried oxide 23 placed in the semiconductor region 10; device isolation regions 13 placed in the semiconductor region 10 that is positioned on the buried oxide 23, and extending in the column direction; a selective epitaxial layer 12 placed on the semiconductor region 10 and between the device isolation regions 13, and having triangular in cross section along the row direction; source/drain regions (not shown) placed in the selective epitaxial layer 12; an ONO film 24 placed on an upper surface of the selective epitaxial layer 12 between the source/drain regions and placed on the device isolation region 13; and a control gate polysilicon electrode layer (CG) 17 placed on the ONO film 24 and extending in the row direction. The semiconductor region 10 may be a semiconductor substrate or may be a well region formed in a semiconductor substrate. The source/drain regions are placed in the selective epitaxial layer 12 interposed between the word lines when viewed from the upper surface of the memory cell array although the source/drain regions are not shown in FIG. 34.

The nonvolatile semiconductor memory device according to modified example 3 of the third embodiment can be formed by etching back the height of each device isolation region 13 to about a height of the semiconductor region 10 before forming the selective epitaxial layer 12 and then forming the selective epitaxial layer 12 having a triangular convex shape, the laminated film of $SiO_2/SiN/SiO_2$ (ONO film) 24, and the control gate polysilicon electrode layer (CG) 17 in this order.

Since an upper portion of the active region of the selective epitaxial layer 12 is formed to have a triangle shape, the electric field in the wedge part (vertex) strengthens, the charge trap potential in the ONO film 24 can obtain larger dominion over the channel region, so that the short channel characteristic improves. Since the substantial channel width increases, the cell current also increases. Further, not only the writing characteristic from the channel region into the charge trap level in the ONO film 24 improves, but also the retention characteristic of retaining the charges written into the charge trap level in the ONO film 24 at the charge trap level improves.

According to the nonvolatile semiconductor memory device according to the third embodiment of the invention, since the upper portion of the active region is formed to have a convex shape in cross section, the electric field at the corner (vertex) strengthens, thus increasing the current density. Therefore, the depletion layer width in the convex channel vicinity widens, thereby improving the sub-threshold factor. Further, the back gate effect decreases, thereby providing an excellent short channel characteristic. Since the upper portion of the active region is formed to have the convex shape, the coupling ratio is improved, and the electric field during the writing operation strengthens. Therefore, the writing efficiency improves. Further, the electric field during data retention tends to disperse, so that the electrons trapped in the trap level in the charge trap insulating film become hard to tunnel and an excellent retention characteristic is provided.

Further, in the nonvolatile semiconductor memory device according to the third embodiment of the invention, the charge trap insulating film having a charge trap is disposed on the convex active region, and the control gate electrode is placed on the upper surface of the charge trap insulating film, whereby excellent short channel effect and writing and erasing characteristics are provided.

Further, in the nonvolatile semiconductor memory device according to the third embodiment of the invention, a floating gate need not be placed and thus manufacturing is facilitated. Further, since the level difference is suppressed, the device is easily planarized and the simple structure can be obtained.

Fourth Embodiment

The first to third embodiments shows the nonvolatile semiconductor memory device having the active region AA of the convex surface shape in cross section along the row direction (word line WL direction: I-I line direction). In a nonvolatile semiconductor memory device according to a fourth embodiment, a structure further having convex active regions AA in cross section along the column direction (bit line BL direction: III-III line direction) will be described.

Figure 35A:
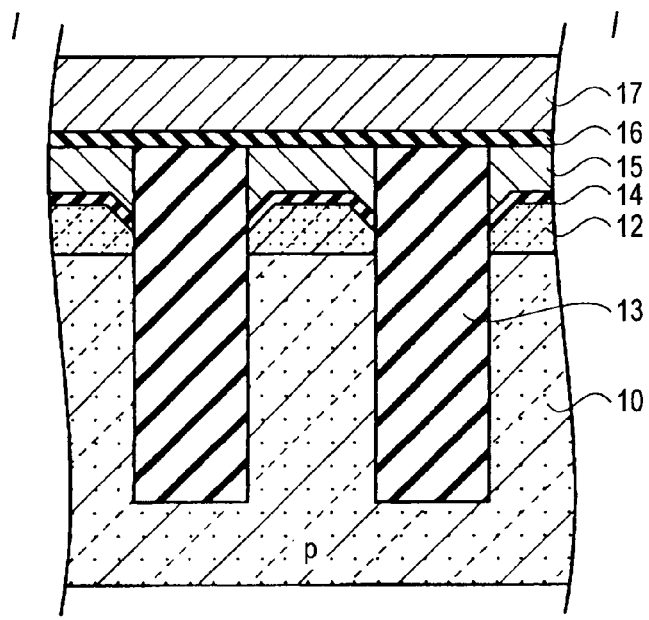
FIGS. 35A to 35D are schematic diagrams of a NAND-type nonvolatile semiconductor memory device according to a fourth embodiment of the invention.
Figure 35B:
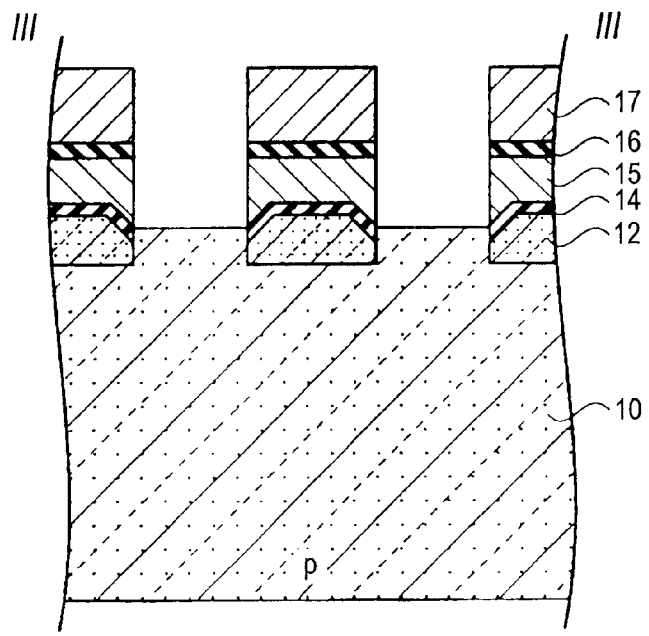
Figure 35C:
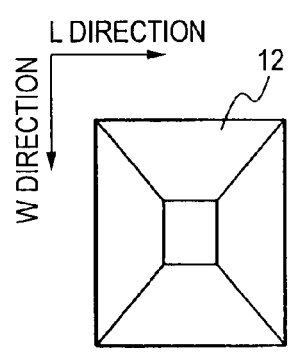
Figure 35D:
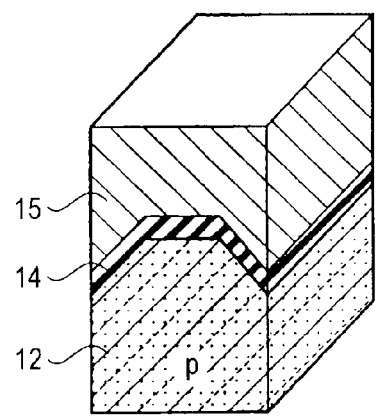

FIGS. 35A to 35D are schematic diagrams of a NAND-type nonvolatile semiconductor memory device according to the fourth embodiment of the invention. The schematic sectional structure of each memory cell transistor taken on line I-I is represented as shown in FIG. 35A; the schematic sectional structure of each memory cell transistor taken on line III-III is represented as shown in FIG. 35B; a schematic planar pattern of a selective epitaxial layer 12 of each memory cell transistor is represented as shown in FIG. 35C; and the schematic three-dimensional sectional structure of each memory cell transistor is represented as shown in FIG. 35D.

The nonvolatile semiconductor memory device includes: a semiconductor region 10; device isolation regions (STI) 13 placed in the semiconductor region 10 and extending in the column direction; a selective epitaxial layer 12 placed on the semiconductor region 10 and between the device isolation regions 13, and having a trapezoidal convex shape in cross sections along the row direction and the column direction; source/drain regions (not shown) placed in the selective epitaxial layer 12; a gate insulating film 14 placed between the device isolation regions 13 and placed on a region between the source/drain regions of the selective epitaxial layer 12; a floating gate polysilicon electrode layer (FG) 15 placed between the device isolation regions 13, having substantially the same height as the upper surface of the device isolation region 13, and placed on the gate insulating film 14; an intergate insulating film 16 placed on the upper surfaces of the device isolation regions 13 and the floating gate polysilicon electrode layer (FG) 15; and a control gate polysilicon electrode layer (CG) 17 placed on the intergate insulating film 16 and extending in the row direction. The semiconductor region 10 may be a semiconductor substrate or may be a well region formed in a semiconductor substrate. The source/drain regions are placed in the selective epitaxial layer 12 interposed between the word lines although the source/drain regions are not shown in FIGS. 35A to 35D.

The convex shape of the selective epitaxial layer 12 has four wedge parts as shown in FIG. 35C. Since an upper portion of the active region of the selective epitaxial layer 12 is formed to have a trapezoidal conical convex shape, the electric field at each wedge part (vertex) strengthens. Thus, the floating gate polysilicon electrode layer (FG) 15 can obtain larger dominion over the channel region, so that the short channel characteristic improves. Since the substantial channel width increases, the cell current also increases. Further, not only the writing characteristic from the channel region into the floating gate polysilicon electrode layer (FG) 15 improves, but also the retention characteristic of retaining the charges in the floating gate polysilicon electrode layer (FG) 15, which are written into the floating gate polysilicon electrode layer (FG) 15, improves.

(Manufacturing Method of Dummy NAND Cell)

Figure 36A:
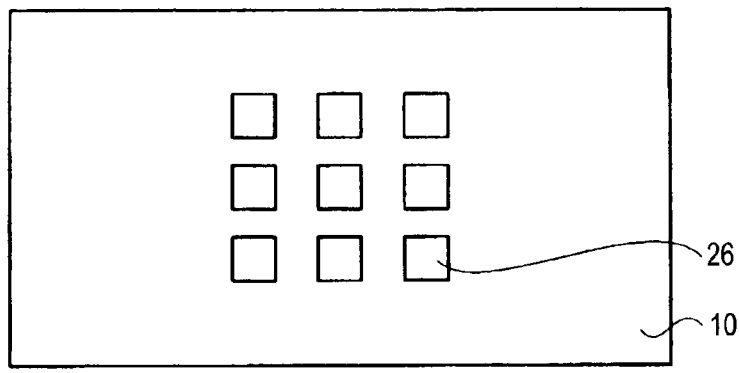
FIGS. 36A to 36D are schematic diagrams of dummy NAND cells used in a manufacturing method of the nonvolatile semiconductor memory device according to the fourth embodiment of the invention.
Figure 36B:
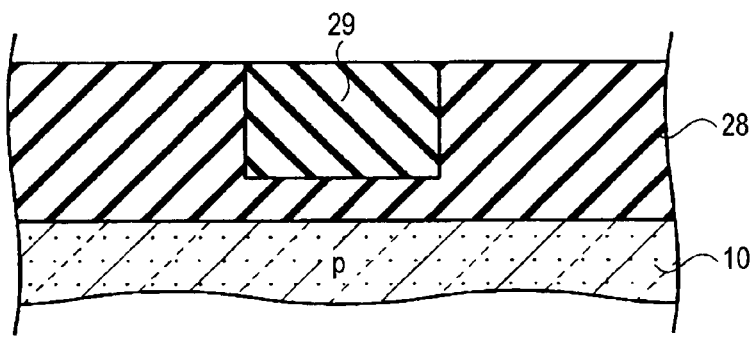
Figure 36C:
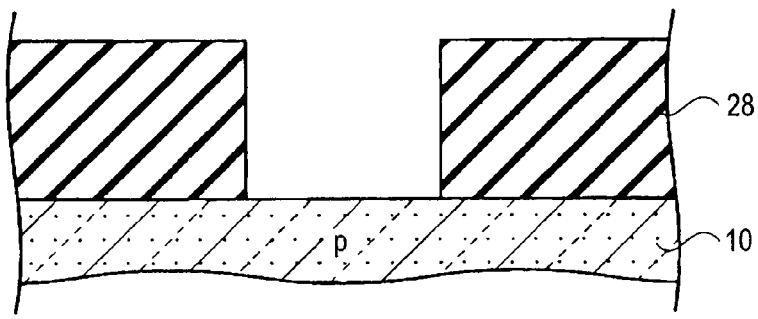
Figure 36D:
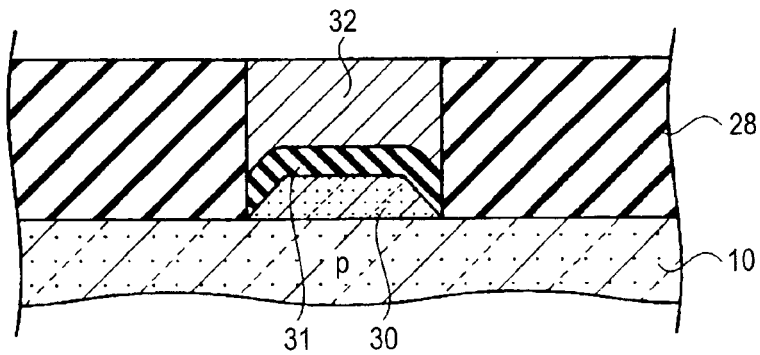

A manufacturing method of dummy cells used in a manufacturing method of the nonvolatile semiconductor memory device according to the fourth embodiment of the invention is represented as shown in FIGS. 36A to 36D. FIG. 36A shows a schematic planar pattern of dummy NAND cells; FIG. 36B shows a dummy cell nitrogen film formation process; FIG. 36C shows a dummy cell patterning process; and FIG. 36D shows a dummy cell memory cell transistor formation process.

(a) First, a pattern of dummy NAND cells 26 is placed on a semiconductor region 10, as shown in FIG. 36A.

(b) Next, a dummy gate is used to previously perform device isolation region and gate working, any other region than the dummy NAND cell 26 is buried with a dummy cell insulating film 28, and a dummy cell nitrogen film 29 is formed in the pattern region of the dummy NAND cell 26, as shown in FIG. 36B.

(c) Next, the dummy cell nitrogen film 29 and the dummy cell insulating film 28 that is positioned below the dummy cell nitrogen film 29 are removed, and the pattern region of the dummy NAND cell 26 is opened for exposing the semiconductor region 10 of the dummy gate region, as shown in FIG. 36C.

(d) Next, as shown in FIG. 36D, a dummy cell selective epitaxial layer 30 having a trapezoidal conical convex region is formed by selective epitaxial growth, a gate insulating film 14 is formed on the dummy cell selective epitaxial layer 30, and a dummy cell floating gate polysilicon electrode layer (FG) 32 is formed on the gate insulating film 14. Further, an intergate insulating film 16 is formed on the dummy cell floating gate polysilicon electrode layer (FG) 32, and a control gate polysilicon electrode layer (CG) 17 is formed on the intergate insulating film 16 using a dummy gate process.

By using the manufacturing method of dummy NAND cells, a fine memory cell transistor containing a selective epitaxial layer having a trapezoidal conical convex shape can be formed in good yield in the manufacturing method of the nonvolatile semiconductor memory device according to the fourth embodiment.

In the structure of the nonvolatile semiconductor memory device according to the fourth embodiment, the channel is coveted with a gate, so that the effect of neighboring cells on the channel can be decreased, and it is possible to improve the Yupin effect.

According to the nonvolatile semiconductor memory device according to the fourth embodiment, an upper portion of the active region is formed to have a trapezoidal conical convex shape, so that the electric field in the corner (vertex) strengthens, thus increasing the current density. Therefore, the depletion layer width in the trapezoidal conical convex channel vicinity widens, thereby improving the sub-threshold factor. Further, the back gate effect decreases, thereby providing an excellent short channel characteristic. Since the upper portion of the active region is formed to have the trapezoidal conical convex shape, the coupling ratio is improved, and the electric field during the writing operation strengthens. Therefore, the writing efficiency improves. Further, the electric field during data retention tens to disperse, so that the electrons injected into the floating gate electrode layer become hard to tunnel and an excellent retention characteristic is provided.

Fifth Embodiment

Figure 41A:
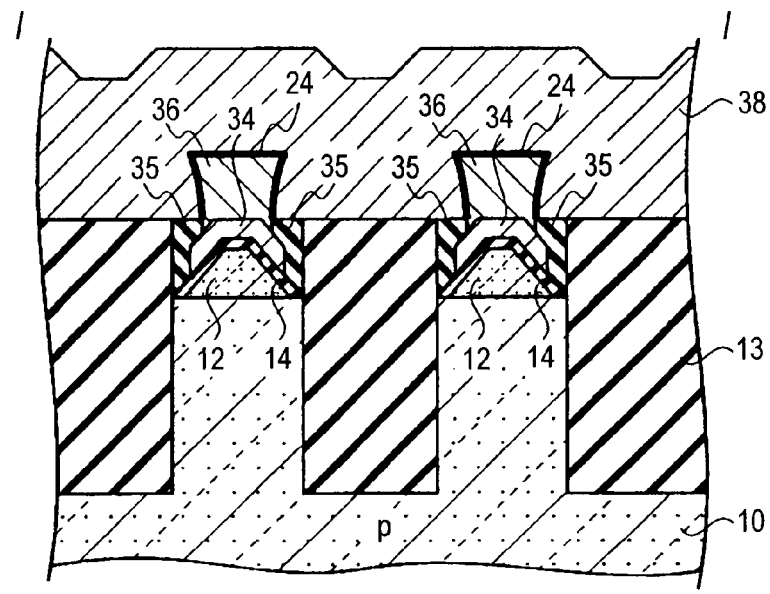
FIGS. 41A to 41C show a process of the manufacturing method of the nonvolatile semiconductor memory device according to the fifth embodiment of the invention.

A nonvolatile semiconductor memory device of the fifth embodiment is capable of further increasing the coupling ratio with a control gate by forming the structure of a floating gate FG having an inverted Y shape. The structure of the floating gate FG having the inverted Y shape in the nonvolatile semiconductor memory device according to the fifth embodiment is represented as shown in FIG. 41A.

(Manufacturing Method)

A manufacturing method of the nonvolatile semiconductor memory device according to the fifth embodiment will be described with reference to FIGS. 37A to 41C. The processes until a completion of the forming selective epitaxial layer 12 are similar to the processes of the nonvolatile semiconductor memory device according to the first embodiment previously described with reference to FIGS. 6 to 8 and therefore will not be described again.

FIGS. 37A, 38A, 39A, 40A and 41A show the schematic sectional structure taken on line I-I in FIG. 3; FIGS. 37B, 38B, 39B, 40B and 41B show the schematic sectional structure taken on line II-II in FIG. 3; and FIGS. 37C, 38C, 39C, 40C and 41C show the schematic sectional structure taken on line III-III in FIG. 3.

Figure 37A:
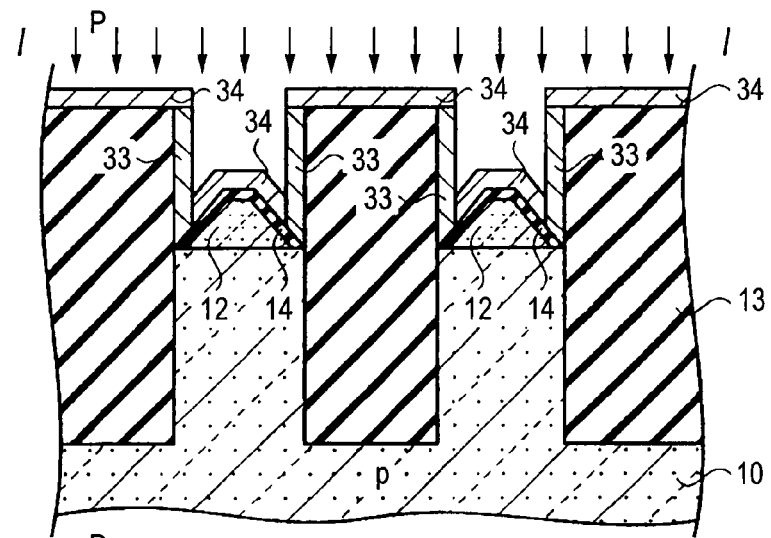
FIGS. 37A to 37C show a process of a manufacturing method of a nonvolatile semiconductor memory device according to a fifth embodiment of the invention.
Figure 37B:
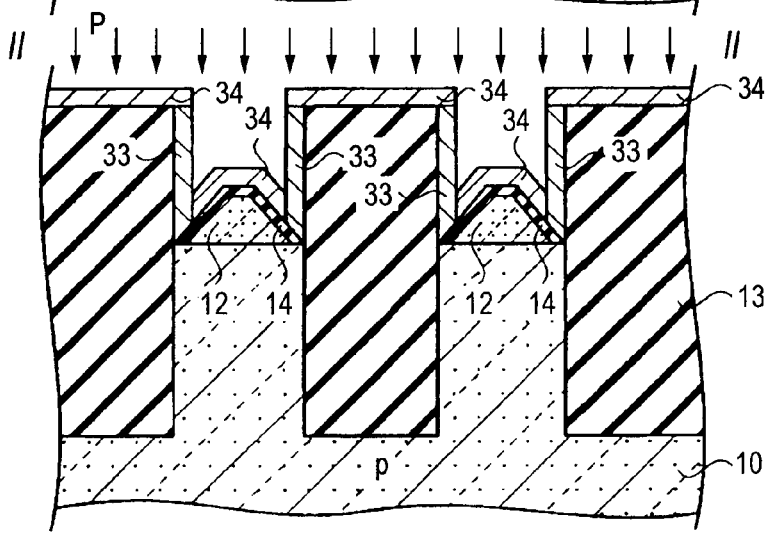
Figure 37C:
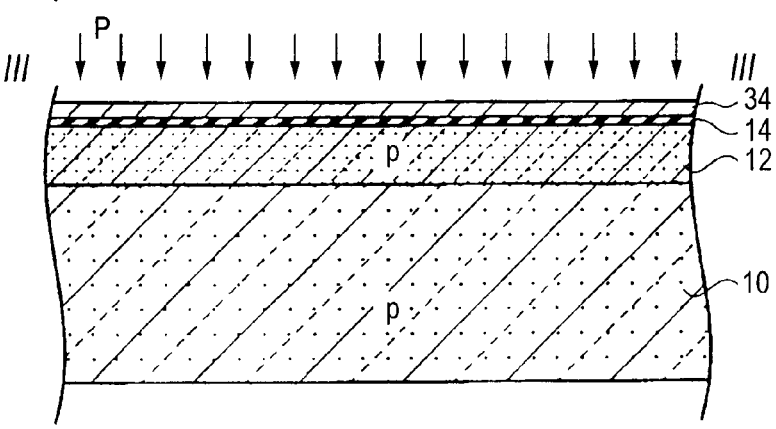

(a) After the selective epitaxial layer 12 is formed, the surface of the selective epitaxial layer 12 with a convex shaped is thermally oxidized to form a gate insulating film 14 made of a tunneling oxide film about 8 nm in thickness, and an amorphous silicon layer 33 having a thickness of about 10 nm is deposited on the gate insulating film 14 and device isolation regions 13, as shown in FIGS. 37A to 37C.

(g) Further, an ion implantation technique is performed to implant ions to the entire semiconductor device surface under an acceleration condition that allows P ions to be implanted only into the amorphous silicon layer 33 from the vertical direction, as shown in FIGS. 37A to 37C. Consequently, an amorphous silicon layer 34 doped with P is formed.

Figure 38A:
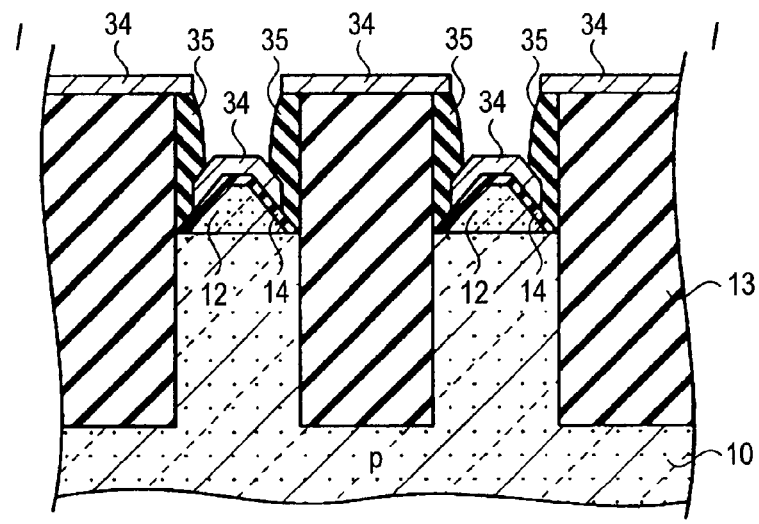
FIGS. 38A to 38C show a process of the manufacturing method of the nonvolatile semiconductor memory device according to the fifth embodiment of the invention.
Figure 38B:
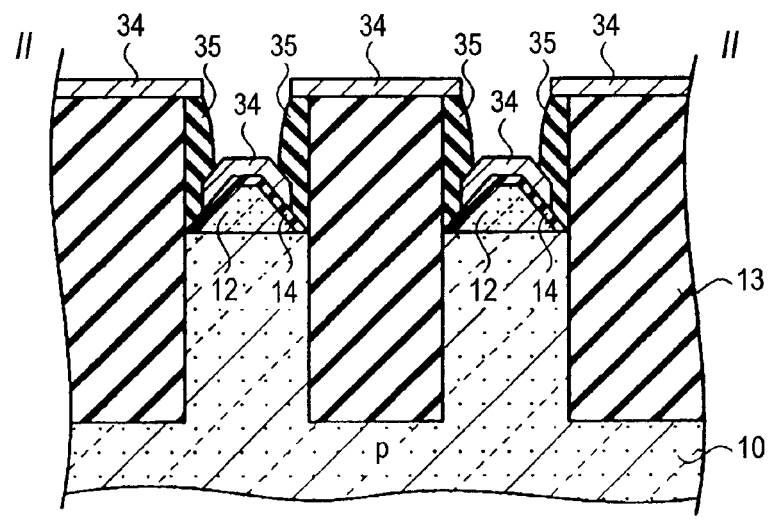
Figure 38C:
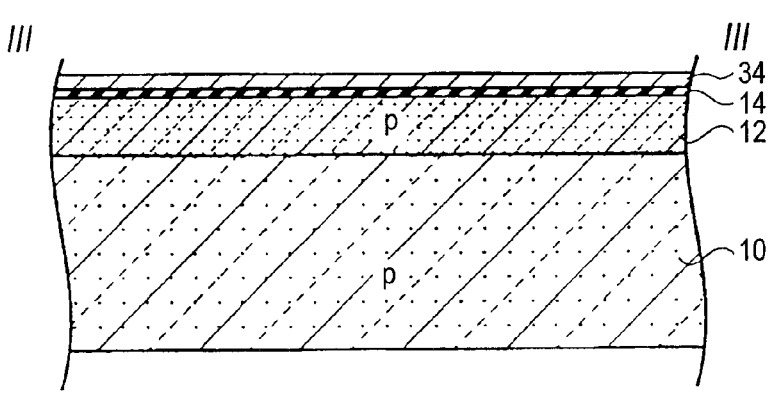

(h) Next, alkaline chemical solution etching is performed for leaving only the amorphous silicon layer 34 into which P ions are implanted and removing the amorphous silicon layer 33 formed on the side wall portions of the device isolation region 13, as shown in FIGS. 38A to 38C.

(i) Further, HTO is deposited about 15 nm in thickness on the entire semiconductor device surface, and the HTO of only a flat portion is etched, thereby forming side wall insulating films 35 as shown in FIGS. 38A to 38C.

(j) Next, for example, a floating gate amorphous silicon electrode layer (FG) 36 doped with P is deposited on the entire semiconductor device surface as shown in FIGS. 38A to 38C.

Figure 39A:
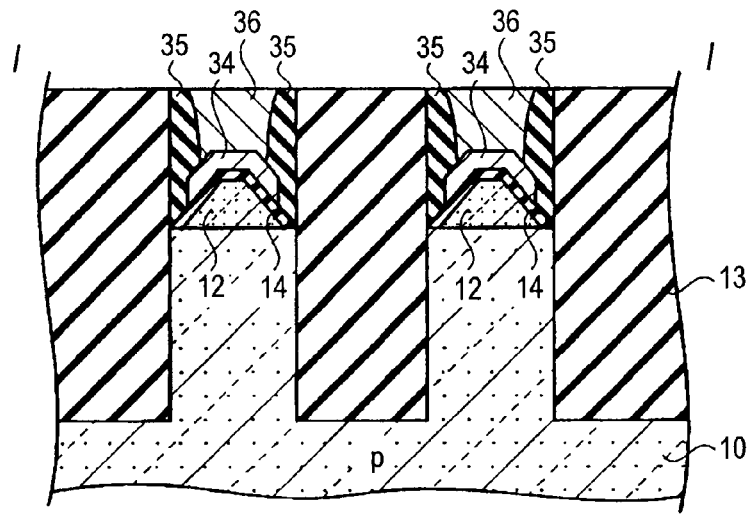
FIGS. 39A to 39C show a process of the manufacturing method of the nonvolatile semiconductor memory device according to the fifth embodiment of the invention.
Figure 39B:
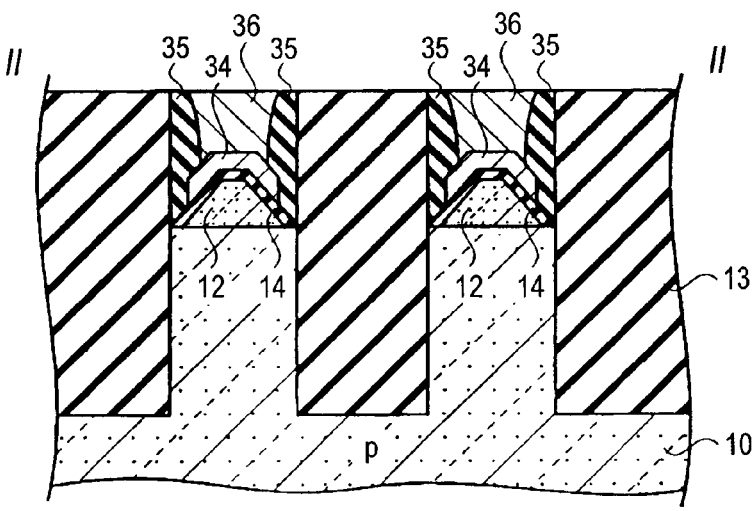
Figure 39C:
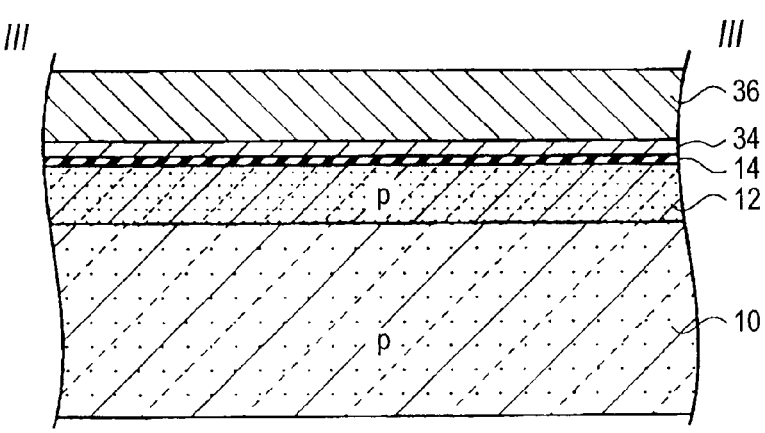

(k) Further, planarization is executed by CMP, thus removing the floating gate amorphous silicon electrode layer (FG) 36 and the amorphous silicon layer 34 which are positioned on the device isolation region 13 as shown in FIGS. 39A to 39C.

Figure 40A:
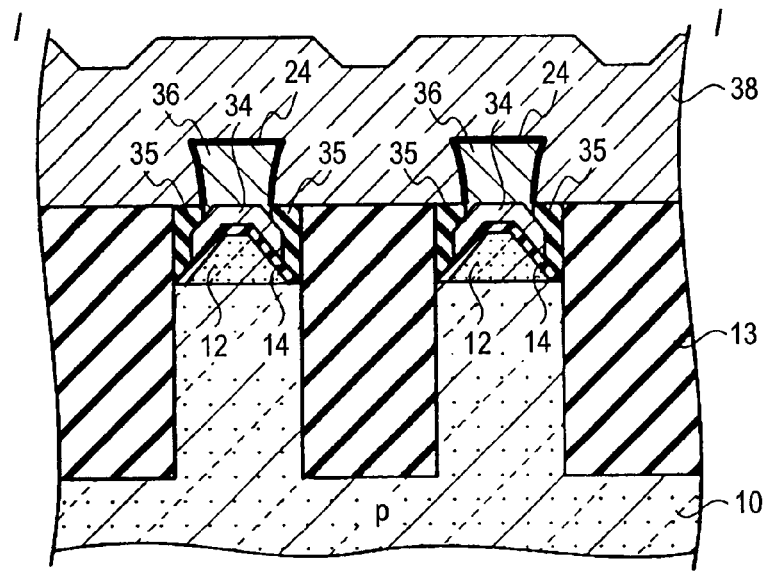
FIGS. 40A to 40C show a process of the manufacturing method of the nonvolatile semiconductor memory device according to the fifth embodiment of the invention.
Figure 40B:
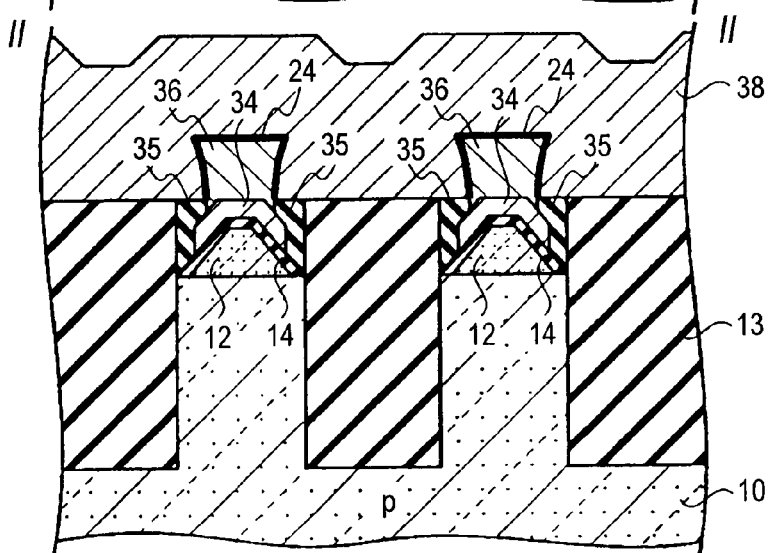
Figure 40C:
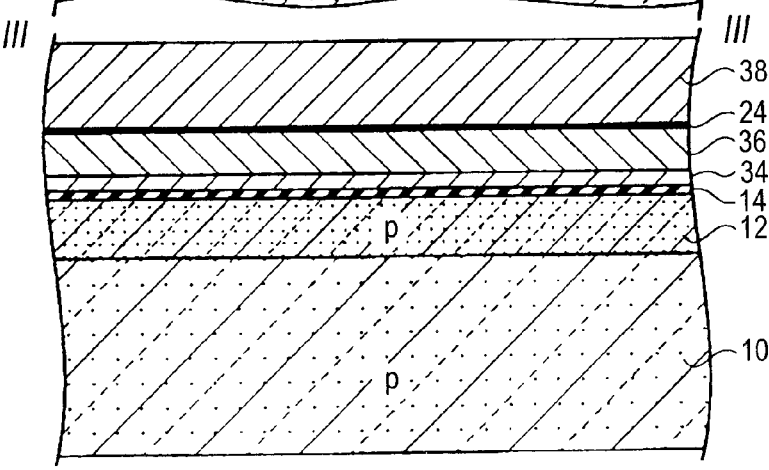

(l) Next, the device isolation regions 13 and the side wall insulating films 35 are etched to any desired height in a chemical solution such as a dilute hydrofluoric acid, as shown in FIGS. 40A to 40C.

(m) Further, an insulating film such as an ONO film 24 is deposited, and then a control gate amorphous silicon electrode layer (CG) 38 containing amorphous silicon doped with P is deposited as shown in FIGS. 40A to 40C.

As with FIGS. 25A to 25C, after the control gate amorphous silicon electrode layer (CG) 38 is deposited, a metal silicide film 42 and a nitrogen film 44 may be deposited in this order. For example, a tungsten silicide, a nickel silicide, or a cobalt silicide can be applied as material of the metal silicide film 42.

Figure 41B:
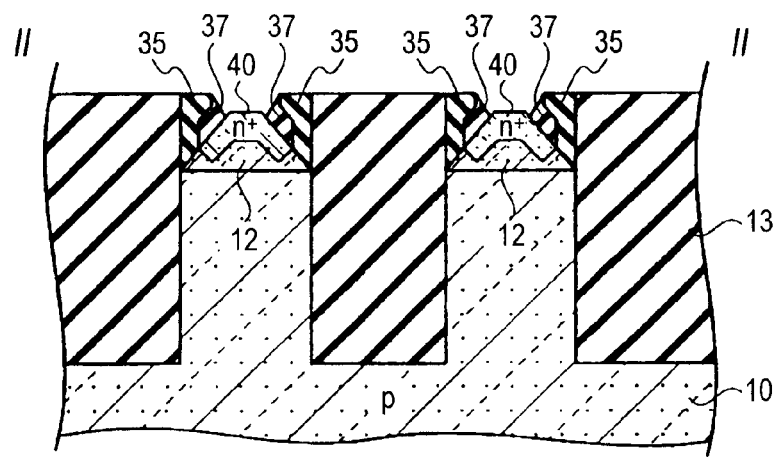
Figure 41C:
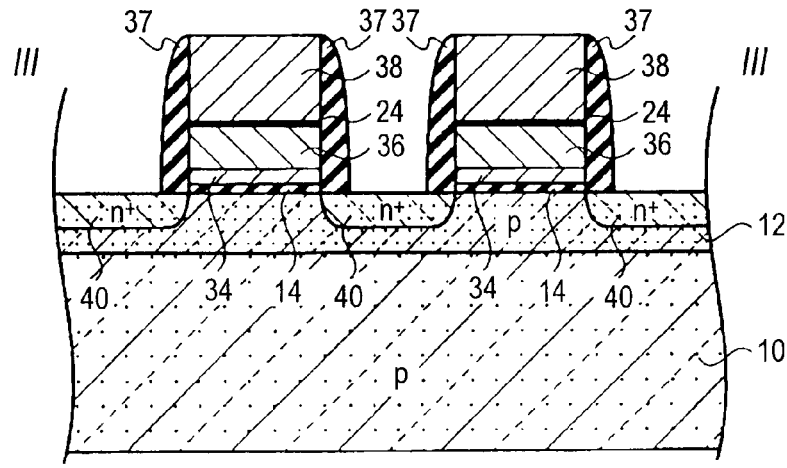

(n) Next, a gate electrode resist pattern is formed using photolithography, and the control gate amorphous silicon electrode layer (CG) 38 and the floating gate amorphous silicon electrode layer (FG) 36 are etched and removed with the resist pattern as a mask to form a gate pattern, as shown in FIGS. 41A to 41C.

(o) Further, the side walls of gate electrode polysilicon are oxidized by thermal oxidation, and source/drain diffusion layers 40 are formed by ion implantation of As, as shown in FIGS. 41A to 41C.

(p) Further, side wall insulating films 37 are formed on the side walls of the gate electrode polysilicon as shown in FIGS. 41A to 41C.

Then, a similar process to a usual nonvolatile semiconductor memory device manufacturing method is. Accordingly, there is formed a nonvolatile semiconductor memory device including: the convex-shaped selective epitaxial layer 12; and the convex-shaped floating gate amorphous silicon electrode layer (FG) 36.

MODIFIED EXAMPLE 1

Figure 43A:
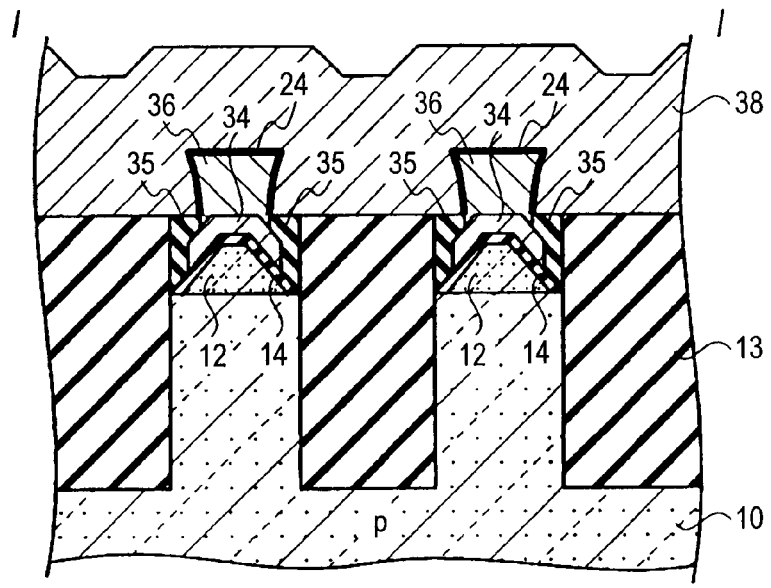
FIGS. 43A to 43C show a process of the manufacturing method of the nonvolatile semiconductor memory device according to modified example 1 of the fifth embodiment of the invention.

FIG. 43A shows a structure of a floating gate FG having an inverted Y shape in a nonvolatile semiconductor memory device according to modified example 1 of the fifth embodiment.

(Manufacturing Method)

A manufacturing method of the nonvolatile semiconductor memory device according to modified example 1 of the fifth embodiment of the invention will be described with reference to FIGS. 42A to 42C and 43A to 43C.

Figure 42A:
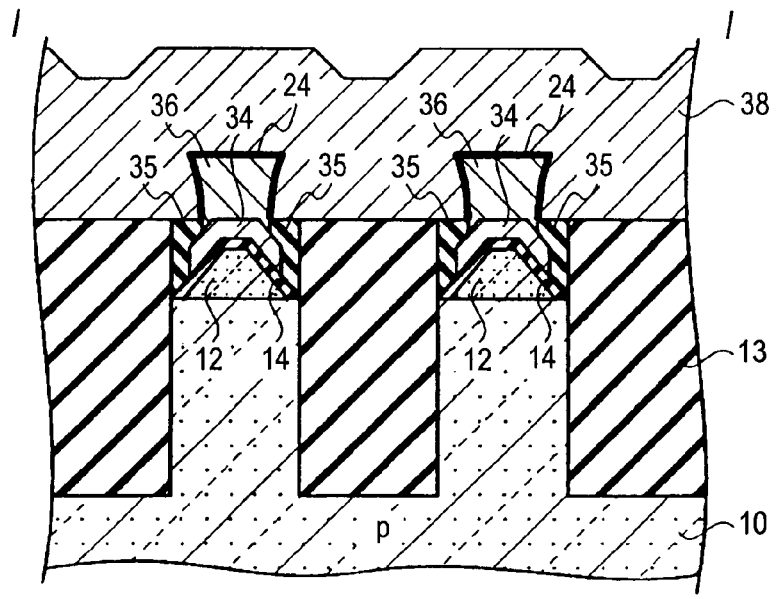
FIGS. 42A to 42C show a process of a manufacturing method of a nonvolatile semiconductor memory device according to modified example 1 of the fifth embodiment of the invention.
Figure 42B:
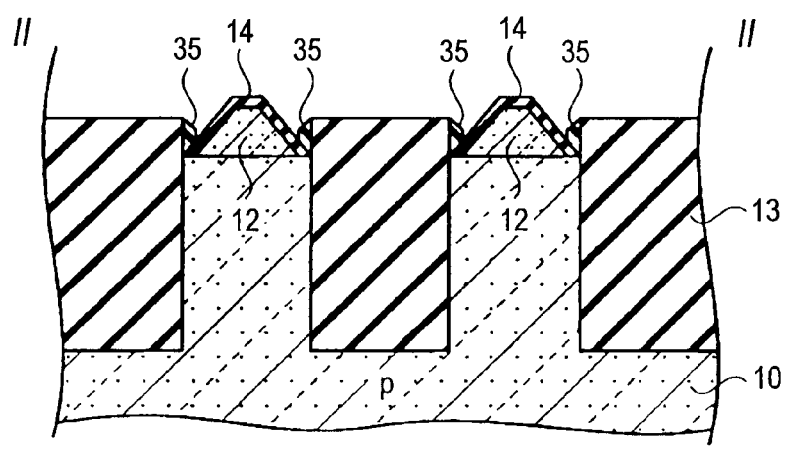

FIGS. 42A and 43A show the schematic sectional structure taken on line I-I in FIG. 3; FIGS. 42B and 43B show the schematic sectional structure taken on line II-II in FIG. 3; and FIGS. 42C and 43C show the schematic sectional structure taken on line III-III in FIG. 3.

A part of processes of the nonvolatile semiconductor memory device according to modified example 1 are similar to those of the manufacturing process of the nonvolatile semiconductor memory device according to the fifth embodiment previously described with reference to FIGS. 37A to 40C and therefore will not be described again. That is, the processes for working on a gate electrode are similar to those of the manufacturing process of the nonvolatile semiconductor memory device according to the fifth embodiment.

Figure 42C:
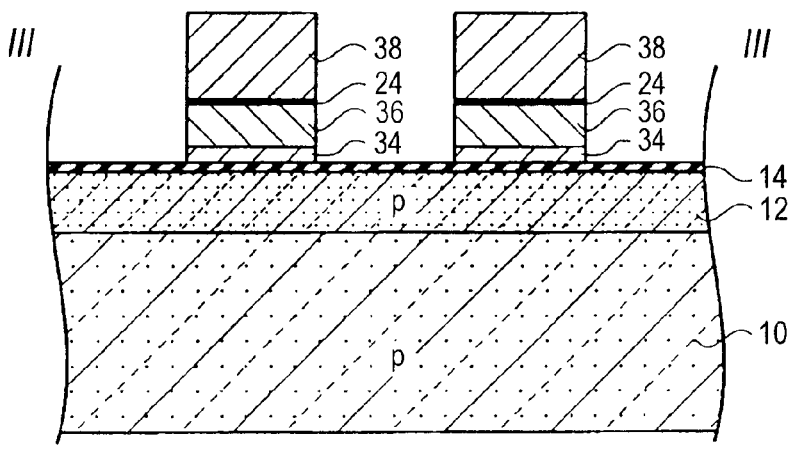
Figure 43B:
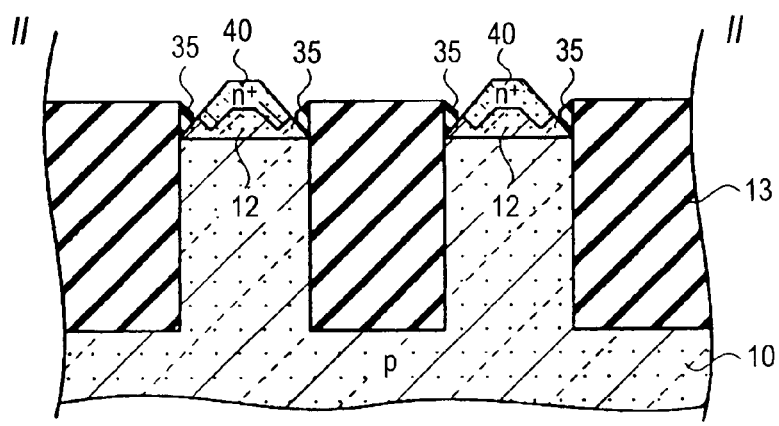

(a) After the gate electrodes is worked on, the oxide film portions of device isolation regions 13 not covered with a control gate amorphous silicon electrode layer (CG) 38 are etched back to any desired depth by reactive ion etching (RIE), as shown in FIGS. 42A to 42C. In this time, a mask by lithography may be applied to avoid etching the periphery portion. In this case, a resist film is removed after the RIE.

Figure 43C:
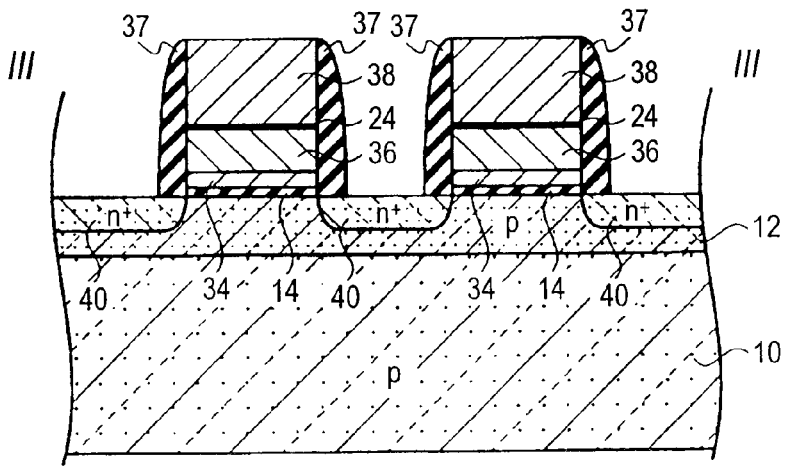

(b) Next, the side walls of gate electrode polysilicon are oxidized by thermal oxidation, and source/drain diffusion layers 40 are formed by ion implantation of As, as shown in FIGS. 43A to 43C.

(c) Further, side wall insulating films 37 are formed on the side walls of the gate electrode polysilicon as shown in FIGS. 43A to 43C. The side wall insulating film 37 is a spacer film and contains a nitrogen film, for example.

Then, a similar process to a usual nonvolatile semiconductor memory device manufacturing method is executed. Accordingly, there is formed a nonvolatile semiconductor memory device including: the convex-shaped selective epitaxial layer 12; and the convex-shaped floating gate amorphous silicon electrode layer (FG) 36.

MODIFIED EXAMPLE 2

Figure 44:
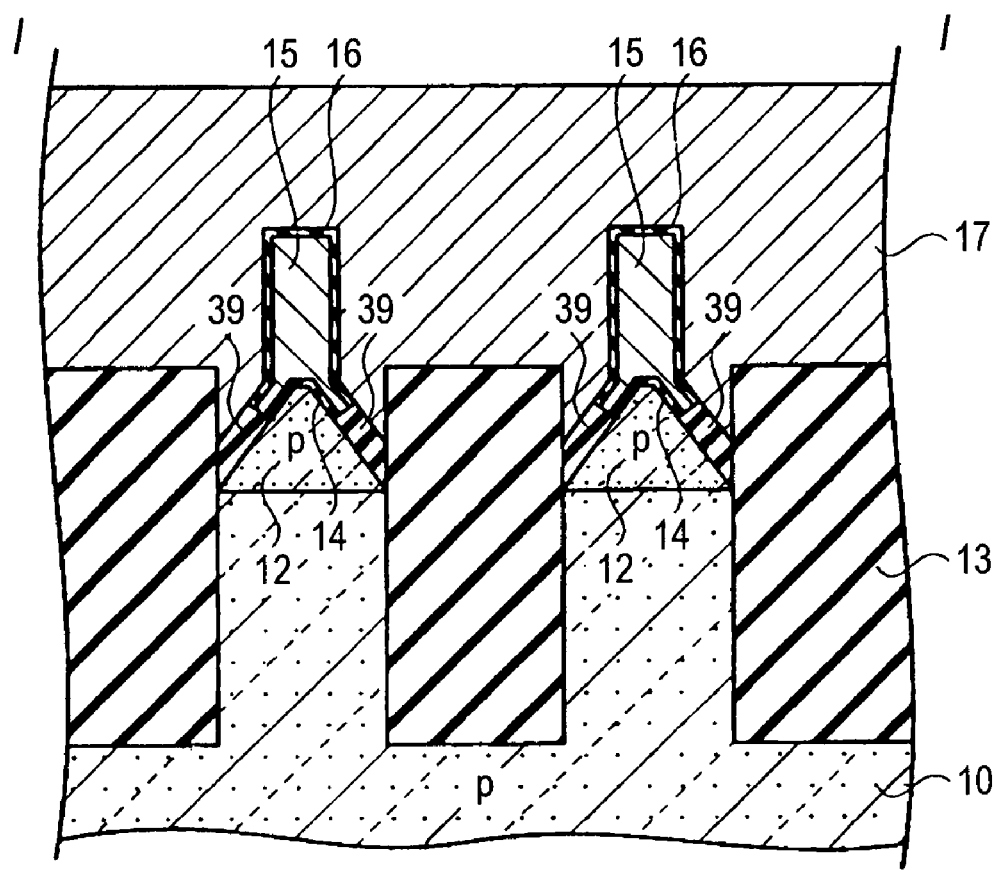
FIG. 44 is a drawing to show the schematic sectional structure of a NAND-type memory cell array section taken on line I-I in FIG. 3, of a nonvolatile semiconductor memory device according to modified example 2 of the fifth embodiment of the invention.

FIG. 44 shows a schematic sectional structure of a NAND-type memory cell array section taken on line I-I in FIG. 3, of a nonvolatile semiconductor memory device according to modified example 2 of the fifth embodiment. The nonvolatile semiconductor memory device includes: a semiconductor region 10; device isolation regions 13 placed in the semiconductor region 10 and extending in the column direction; a selective epitaxial layer 12 placed between the device isolation regions 13, placed on the semiconductor region 10, and having a trapezoidal shape in cross section along the row direction; source/drain regions (not shown) placed in the selective epitaxial layer 12; a gate insulating film 14 placed between the device isolation regions 13 and placed on the upper base of the selective epitaxial layer 12 between the source/drain regions and also placed on the side walls in the vicinity of the upper base; a floating gate polysilicon electrode layer (FG) 15 placed between the device isolation regions 13, placed on the gate insulating film 14, and having a convex inverted Y shape in cross section along the row direction; an intergate insulating film 16 placed between the device isolation regions 13 when viewed from an upper surface of the memory cell array, and placed on the surface of the floating gate polysilicon electrode layer (FG) 15 having the convex inverted Y shape; and a control gate polysilicon electrode layer (CG) 17 placed on the upper surfaces of the device isolation regions 13 and the intergate insulating film 16, and extending in the row direction. Side wall insulating films 39 interposed between the device isolation regions 13 may be placed on the side walls in the vicinity of the lower base of the trapezoidal selective epitaxial layer 12 placed between the device isolation regions 13.

The semiconductor region 10 may be a semiconductor substrate or may be a well region formed in a semiconductor substrate. The source/drain regions are placed in the selective epitaxial layer 12 interposed between the word lines when viewed from an upper surface of the memory cell array, although the source/drain regions are not shown in FIG. 44.

For example, after the floating gate polysilicon electrode layer (FG) 15 is formed, selective epitaxial growth process of semiconductor layer is again performed to form the upper portion of the floating gate polysilicon electrode layer (FG) 15 to have the convex shape. Then, the intergate insulating film 16 is formed and the control gate polysilicon electrode layer (CG) 17 is formed, whereby the memory cell structure shown in FIG. 44 is formed. Accordingly, it is possible to increase the capacitance between the FG and the CG, and the coupling ratio can be increased, thus improving the controllability of the control gate polysilicon electrode layer (CG) 17.

MODIFIED EXAMPLE 3

Figure 45:
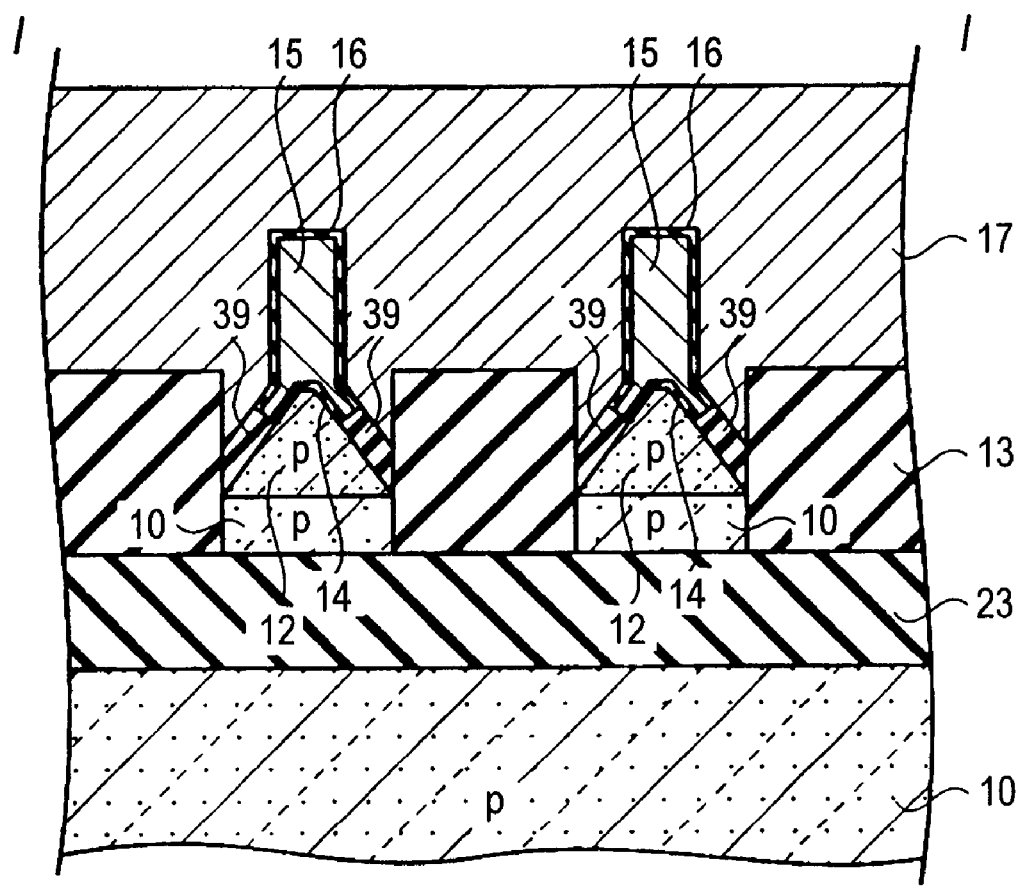
FIG. 45 is a drawing to show the schematic sectional structure of a NAND-type memory cell array section taken on line I-I in FIG. 3, of a nonvolatile semiconductor memory device according to modified example 3 of the fifth embodiment of the invention.

FIG. 45 shows a schematic sectional structure of a NAND-type memory cell array section taken on line I-I in FIG. 3, of a nonvolatile semiconductor memory device according to modified example 3 of the fifth embodiment. The nonvolatile semiconductor memory device includes: a semiconductor region 10; a buried oxide 23 placed in the semiconductor region 10; device isolation regions 13 placed in the semiconductor region 10 that is positioned on the buried oxide 23, and extending in the column direction; a selective epitaxial layer 12 placed between the device isolation regions 13, placed on the semiconductor region 10, and having a trapezoidal shape in cross section along the row direction, source/drain regions (not shown) placed in the selective epitaxial layer 12; a gate insulating film 14 placed between the device isolation regions 13 and placed on the upper base of the selective epitaxial layer 12 between the source/drain regions and also placed on the side walls in the vicinity of the upper base; a floating gate polysilicon electrode layer (FG) 15 placed between the device isolation regions 13, placed on the gate insulating film 14, and having a convex inverted Y shape in cross section along the row direction; an intergate insulating film 16 placed between the device isolation regions 13 when viewed from an upper surface of the memory cell array, and placed on the surface of the floating gate polysilicon electrode layer (FG) 15 having the convex inverted Y shape; and a control gate polysilicon electrode layer (CG) 17 placed on the upper surfaces of the device isolation regions 13 and the intergate insulating film 16, and extending in the row direction. Side wall insulating films 39 interposed between the device isolation regions 13 may be placed on the side walls in the vicinity of the lower base of the trapezoidal selective epitaxial layer 12 placed between the device isolation regions 13. The semiconductor region 10 may be a semiconductor substrate or may be a well region formed in a semiconductor substrate. The source/drain regions are placed in the selective epitaxial layer 12 interposed between the word lines when viewed from an upper surface of the memory cell array, although the source/drain regions are not shown in FIG. 45.

For example, after the floating gate polysilicon electrode layer (FG) 15 is formed, selective epitaxial growth process of semiconductor layer is again performed to form the upper portion of the floating gate polysilicon electrode layer (FG) 15 to have the convex shape. Then, the intergate insulating film 16 is formed and the control gate polysilicon electrode layer (CG) 17 is formed, whereby the memory cell structure shown in FIG. 45 is formed. Accordingly, it is possible to increase the capacitance between the floating gate (FG) and the control gate (CG), and the coupling ratio can be increased, thus improving the controllability of the control gate polysilicon electrode layer (CG) 17.

MODIFIED EXAMPLE 4

Figure 46:
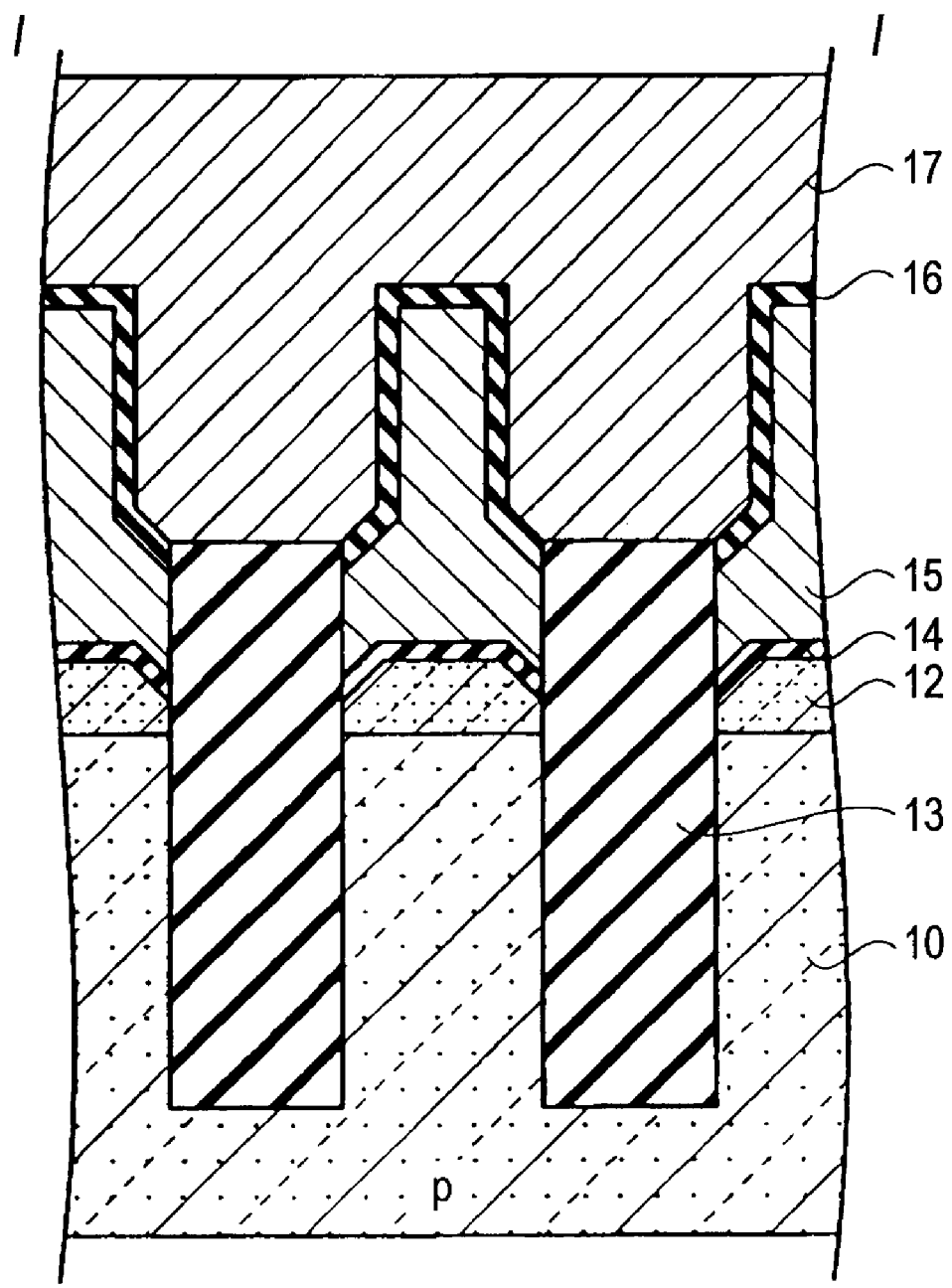
FIG. 46 is a drawing to show the schematic sectional structure of a NAND-type memory cell array section taken on line I-I in FIG. 3, of a nonvolatile semiconductor memory device according to modified example 4 of the fifth embodiment of the invention.

FIG. 46 shows a schematic sectional structure of a NAND-type memory cell array section taken on line I-I in FIG. 3, of a nonvolatile semiconductor memory device according to modified example 4 of the fifth embodiment. The nonvolatile semiconductor memory device includes: a semiconductor region 10; device isolation regions 13 placed in the semiconductor region 10 and extending in the column direction; a selective epitaxial layer 12 placed between the device isolation regions 13, placed on the semiconductor region 10, and having a trapezoidal shape in cross section along the row direction; source/drain regions (not shown) placed in the selective epitaxial layer 12; a gate insulating film 14 placed between the device isolation regions 13 and placed on the selective epitaxial layer 12 between the source/drain regions; a floating gate polysilicon electrode layer (FG) 15 placed between the device isolation regions 13, placed on the gate insulating film 14, and having a convex inverted Y shape in cross section along the row direction; an intergate insulating film 16 placed between the device isolation regions 13 when viewed from an upper surface of the memory cell array, and placed on the surface of the floating gate polysilicon electrode layer (FG) 15 having the convex inverted Y shape; and a control gate polysilicon electrode layer (CG) 17 placed on the upper surfaces of the device isolation regions 13 and the intergate insulating film 16, and extending in the row direction.

The semiconductor region 10 may be a semiconductor substrate or may be a well region formed in a semiconductor substrate. The source/drain regions are placed in the selective epitaxial layer 12 interposed between the word lines when viewed from an upper surface of the memory cell array, although the source/drain regions are not shown in shown in FIG. 46.

For example, after the floating gate polysilicon electrode layer (FG) 15 is formed, selective epitaxial growth process of semiconductor layer is again performed to form the upper portion of the floating gate polysilicon electrode layer (FG) 15 to have the convex shape. Then, the intergate insulating film 16 is formed and the control gate polysilicon electrode layer (CG) 17 is formed, whereby the memory cell structure shown in FIG. 46 is formed. Accordingly, it is possible to increase the capacitance between the FG and the CG, and the coupling ratio can be increased, thus improving the controllability of the control gate polysilicon electrode layer (CG) 17.

MODIFIED EXAMPLE 5

Figure 47:
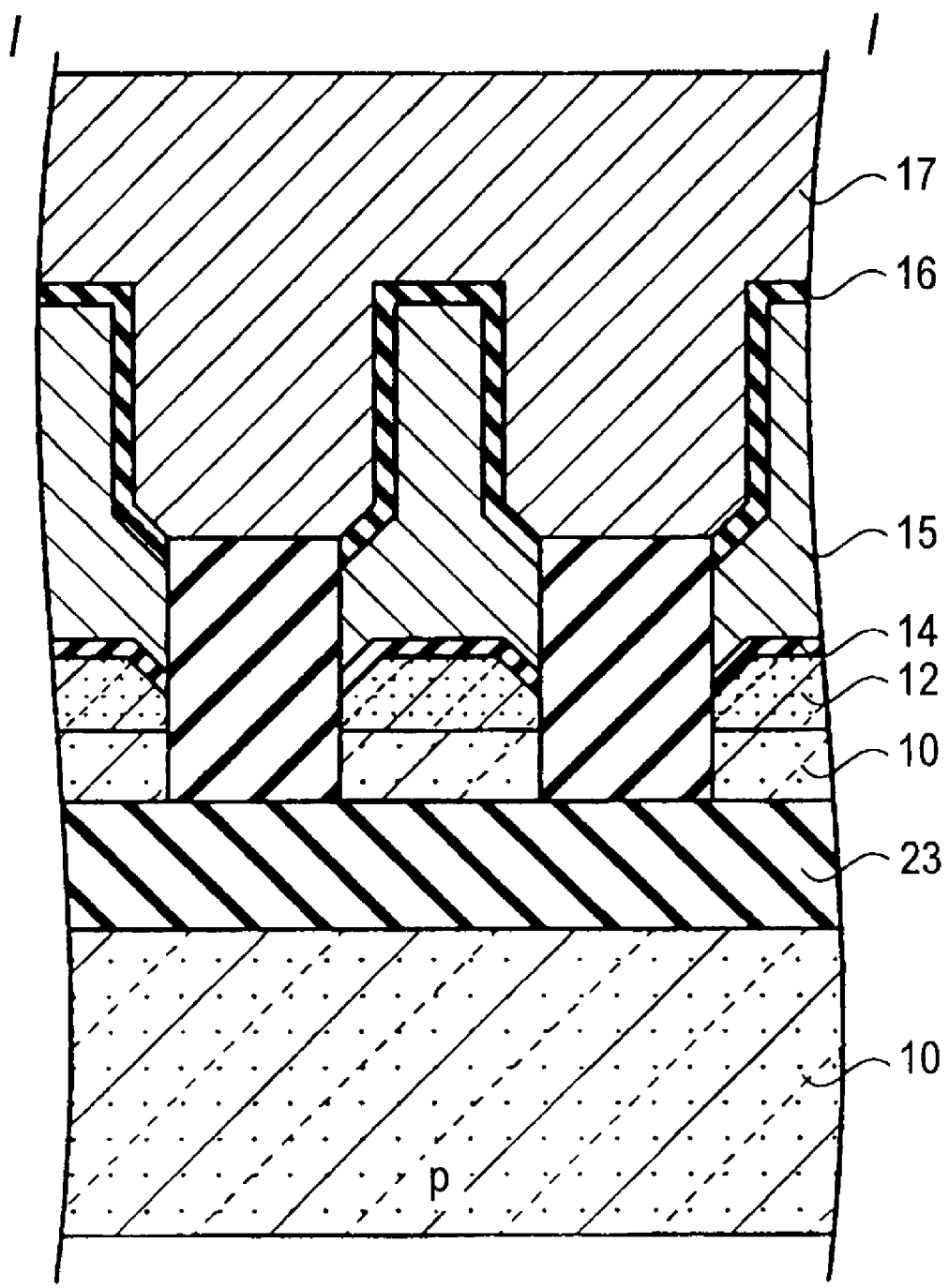
FIG. 47 is a drawing to show the schematic sectional structure of a NAND-type memory cell array section taken on line I-I in FIG. 3, of a nonvolatile semiconductor memory device according to modified example 5 of the fifth embodiment of the invention.

FIG. 47 shows schematic sectional structure of a NAND-type memory cell array section taken on line I-I in FIG. 3, of a nonvolatile semiconductor memory device according to modified example 5 of the fifth embodiment. The nonvolatile semiconductor memory device includes: a semiconductor region 10; a buried oxide 23 buried in the semiconductor region 10; device isolation regions 13 placed in the semiconductor region 10 that is positioned on the buried oxide 23, and extending in the column direction; a selective epitaxial layer 12 placed between the device isolation regions 13, placed on the semiconductor region 10, and having an upper portion of a trapezoidal shape in cross section along the row direction, source/drain regions (not shown) placed in the selective epitaxial layer 12; a gate insulating film 14 placed between the device isolation regions 13 and uniformly placed on the trapezoidal selective epitaxial layer 12 between the source/drain regions; a floating gate polysilicon electrode layer (FG) 15 placed between the device isolation regions 13, placed on the gate insulating film 14, and having a convex inverted Y shape in cross section along the row direction; an intergate insulating film 16 placed between the device isolation regions 13 when viewed from an upper surface of the memory cell array, and placed on the surface of the floating gate polysilicon electrode layer (FG) 15 having the convex inverted Y shape; and a control gate polysilicon electrode layer (CG) 17 placed on the upper surfaces of the device isolation regions 13 and the intergate insulating film 16, and extending in the row direction.

The semiconductor region 10 may be a semiconductor substrate or may be a well region formed in a semiconductor substrate. The source/drain regions are placed in the selective epitaxial layer 12 interposed between the word lines when viewed from an upper surface of the memory cell array, although the source/drain regions are not shown in FIG. 47.

For example, after the floating gate polysilicon electrode layer (FG) 15 is formed, selective epitaxial growth process of semiconductor layer is again performed to form the upper portion of the floating gate polysilicon electrode layer (FG) 15 to have the convex shape. Then, the intergate insulating film 16 is formed and the control gate polysilicon electrode layer (CG) 17 is formed, whereby the memory cell structure shown in FIG. 47 is formed. Accordingly, it is possible to increase the capacitance between the FG and the CG, and the coupling ratio can be increased, thus improving the controllability of the control gate polysilicon electrode layer (CG) 17.

MODIFIED EXAMPLE 6

Figure 48:
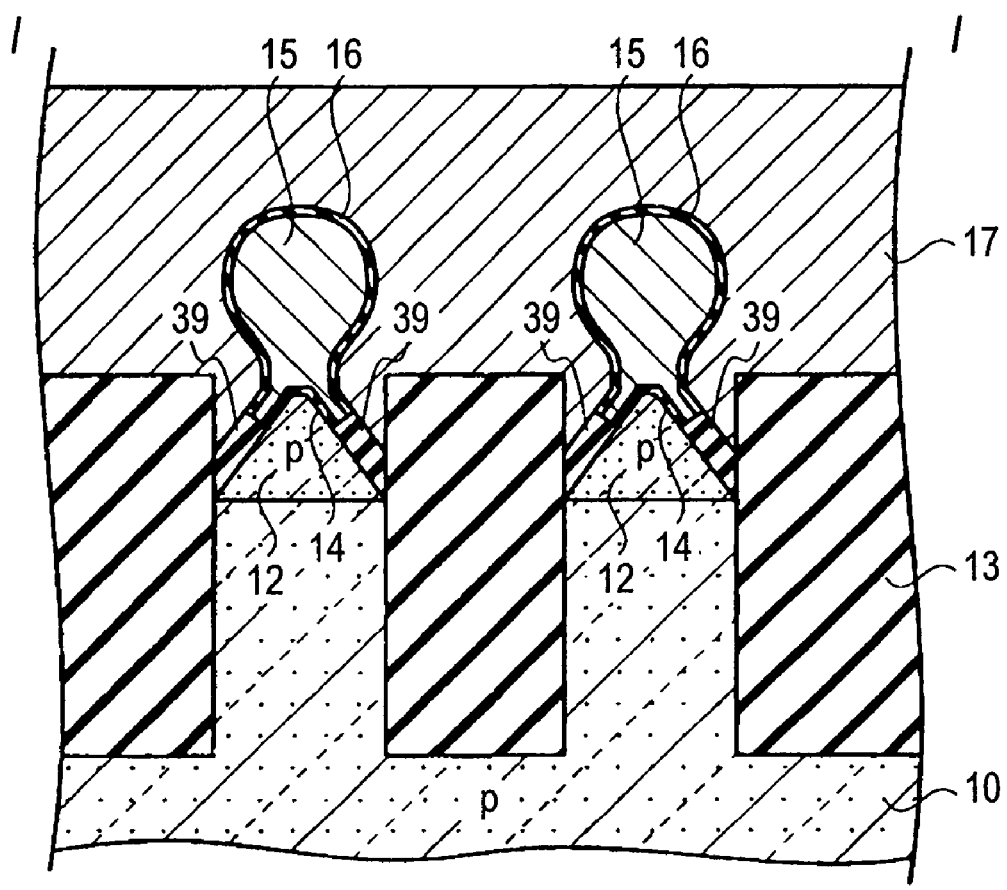
FIG. 48 is a drawing to show the schematic sectional structure of a NAND-type memory cell array section taken on line I-I in FIG. 3, of a nonvolatile semiconductor memory device according to modified example 6 of the fifth embodiment of the invention.

FIG. 48 shows a schematic sectional structure of a NAND-type memory cell array section taken on line I-I in FIG. 3, of a nonvolatile semiconductor memory device according to modified example 6 of the fifth embodiment. The nonvolatile semiconductor memory device includes: a semiconductor region 10; device isolation regions 13 placed in the semiconductor region 10 and extending in the column direction; a selective epitaxial layer 12 placed between the device isolation regions 13, placed on the semiconductor region 10, and having a trapezoidal shape in cross section along the row direction; source/drain regions (not shown) placed in the selective epitaxial layer 12; a gate insulating film 14 placed between the device isolation regions 13, placed on the upper base of the trapezoidal selective epitaxial layer 12 between the source/drain regions, and also place on the side walls in the proximity of the upper base; a floating gate polysilicon electrode layer (FG) 15 placed between the device isolation regions 13, placed on the gate insulating film 14, and having a convex circular and inverted Y shape in cross section along the row direction; an intergate insulating film 16 placed between the device isolation regions 13 when viewed from an upper surface of the memory cell array, and placed on the surface of the floating gate polysilicon electrode layer (FG) 15 having the convex circular and inverted Y shape; and a control gate polysilicon electrode layer (CG) 17 placed on the upper surfaces of the device isolation regions 13 and the intergate insulating film 16, and extending in the row direction. Side wall insulating films 39 interposed between the device isolation regions 13 may be placed on the side walls in the vicinity of the lower base of the trapezoidal selective epitaxial layer 12 placed between the device isolation regions 13. The semiconductor region 10 may be a semiconductor substrate or may be a well region formed in a semiconductor substrate. The source/drain regions are placed in the selective epitaxial layer 12 interposed between the word lines when viewed from an upper surface of the memory cell array, although the source/drain regions are not shown in FIG. 48.

For example, after the floating gate polysilicon electrode layer (FG) 15 is formed, selective epitaxial growth process of semiconductor layer is again performed and RIE and/or wet etching is performed, whereby it is possible to form the floating gate polysilicon electrode layer (FG) 15 having the convex circular shape. Then, the intergate insulating film 16 is formed and the control gate polysilicon electrode layer (CG) 17 is formed, whereby the memory cell structure shown in FIG. 48 is formed. Accordingly, it is possible to increase the capacitance between the FG and the CG, and the coupling ratio can be increased, thereby improving the controllability of the control gate polysilicon electrode layer (CG) 17.

MODIFIED EXAMPLE 7

Figure 49:
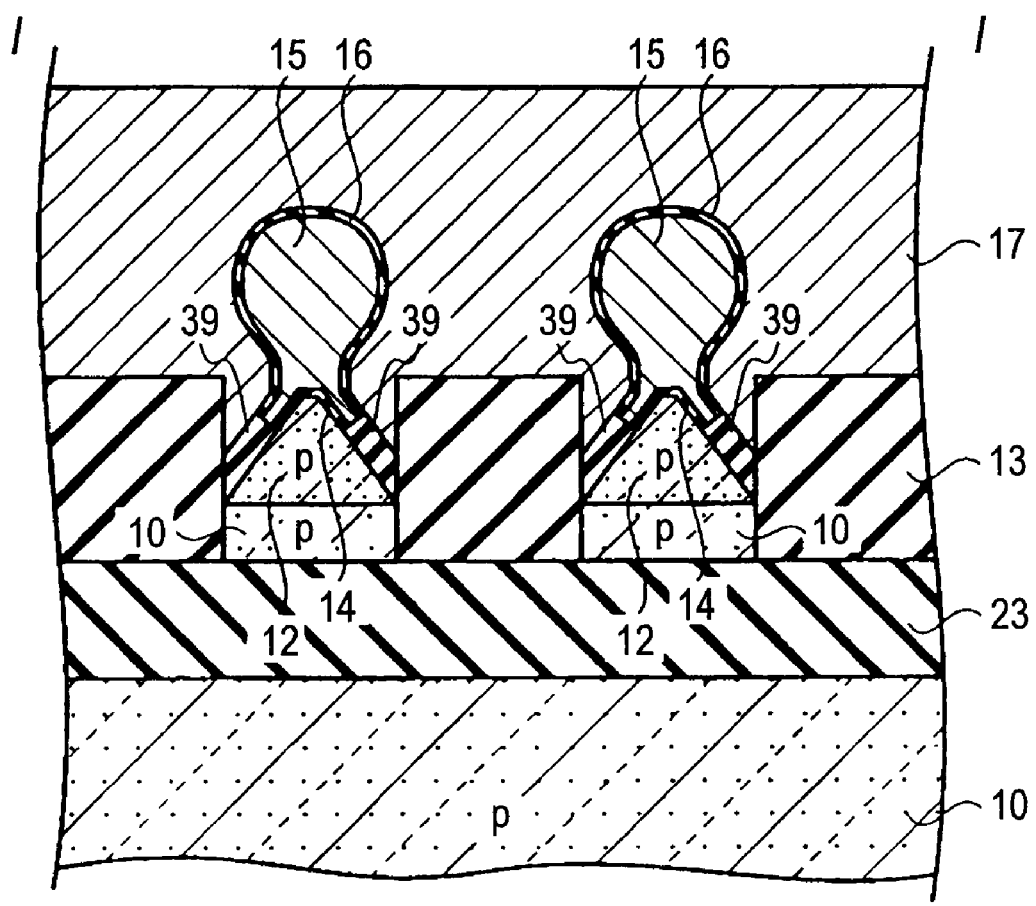
FIG. 49 is a drawing to show the schematic sectional structure of a NAND-type memory cell array section taken on line I-I in FIG. 3, of a nonvolatile semiconductor memory device according to modified example 7 of the fifth embodiment of the invention.

FIG. 49 shows a schematic sectional structure of a NAND-type memory cell array section taken on line I-I in FIG. 3, of a nonvolatile semiconductor memory device according to modified example 7 of the fifth embodiment. The nonvolatile semiconductor memory device includes: a semiconductor region 10; a buried oxide 23 placed in the semiconductor region 10; device isolation regions 13 placed in the semiconductor region 10 that is positioned on the buried oxide 23, and extending in the column direction; a selective epitaxial layer 12 placed between the device isolation regions 13, placed on the semiconductor region 10, and having a trapezoidal shape in cross section along the row direction; source/drain regions (not shown) placed in the selective epitaxial layer 12; a gate insulating film 14 placed between the device isolation regions 13, placed on the upper base of the trapezoidal selective epitaxial layer 12 between the source/drain regions, and also placed on the side walls in the vicinity of the upper base; a floating gate polysilicon electrode layer (FG) 15 placed between the device isolation regions 13, placed on the gate insulating film 14, and having a convex circular and inverted Y shape in cross section along the row direction; an intergate insulating film 16 placed between the device isolation regions 13 when viewed from an upper surface of the memory cell array, and placed on the surface of the floating gate polysilicon electrode layer (FG) 15 having the convex circular and inverted Y shape; and a control gate polysilicon electrode layer (CG) 17 placed on the upper surfaces of the device isolation regions 13 and the intergate insulating film 16 and extending in the row direction. Side wall insulating films 39 interposed between the device isolation regions 13 may be placed on the side walls in the vicinity of the lower base of the trapezoidal selective epitaxial layer 12 placed between the device isolation regions 13. The semiconductor region 10 may be a semiconductor substrate or may be a well region formed in a semiconductor substrate. The source/drain regions are placed in the selective epitaxial layer 12 interposed between the word lines when viewed from an upper surface of the memory cell array, although the source/drain regions are not shown in FIG. 49.

For example, after the floating gate polysilicon electrode layer (FG) 15 is formed, selective epitaxial growth process of semiconductor layer is again performed and RIE and/or wet etching is performed, whereby it is possible to form the floating gate polysilicon electrode layer (FG) 15 having the convex circular shape. Then, the intergate insulating film 16 is formed and the control gate polysilicon electrode layer (CG) 17 is formed, whereby the memory cell structure shown in FIG. 49 is formed. Accordingly, it is possible to increase the capacitance between the FG and the CG, and the coupling ratio can be increased, thereby improving the controllability of the control gate polysilicon electrode layer (CG) 17.

According to the nonvolatile semiconductor memory device and the manufacturing method of the nonvolatile semiconductor memory device according to the fifth embodiment of the invention, since the upper portion of the active region is formed to have a convex shape in cross section, the electric field at the corner (vertex) strengthens, thus increasing the current density. Therefore, the depletion layer width in the convex channel vicinity widens, thereby improving the sub-threshold factor. Further, the back gate effect decreases, thereby providing an excellent short channel characteristic. Since the upper portion of the active region is formed to have the convex shape, the coupling ratio is improved, and the electric field during the writing operation strengthens. Therefore, the writing efficiency improves. Further, the electric field during data retention tends to disperse, so that the electrons injected into the floating gate electrode layer become hard to tunnel and an excellent retention characteristic is provided.

Further, in the nonvolatile semiconductor memory device according to the fifth embodiment of the invention, the cross section along the row direction has a convex inverted Y shape at the upper portion of the floating gate polysilicon electrode layer (FG) 15, so that it is possible to increase the capacitance between the CG and the FG, and the coupling ratio can be increased. It is possible to apply a large voltage to the floating gate polysilicon electrode layer (FG) 15 by a capacitance division of the voltage applied to the control gate polysilicon electrode layer (CG) 17. Accordingly, it is possible to further improve the controllability of the control gate polysilicon electrode layer (CG) 17 over the floating gate polysilicon electrode layer (FG) 15.

Sixth Embodiment (AND-Type Circuit Configuration)

Figure 50:
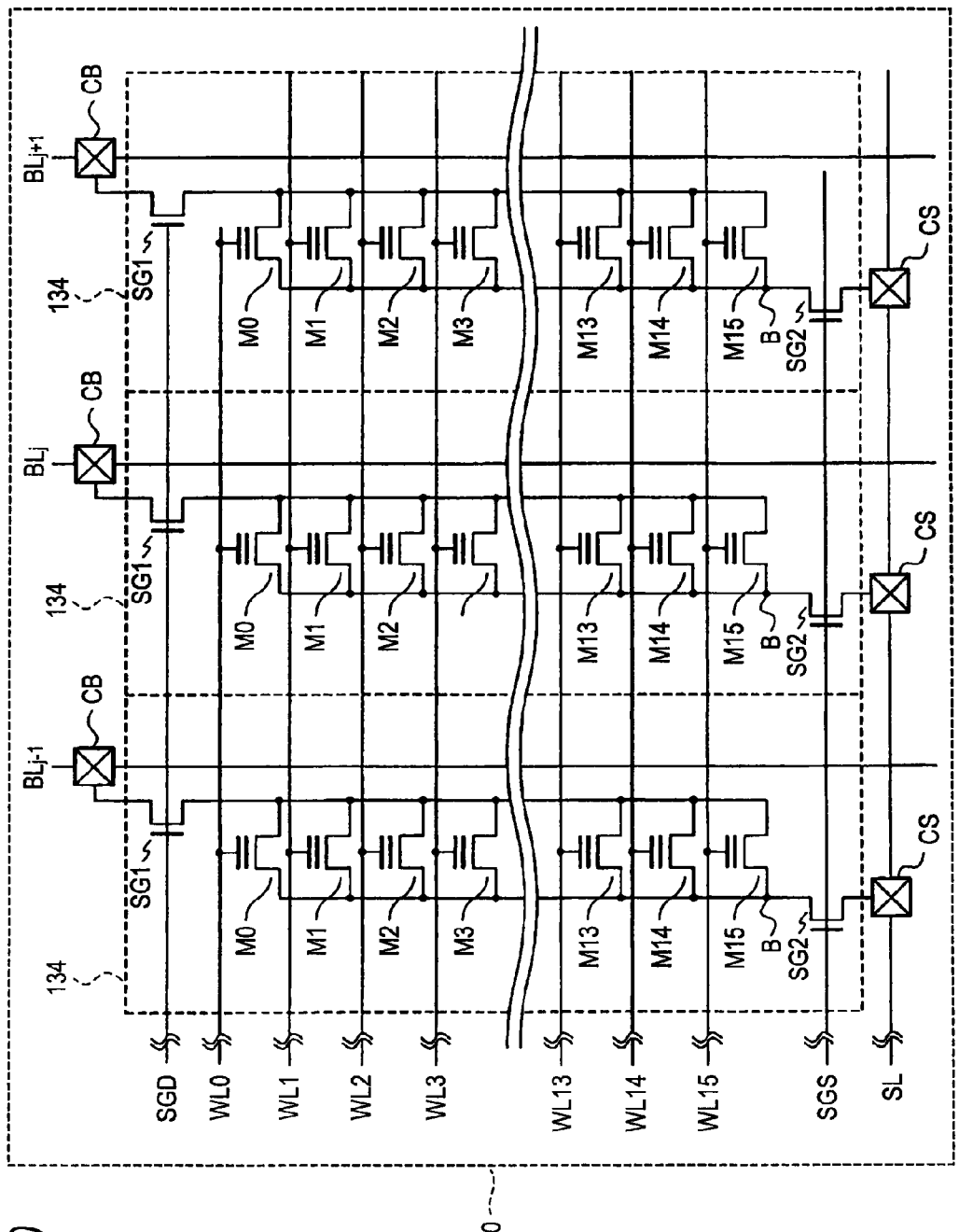
FIG. 50 is a drawing to show the schematic circuit configuration of an AND-type memory cell array of a nonvolatile semiconductor memory device according to a sixth embodiment of the invention.

FIG. 50 shows a schematic circuit configuration of a memory cell array 130 of a nonvolatile semiconductor memory device according to a sixth embodiment. The nonvolatile semiconductor memory device includes the circuit configuration of an AND-type memory cell array.

In FIG. 50, an AND cell unit is indicated by 134 surrounded by a dotted line. The AND cell unit 134 includes: memory cell transistors M0 to M15 connected in parallel; and selection gate transistors SG1 and SG2 as shown in FIG. 50. The selection gate transistor SG1 has a drain connected to bit line $BL_{j-1}$, $BL_j$, $BL_{j+1}$ ... through a bit line contact CB, and the selection gate transistor SG2 has a source connected to a common source line SL through a source line contract CS.

In the AND cell unit 134, the drain regions of the memory cell transistors M0 to M15 are connected in common and the source regions are connected in common. That is, in the AND cell unit 134 of an AND-type flash memory, the memory cell transistors M0 to M15 are connected in parallel. The bit line selection transistor SG1 is connected to one of the common connections, and the source line selection transistor SG2 is connected to the other of the common connections, as shown in FIG. 50. Word lines WL0 to WL15 are connected to the gates of the memory cell transistors M0 to M15 in a one-to-one correspondence with each other. A selection gate line SGD is connected to the gate of the bit line selection transistor SG1. A selection gate line SGS is connected to the gate of the source line selection transistor SG2.

In the nonvolatile semiconductor memory device of the AND-type configuration according to the sixth embodiment of the invention, each memory cell transistor also has a stacked gate structure of the first to fifth embodiments as the basic structure. Therefore, a memory cell transistor structure and manufacturing method of the first to fifth embodiments can be applied to the sixth embodiment of the invention.

According to the nonvolatile semiconductor memory device according to the sixth embodiment of the invention, since the upper portion of the active region is formed to have a convex shape in cross section, the electric field at the corner (vertex) strengthens, thus increasing the current density. Therefore, the depletion layer width in the convex channel vicinity widens, thereby improving the sub-threshold factor. Further, the back gate effect decreases, thereby providing an excellent short channel characteristic. Since the upper portion of the active region is formed to have the convex shape, the coupling ratio is improved, and the electric field during the writing operation strengthens. Therefore, the writing efficiency improves. Further, the electric field during data retention tends to disperse, so that the electrons injected into the floating gate electrode layer become hard to tunnel and an AND-type flash memory having an excellent retention characteristic can be provided.

Further, according to the nonvolatile semiconductor memory device according to the sixth embodiment of the invention, the upper portion of the floating gate polysilicon electrode layer (FG) 15 has the structure in the cross section along the row direction having a convex shape, whereby there can be provided an AND-type flash memory capable of: increasing the capacitance between CG and FG; increasing the coupling ratio; applying a large voltage to the floating gate polysilicon electrode layer (FG) 15 by a capacitance division of the voltage applied to the control gate polysilicon electrode layer (CG) 17; and improving the controllability of the control gate polysilicon electrode layer (CG) 17 over the floating gate polysilicon electrode layer (FG) 15.

Seventh Embodiment (NOR-Type Circuit Configuration)

Figure 51:
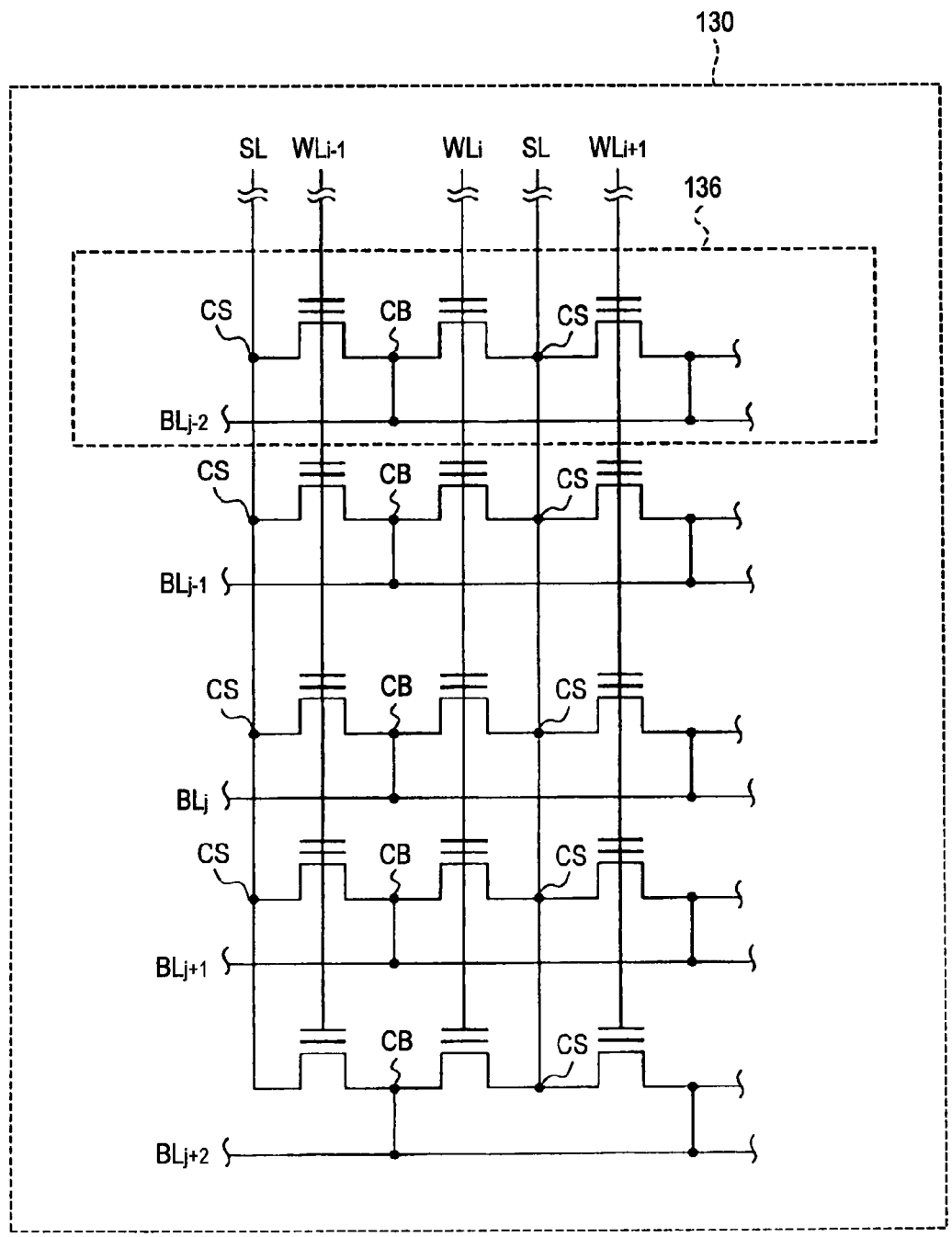
FIG. 51 is a drawing to show the schematic circuit configuration of a NOR-type memory cell array of a nonvolatile semiconductor memory device according to a seventh embodiment of the invention.

FIG. 51 shows a schematic circuit configuration of a memory cell array 130 of a nonvolatile semiconductor memory device according to a seventh embodiment. The Nonvolatile semiconductor memory device includes the circuit configuration of a NOR-type memory cell array.

In FIG. 51, a NOR cell unit 136 is indicated by surrounded by a dotted line. In the NOR cell unit 136, a common source region of two adjacent memory cell transistors is connected to a source line SL through a source line contract CS, and a common drain region is connected to bit line $BL_{j-2}$, $BL_{j-1}$, $BL_j$, $BL_{j+1}$, $BL_{j+2}$ ... through a bit line contact CB. Further, NOR cell units 136 are arranged in a direction of extending the word line $WL_{i-1}$, $WL_i$, $WL_{i+1}$ ... orthogonal to the bit line $BL_{j-2}$, $BL_{j-1}$, $BL_j$, $BL_{j+1}$, $BL_{j+2}$ ..., and gates of memory cell transistors are connected in common among the NOR cell units 136 by the word line $WL_{i-1}$, $WL_i$, $WL_{i+1}$ ... The nonvolatile semiconductor memory device of the NOR-type circuit configuration has a feature that high-speed read can be accomplished as compared with the NAND-type configuration.

In the nonvolatile semiconductor memory device of the NOR-type configuration according to the seventh embodiment of the invention, each memory cell transistor also has a stacked gate structure of the first to fifth embodiments as the basic structure. Therefore, a memory cell transistor structure and manufacturing method of the first to fifth embodiments can be applied to the seventh embodiment of the invention.

According to the nonvolatile semiconductor memory device according to the seventh embodiment of the invention, since the upper portion of the active region is formed to have a convex shape in cross section, the electric field at the corner (vertex) strengthens, thus increasing the current density. Therefore, the depletion layer width in the convex channel vicinity widens, thereby improving the sub-threshold factor. Further, the back gate effect decreases, thereby providing an excellent short channel characteristic. Since the upper portion of the active region is formed to have the convex shape, the coupling ratio is improved, and the electric field during the writing operation strengthens. Therefore, the writing efficiency improves. Further, the electric field during data retention tends to disperse, so that the electrons injected into the floating gate electrode layer become hard to tunnel, and a NOR-type flash memory having an excellent retention characteristic can be provided.

Further, according to the nonvolatile semiconductor memory device according to the seventh embodiment of the invention, the upper portion of the floating gate polysilicon electrode layer (FG) 15 has the structure in the cross section along the row direction having a convex shape, whereby there can be provided a NOR-type flash memory capable of: increasing the capacitance between CG and FG; increasing the coupling ratio; applying a large voltage to the floating gate polysilicon electrode layer (FG) 15 by a capacitance division of the voltage applied to the control gate polysilicon electrode layer (CG) 17; and improving the controllability of the control gate polysilicon electrode layer (CG) 17 over the floating gate polysilicon electrode layer (FG) 15.

Eighth Embodiment (Two Transistors/Cell Type Circuit Configuration)

Figure 52:
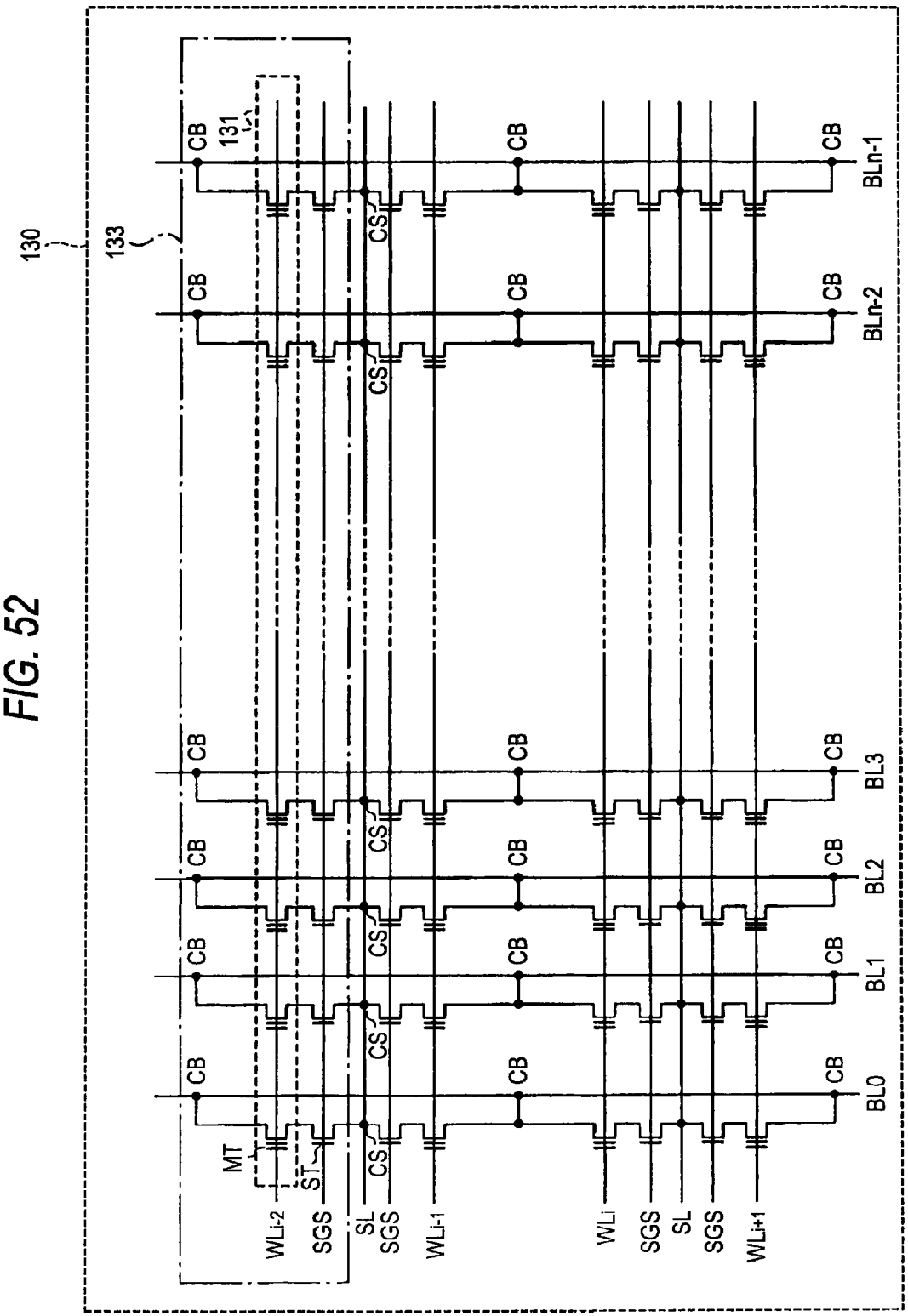
FIG. 52 is a drawing to show the schematic circuit configuration of a two transistors/cell type memory cell array of a nonvolatile semiconductor memory device according to an eighth embodiment of the invention.

FIG. 52 shows a schematic circuit configuration of a memory cell array 130 of a nonvolatile semiconductor memory device according to an eighth embodiment of the invention. The nonvolatile semiconductor memory device includes the circuit configuration of a two transistors/cell type memory cell array.

In an example of the semiconductor memory device according to the eighth embodiment of the invention, the two transistors/cell type structure is adopted as the basic structure, and memory cells of a stacked gate structure are included. The drain region of n-type source and drain regions of each memory cell transistor MT is connected to a bit line contact CB, and the source region of n-type source and drain regions of each memory cell transistor MT is connected to a drain region of a selection transistor ST. The source region of the selection transistor ST is connected to a source line contact CS. Such two transistors/cell type memory cells are placed in parallel in a word line extending direction to form a memory cell block 133 as shown in FIG. 52. In one memory cell block 133, a word line $WL_{i-2}$ is connected to control gate electrode layers of the memory cell transistors in common to form a page unit 131. Pages in blocks may be collected to a single page unit, of course. Further, a selection gate line SGS is connected to gate electrodes of the selection transistors ST in common. On the other hand, circuit structures each including the two transistors/cell type memory cells arranged to be folded back relative to a source line SL are placed in series in the direction in which bit line BL0, BL1, BL2, BLn−1 extends.

In the nonvolatile semiconductor memory device of the two transistors/cell type configuration according to the eighth embodiment of the invention, each memory cell transistor also has a stacked gate structure of the first to fifth embodiments as the basic structure. Therefore, a memory cell transistor structure and manufacturing method of the first to fifth embodiments can be applied to the eighth embodiment of the invention.

According to the nonvolatile semiconductor memory device according to the eighth embodiment of the invention, since the upper portion of the active region is formed to have a convex shape in cross section, the electric field at the corner (vertex) strengthens, thus increasing the current density. Therefore, the depletion layer width in the convex channel vicinity widens, thereby improving the sub-threshold factor. Further, the back gate effect decreases, thereby providing an excellent short channel characteristic. Since the upper portion of the active region is formed to have the convex shape, the coupling ratio is improved, and the electric field during the writing operation strengthens. Therefore, the writing efficiency improves. Further, the electric field during data retention tends to disperse, so that the electrons injected into the floating gate electrode layer become hard to tunnel, and a two transistors/cell type flash memory having an excellent retention characteristic can be provided.

Further, according to the nonvolatile semiconductor memory device according to the eighth embodiment of the invention, the upper portion of the floating gate polysilicon electrode layer (FG) 15 has the structure in the cross section along the row direction having a convex shape, whereby there can be provided a two transistors/cell type flash memory capable of: increasing the capacitance between CG and FG; increasing the coupling ratio; applying a large voltage to the floating gate polysilicon electrode layer (FG) 15 by a capacitance division of the voltage applied to a control gate polysilicon electrode layer (CG) 17; and improving the controllability of the control gate polysilicon electrode layer (CG) 17 over the floating gate polysilicon electrode layer (FG) 15.

Ninth Embodiment (Three Transistors/Cell Type Circuit Configuration)

Figure 53:
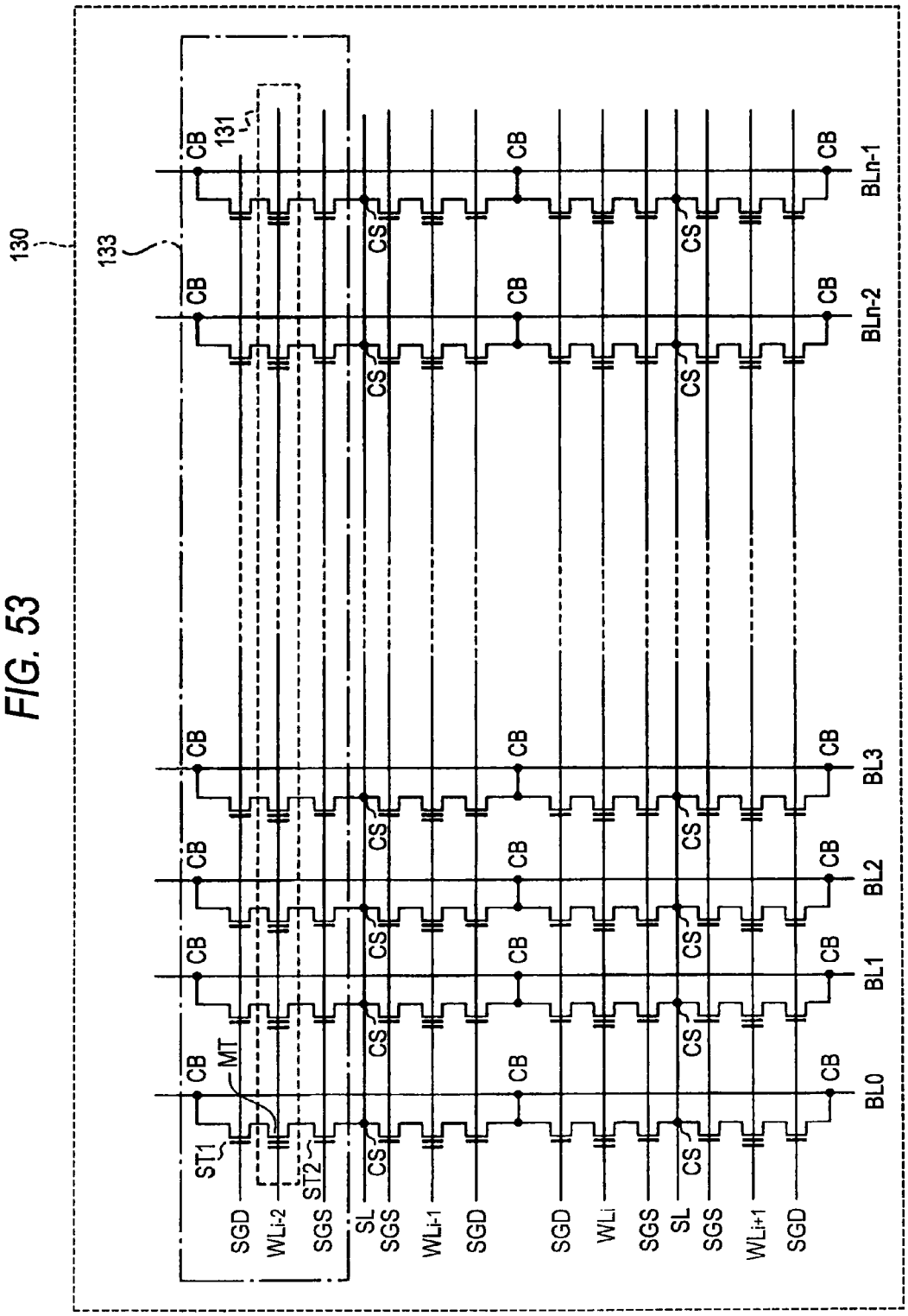
FIG. 53 is a drawing to show the schematic circuit configuration of a three transistors/cell type memory cell array of a nonvolatile semiconductor memory device according to a ninth embodiment of the invention.

FIG. 53 shows a schematic circuit configuration of a memory cell array 130 of a nonvolatile semiconductor memory device according to a ninth embodiment of the invention. The nonvolatile semiconductor memory device includes the circuit configuration of a three transistors/cell type memory cell array.

In an example of the semiconductor memory device according to the ninth embodiment of the invention, the three transistors/cell type structure is adopted as the basic structure, memory cell transistors MT of a stacked gate structure are included, and selection transistors ST1 and ST2 are placed on both sides of each memory cell transistor MT. Each memory cell transistor MT includes: a drain region connected to a bit line contact CB through the bit line selection transistor ST1; and a source region connected to a source line contract CS through the source line selection transistor ST2. Such three transistors/cell type memory cells are placed in parallel in a word line extending direction to form a memory cell block 133 as shown in FIG. 53. In one memory cell block 133, a word line $WL_{i-2}$ is connected to control gate electrode layers of the memory cell transistors MT in common to form a page unit 131. Pages in blocks may be collected to a single page unit. Further, a selection gate line SGS is connected to gate electrodes of the source line selection transistor ST2 in common and a selection gate line SGD is connected to gate electrodes of the bit line selection transistor ST1 in common. On the other hand, circuit structures each including the three transistors/cell type memory cells arranged to be folded back relative to a source line SL are placed in series in the direction in which bit line BL0, BL1, BL2, . . . , BLn−1 extends.

According to the semiconductor memory device according to the ninth embodiment of the invention, intermediate operation between the NAND type and the NOR type can be performed.

In the nonvolatile semiconductor memory device of the three transistors/cell type configuration according to the ninth embodiment of the invention, each memory cell transistor also has a stacked gate structure of the first to fifth embodiments as the basic structure. Therefore, a memory cell transistor structure and manufacturing method of the first to fifth embodiments can be applied to the ninth embodiment of the invention.

According to the nonvolatile semiconductor memory device according to the ninth embodiment of the invention, since the upper portion of the active region is formed to have a convex shape in cross section, the electric field at the corner (vertex) strengthens, thus increasing the current density. Therefore, the depletion layer width in the convex channel vicinity widens, thereby improving the sub-threshold factor. Further, the back gate effect decreases, thereby providing an excellent short channel characteristic. Since the upper portion of the active region is formed to have the convex shape, the coupling ratio is improved, and the electric field during the writing operation strengthens. Therefore, the writing efficiency improves. Further, the electric field during data retention tends to disperse, so that the electrons injected into the floating gate electrode layer become hard to tunnel, and a three transistors/cell type flash memory having an excellent retention characteristic can be provided.

Further, according to the nonvolatile semiconductor memory device according to the ninth embodiment of the invention, the upper portion of the floating gate polysilicon electrode layer (FG) 15 has the structure in the cross section along the row direction having a convex shape, whereby there can be provided a three transistors/cell type flash memory capable of: increasing the capacitance between CG and FG; increasing the coupling ratio; applying a large voltage to the floating gate polysilicon electrode layer (FG) 15 by a capacitance division of the voltage applied to a control gate polysilicon electrode layer (CG) 17; and improving the controllability of the control gate polysilicon electrode layer (CG) 17 over the floating gate polysilicon electrode layer (FG) 15.

APPLICATION EXAMPLE

The operation modes of the nonvolatile semiconductor memory device according to the embodiments of the invention are roughly classified into three modes, called page mode, byte mode, and EEPROM mode having a ROM area.

In the page mode, memory cell rows existing on a word line in the flash memory cell array are read into a sense amplifier through the bit lines at once or writing is executed from the sense amplifier in at once. That is, reading and writing are executed in page units.

In the byte mode, the memory cells existing on a word line in the flash memory cell array are read into the sense amplifier in byte units, or writing is executed from the sense amplifier into the memory cells in byte units. That is, the byte mode differs from the page mode in that read and writing are executed in byte units.

In the EEPROM mode having a ROM area, the flash memory cell array is divided into: a flash memory portion; and an EEPROM portion having a ROM area, the EEPROM portion having the ROM area is switched for operation as a system, and information in the flash memory cell array is read and rewritten in page units or byte units.

The nonvolatile semiconductor memory device according to the first to ninth embodiments described above can be operated according to the page mode, the byte mode, and the EEPROM mode having a ROM area, of course.

Various application examples are possible in the nonvolatile semiconductor memory device according to the first to ninth embodiments of the invention. FIGS. 54 to 68 show some of the application examples.

APPLICATION EXAMPLE 1

Figure 54:
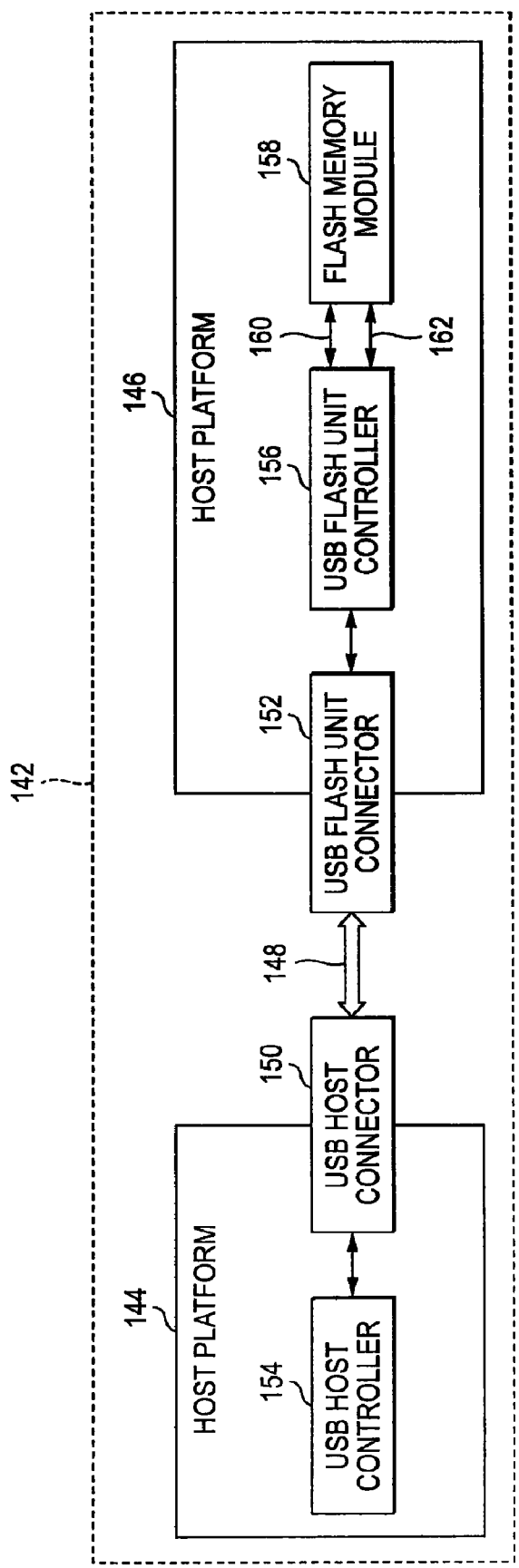
FIG. 54 is a schematic block diagram of a flash memory system including a flash memory unit as one of application examples of the nonvolatile semiconductor memory device according to the first to ninth embodiment of the invention.

FIG. 54 is a schematic block diagram of main components of a flash memory system including a flash memory unit. As shown in FIG. 54, a flash memory system 142 includes a host platform 144 and a universal serial bus (USB) flash unit 146.

The host platform 144 is connected to the USB flash unit 146 through a USB cable 148. The host platform 144 is connected to the USB cable 148 through a USB host connector 150 and the USB flash unit 146 is connected to the USB cable 148 through a USB flash unit connector 152. The host platform 144 has a USB host controller 154 for controlling packet transmission on a USB bus.

The USB flash unit 146 includes a USB flash unit controller 156 for controlling the components of the USB flash unit 146 and controlling the interface of the USB flash unit 146 with the USB bus, the USB flash unit connector 152, and at least one flash memory module 158 implemented as the nonvolatile semiconductor memory device according to the first to ninth embodiments of the invention.

When the USB flash unit 146 is connected to the host platform 144, a standard USB enumeration process is started. In this process, the host platform 144 recognizes the USB flash unit 146, selects a communication mode with the USB flash unit 146, and transmits and receives data to and from the USB flash unit 146 through a FIFO buffer for storing transfer data, called end point. The host platform 144 recognizes change in the physical or electric state, such as detaching/attaching state, of the USB flash unit 146 through another end point and receives a packet to be received if it exists.

The host platform 144 sends a request packet from the USB host controller 154 to request service of the USB flash unit

146. The USB host controller 154 transmits a packet onto the USB cable 148. If the USB flash unit 146 is a unit having an end point accepting the request packet, the request is received by the USB flash unit controller 156.

Next, the USB flash unit controller 156 performs various types of operation of data reading, writing, erasing, etc., from or to the flash memory module 158. It also supports the basic USB function of USB address acquisition, etc. The USB flash unit controller 156 controls the flash memory module 158 through a control line 160 for controlling output of the flash memory module 158 by using a read/write signal and various other signals such as a chip enable signal CE. The flash memory module 158 is also connected to the USB flash unit controller 156 by an address data bus 162 for transferring commands of reading, writing, erasing, etc., given to the flash memory module 158 and the address and data of the flash memory module 158.

The USB flash unit 146 transmits a state packet using a state endpoint (endpoint 0) to inform the host platform 144 of the result and the state of various types of operation requested by the host platform 144. In this process, the host platform 144 checks whether or not a state packet exists (polling), and the USB flash unit 146 returns a null packet or the state packet itself if a new state message packet does not exist.

As described above, various functions of the USB flash unit 146 can be implemented. The connectors can also be connected directly to each other without the USB cable 148.

(Memory Card)

APPLICATION EXAMPLE 2

Figure 55:
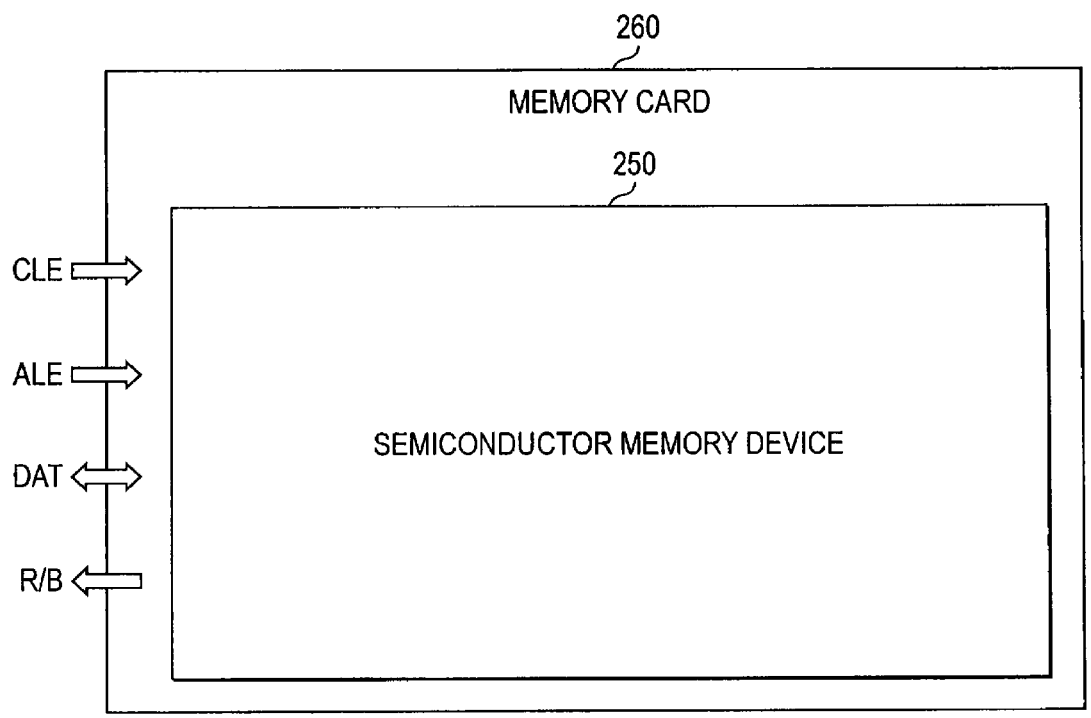
FIG. 55 is a schematic block diagram to show the internal structure of a memory card incorporating the nonvolatile semiconductor memory device according to the first to ninth embodiment of the invention.

A memory card 260 containing a semiconductor memory device 250 is configured as shown in FIG. 55 as an example. The nonvolatile semiconductor memory device according to the first to ninth embodiments of the invention can be applied to the semiconductor memory device 250. The memory card 260 can receive a predetermined signal from an external device (not shown) or output a predetermined signal to an external device, as shown in FIG. 55.

A signal line DAT, a command line enable signal line CLE, an address line enable signal line ALE, and a ready/busy signal line R/B are connected to the memory card 260 containing the semiconductor memory device 250. The signal line DAT is used for transferring a data signal, an address signal, or a command signal. The command line enable signal line CLE is used for transmitting a signal indicating that a command signal is transferred on the signal line DAT. The address line enable signal line ALE is used for transmitting a signal indicating that an address signal is transferred on the signal line DAT. The ready/busy signal line R/B is used for transmitting a signal indicating whether or not the semiconductor memory device 250 is ready.

APPLICATION EXAMPLE 3

Figure 56:
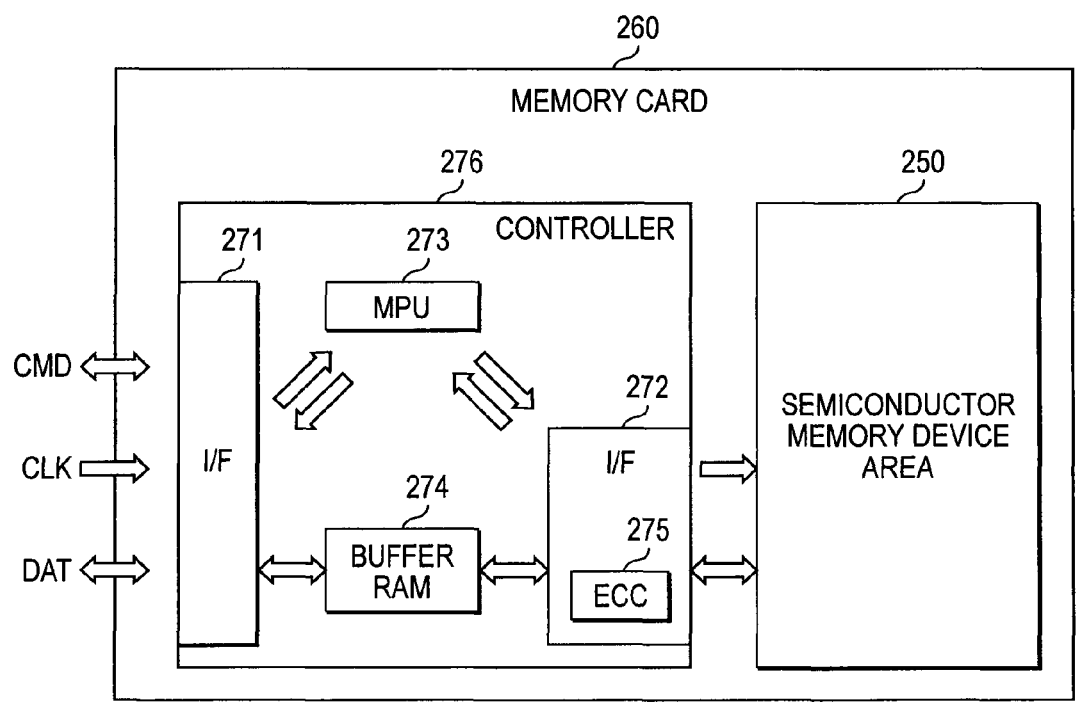
FIG. 56 is a schematic block diagram to show the internal structure of a memory card incorporating the nonvolatile semiconductor memory device according to the first to ninth embodiment of the invention.

As another specific example of memory card 260, unlike the example of the memory card in FIG. 55, the memory card 260 further includes a controller 276 in addition to the semiconductor memory device 250 for controlling the semiconductor memory device 250 and transmitting and receiving a predetermined signal to and from an external device, as shown in FIG. 56. The controller 276 includes interface units (I/F) 271 and 272, a microprocessor unit (MPU) 273, buffer RAM 274, and an error correction code unit (ECC) 275 contained in the interface unit (I/F) 272.

The interface unit (I/F) 271 transmits and receives a predetermined signal to and from an external device, and the interface unit (I/F) 272 transmits and receives a predetermined signal to and from the semiconductor memory device 250. The microprocessor unit (MPU) 273 converts a logical address into a physical address. The buffer RAM 274 temporarily stores data. The error correction code unit (ECC) 275 generates an error correction code.

A command signal line CMD, a clock signal line CLK, and a signal line DAT are connected to the memory card 260. The number of the control signal lines, the bit width of the signal line DAT, and the circuit configuration of the controller 276 can be modified as appropriate.

APPLICATION EXAMPLE 4

Figure 57:
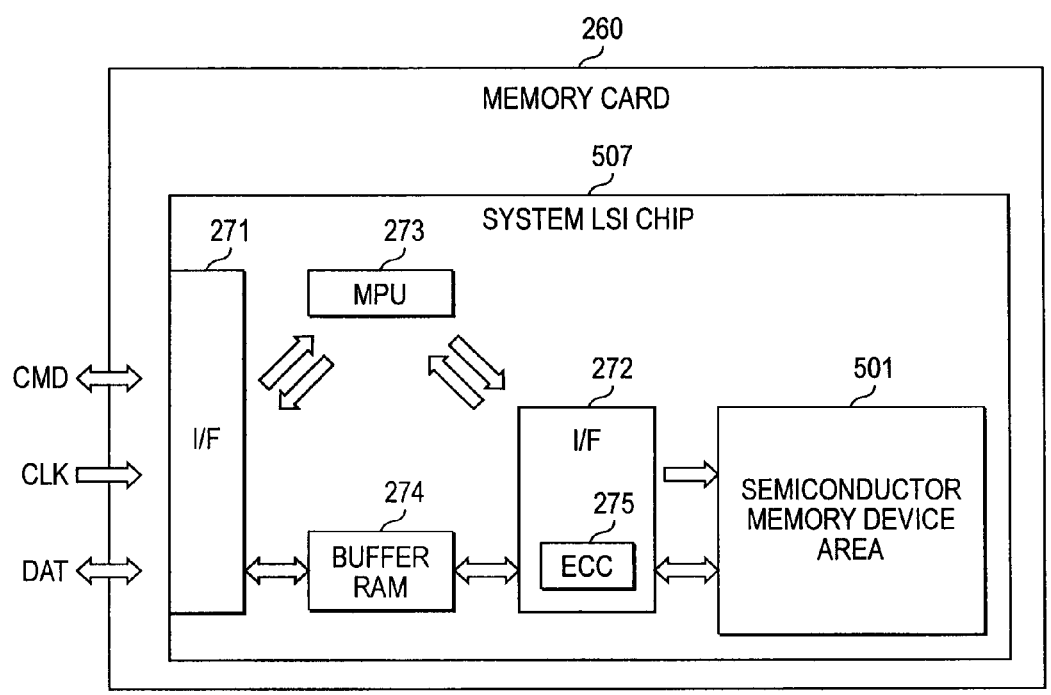
FIG. 57 is a schematic block diagram to show the internal structure of a memory card incorporating the nonvolatile semiconductor memory device according to the first to ninth embodiment of the invention.

As still another configuration example of memory card 260, interface units (I/F) 271 and 272, a microprocessor unit (MPU) 273, buffer RAM 274, an error correction code unit (ECC) 275 contained in the interface unit (I/F) 272, and a semiconductor memory device area 501 are integrated into one chip as a system LSI chip 507, as shown in FIG. 57. Such a system LSI chip 507 is installed in the memory card 260.

APPLICATION EXAMPLE 5

Figure 58:
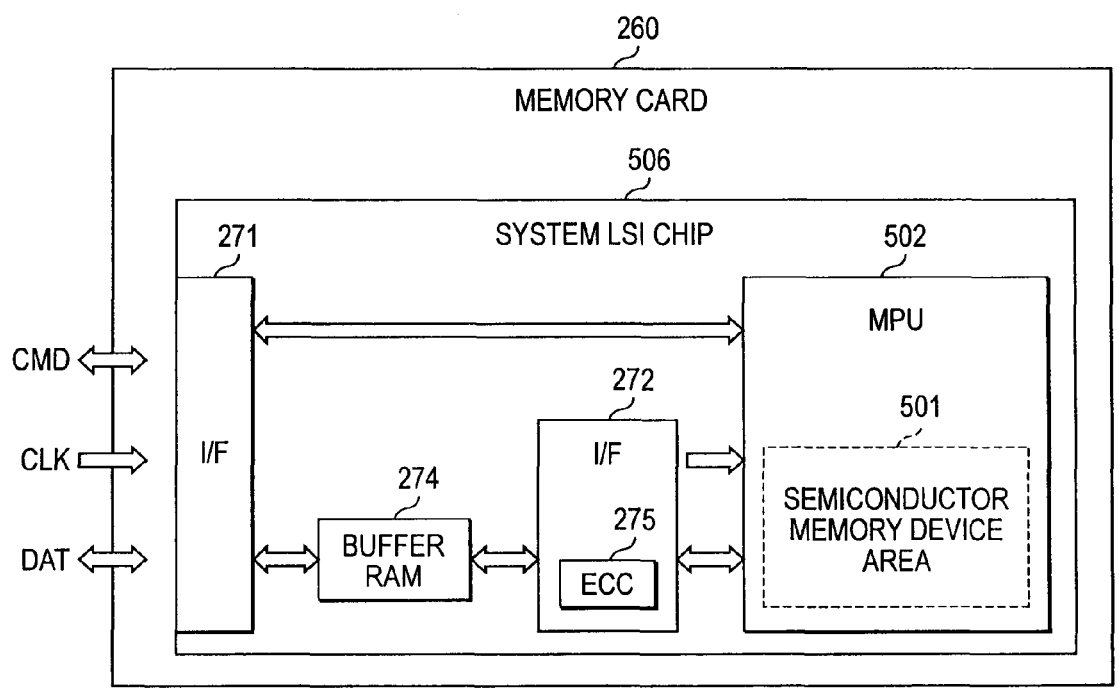
FIG. 58 is a schematic block diagram to show the internal structure of a memory card incorporating the nonvolatile semiconductor memory device according to the first to ninth embodiment of the invention.

As still another configuration example of memory card 260, as shown in FIG. 58, a semiconductor memory device area 501 is formed in a microprocessor unit (MPU) 273 to implement a memory-mixed MPU 502. The memory-mixed MPU 502, interface units (I/F) 271 and 272, buffer RAM 274, and an error correction code unit (ECC) 275 contained in the interface unit (I/F) 272 are integrated into one chip as a system LSI chip 506, as shown in FIG. 58. Such a system LSI chip 506 is installed in the memory card 260.

APPLICATION EXAMPLE 6

Figure 59:
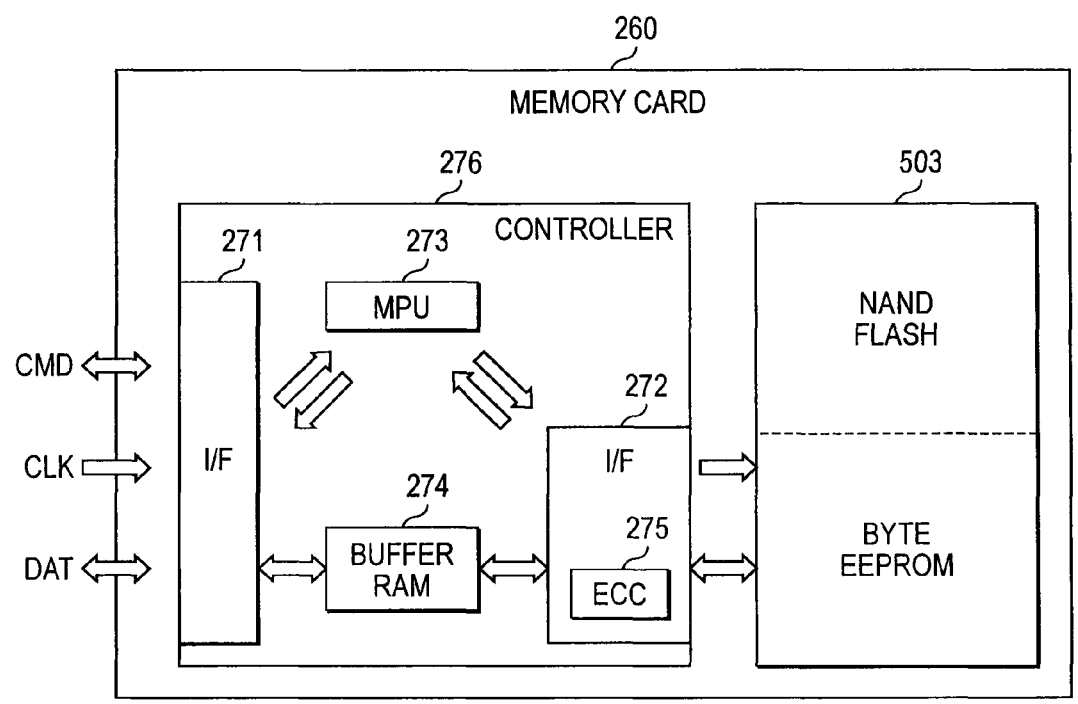
FIG. 59 is a schematic block diagram to show the internal structure of a memory card incorporating the nonvolatile semiconductor memory device according to the first to ninth embodiment of the invention.

As still another configuration example of memory card 260, as shown in FIG. 59, a flash memory 503 in the EEPROM mode having a ROM area including a NAND type flash memory and a byte type EEPROM is used in place of the semiconductor memory device 250 shown in FIG. 56.

The flash memory 503 in the EEPROM mode having a ROM area may be formed in the same chip as the controller 276 to form a system LSI chip 507 as one chip as shown in FIG. 57. Further, a semiconductor memory area implemented as the flash memory 503 in the EEPROM mode having a ROM area may be formed in a microprocessor unit (MPU) 273 to implement a memory-mixed MPU 502, and the memory-mixed MPU 502, interface units (I/F) 271 and 272, and buffer RAM 274 may be integrated into one chip as a system LSI chip 506, as shown in FIG. 58.

APPLICATION EXAMPLE 7

Figure 60:
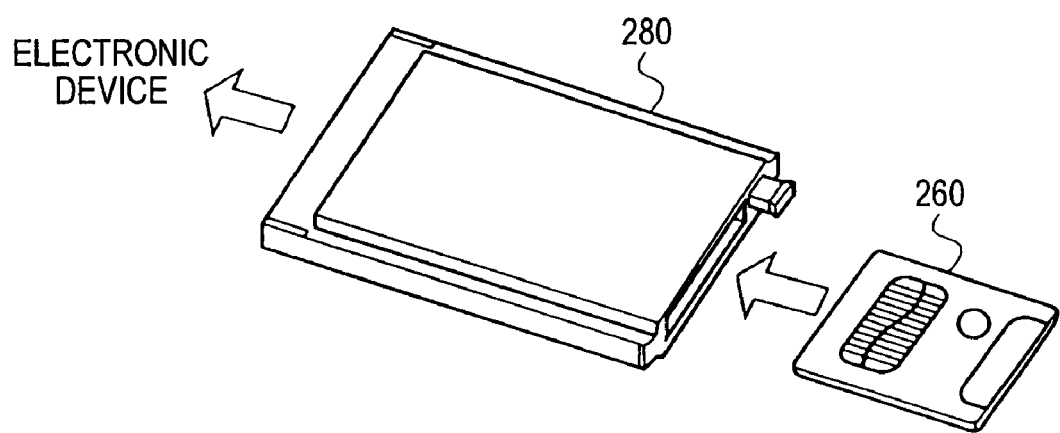
FIG. 60 is a schematic drawing of a memory card incorporating the nonvolatile semiconductor memory device according to the first to ninth embodiment of the invention and a card holder.

As shown in FIG. 60, a memory card holder 280 can be assumed as an application example of the memory card 260 shown in FIGS. 55 to 59. The memory card holder 280 can accommodate the memory card 260 including the nonvolatile semiconductor memory device described in the first to ninth embodiments of the invention as a semiconductor memory device 250. The memory card holder 280 can be connected to an electronic device (not shown) and can operate as an interface between the memory card 260 and the electronic device. The memory card holder 280 can execute various functions as well as the functions of the controller 276, the microprocessor unit (MPU) 273, the buffer RAM 274, the error correction code unit (ECC) 275, the interface units (I/F) 271 and 272, etc., in the memory card 260 disclosed in FIGS. 55 to 59.

APPLICATION EXAMPLE 8

Figure 61:
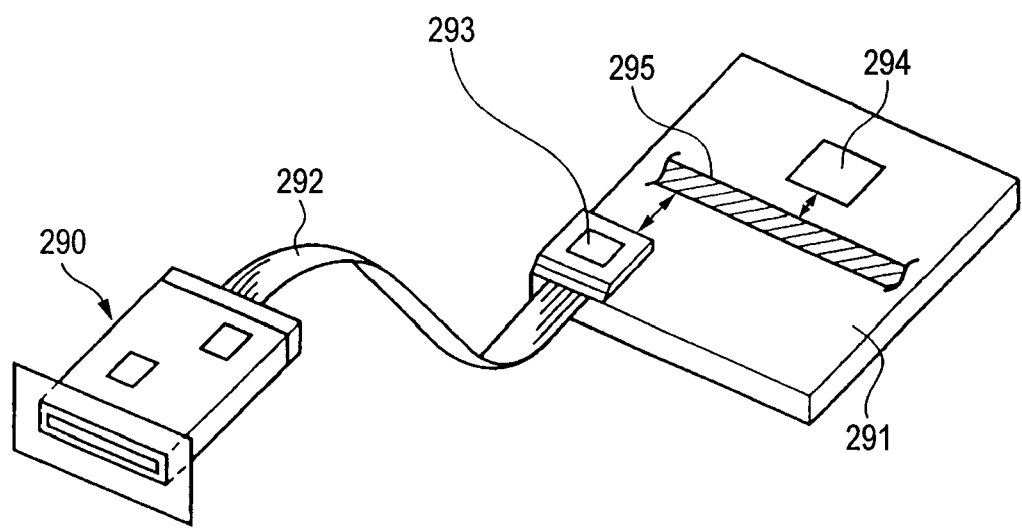
FIG. 61 is a schematic drawing of a connection device that can accommodate a memory card incorporating the nonvolatile semiconductor memory device according to the first to ninth embodiment of the invention and a card holder of the memory card.

Still another application example will be described with reference to FIG. 61. FIG. 61 discloses a connection device 290 that can accommodate a memory card 260 or a memory card holder 280. Either the memory card 260 or the memory card holder 280 includes the nonvolatile semiconductor memory device described in detail in the first to ninth embodiments of the invention as a semiconductor memory device 250 or a semiconductor memory device area 501, a memory-mixed MPU 502, or a flash memory 503 in the EEPROM mode having a ROM area. The memory card 260 or the memory card holder 280 is attached to and electrically connected to the connection device 290. The connection device 290 is connected to a circuit board 291 including a CPU 294 and a bus 295 through a connection wire 292 and an interface circuit 293.

APPLICATION EXAMPLE 9

Figure 62:
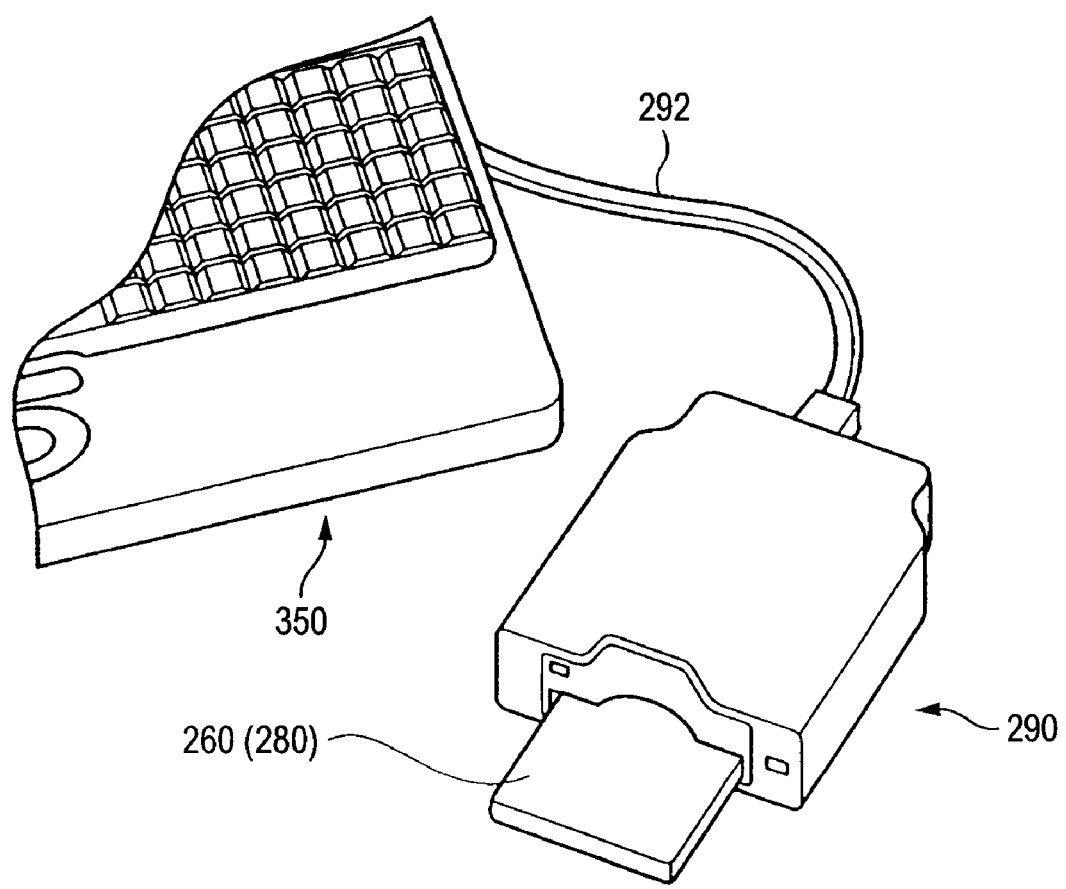
FIG. 62 is a schematic drawing of a connection device for containing a memory card incorporating the nonvolatile semiconductor memory device according to the first to ninth embodiment of the invention and connecting the memory card to a personal computer through a connection wire.

Another application example will be described with reference to FIG. 62. A memory card 260 or a memory card holder 280 includes the nonvolatile semiconductor memory device described in the first to ninth embodiments of the invention as a semiconductor memory device 250 or a semiconductor memory device area 501, a memory-mixed MPU 502, or a flash memory 503 in the EEPROM mode having a ROM area. The memory card 260 or the memory card holder 280 is attached to and electrically connected to a connection device 290. The connection device 290 is connected to a personal computer (PC) 350 through a connection wire 292.

APPLICATION EXAMPLE 10

Figure 63:
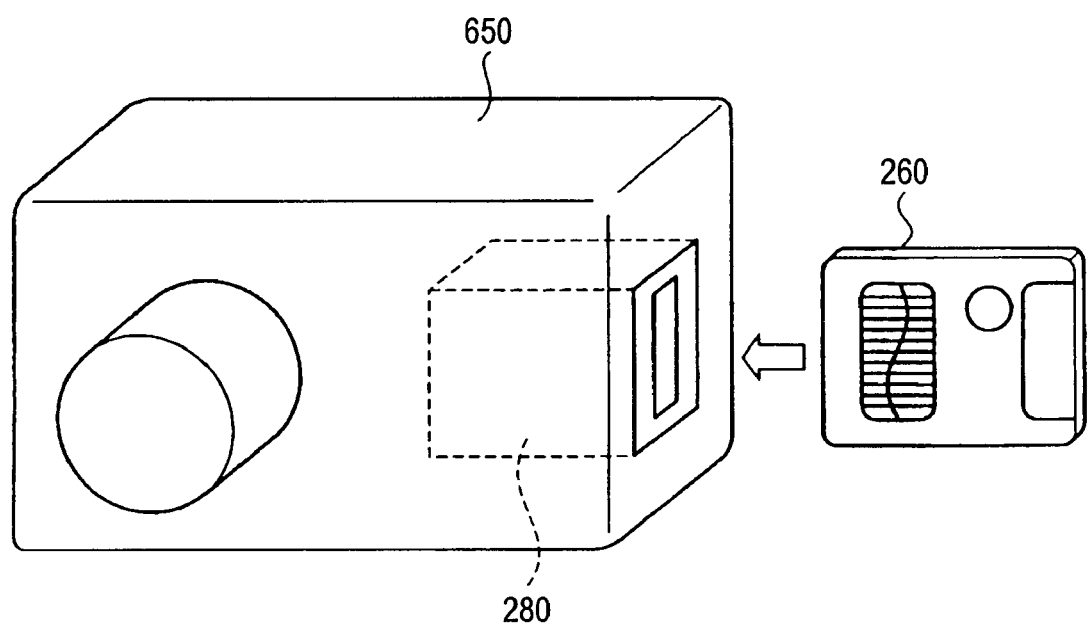
FIG. 63 is a schematic drawing of a digital camera system that can contain a memory card incorporating the nonvolatile semiconductor memory device according to the first to ninth embodiment of the invention.

Another application example will be described with reference to FIG. 63. A memory card 260 includes the nonvolatile semiconductor memory device described in detail in the first to ninth embodiments of the invention as a semiconductor memory device 250 or a semiconductor memory device area 501, a memory-mixed MPU 502, or a flash memory 503 in the EEPROM mode having a ROM area. FIG. 63 shows an example of applying such a memory card 260 to a digital camera 650 containing a memory card holder 280.

(IC Card)

APPLICATION EXAMPLE 11

Figure 64:
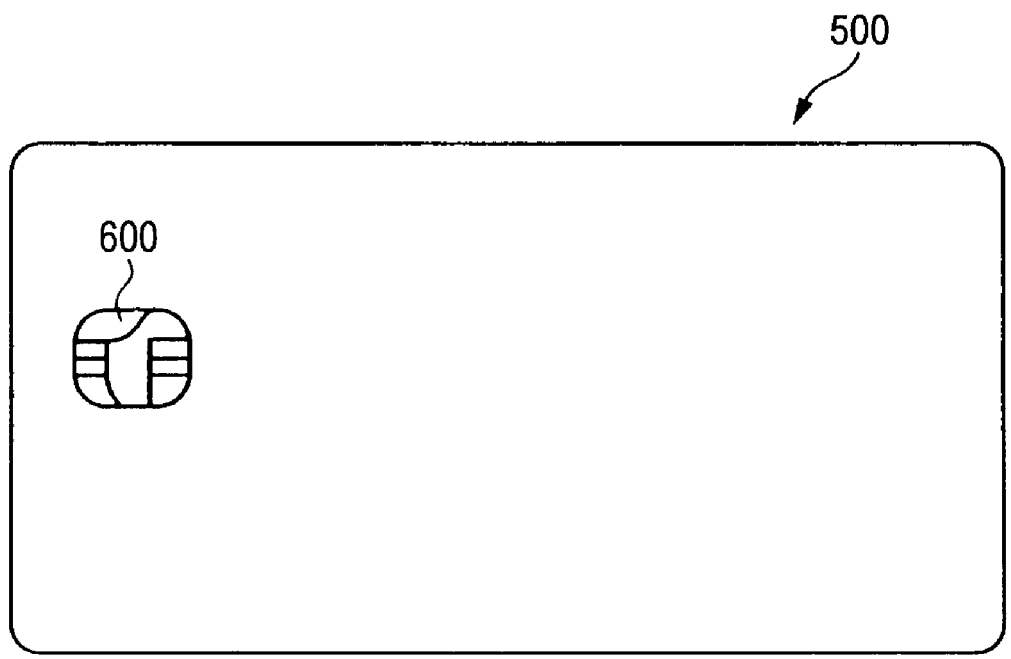
FIG. 64 is a schematic drawing of an IC card incorporating the nonvolatile semiconductor memory device according to the first to ninth embodiment of the invention.
Figure 65:
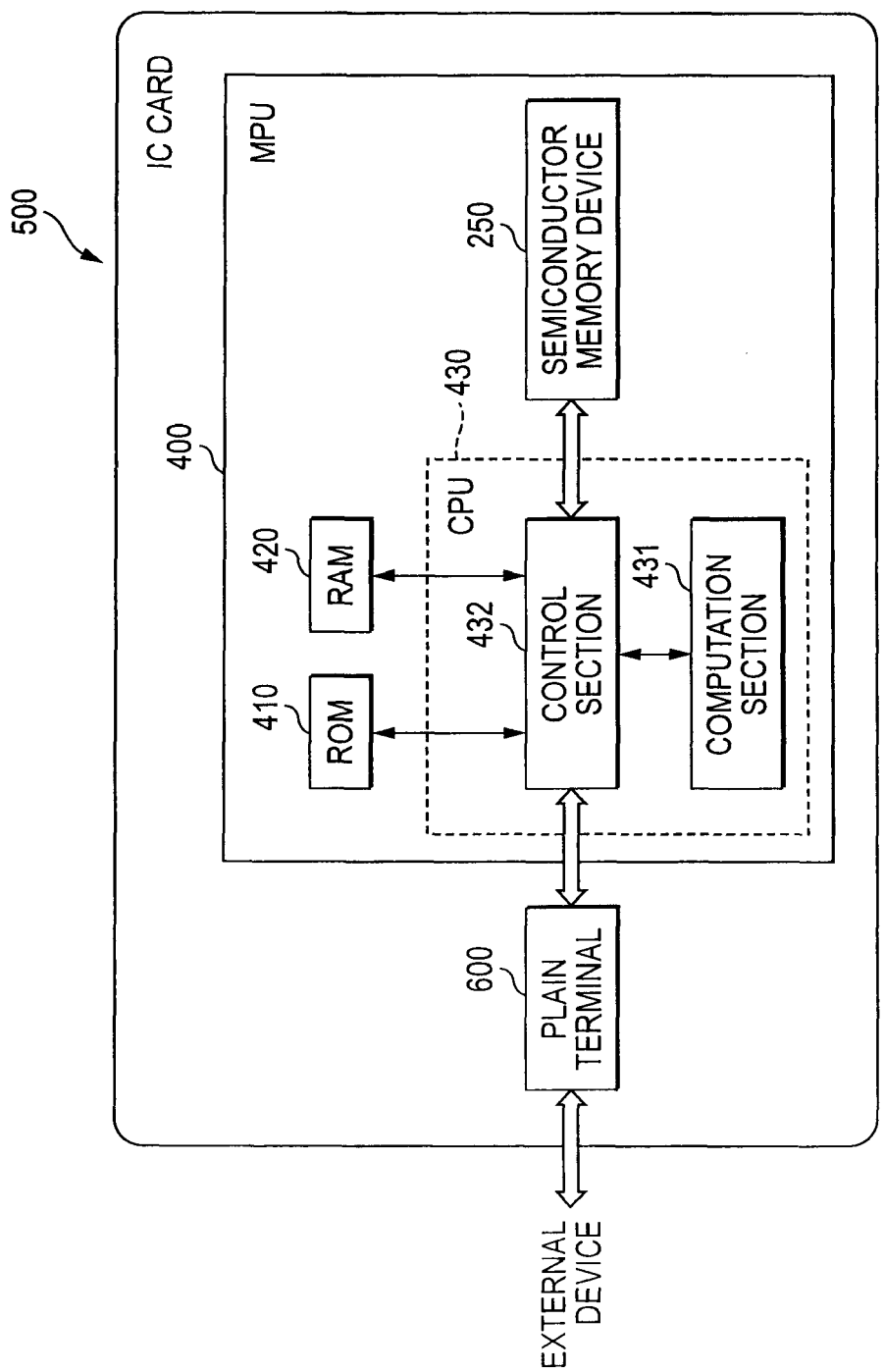
FIG. 65 is a schematic block diagram to show the internal structure of an IC card incorporating the nonvolatile semiconductor memory device according to the first to ninth embodiment of the invention.

As another application example of the nonvolatile semiconductor memory device according to the first to ninth embodiments of the invention, an IC (interface Circuit) card 500 includes: an MPU including a semiconductor memory device 250, ROM 410, RAM 420, and a CPU 430; and a plain terminal 600, as shown in FIGS. 64 and 65. The IC card 500 can be connected to an external device through the plain terminal 600. The plain terminal 600 is connected to the MPU 400 in the IC card 500. The CPU 430 contains a computation section 431 and a control section 432. The control section 432 is connected to the semiconductor memory device 250, the ROM 410, and the RAM 420. It is preferable that the MPU 400 is molded on one surface of the IC card 500 and the plain terminal 600 is formed on an opposite surface of the IC card 500.

In FIG. 65, the nonvolatile semiconductor memory device described in detail in the first to ninth embodiments of the invention can be applied to the semiconductor memory device 250 or the ROM 410. The nonvolatile semiconductor memory device can operate in page mode, byte mode, or pseudo EEROM mode.

APPLICATION EXAMPLE 12

Figure 66:
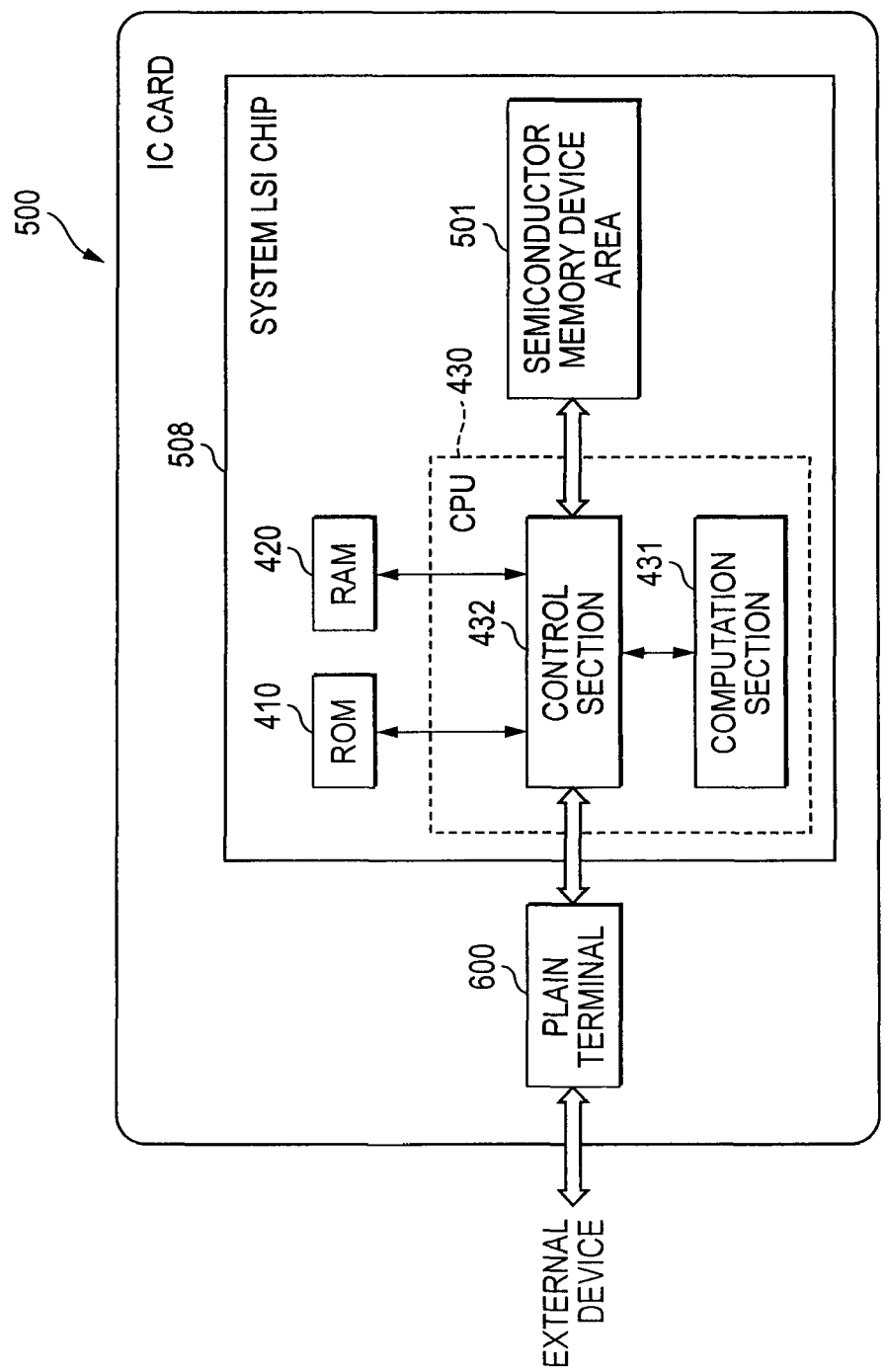
FIG. 66 is a schematic block diagram to show the internal structure of an IC card incorporating the nonvolatile semiconductor memory device according to the first to ninth embodiment of the invention.

As still another configuration example of IC card 500, ROM 410, RAM 420, a CPU 430, and a semiconductor memory device area 501 are integrated into one chip as a system LSI chip 508, as shown in FIG. 66. Such a system LSI chip 508 is contained in the IC card 500. In FIG. 66, the nonvolatile semiconductor memory device described in detail in the first to ninth embodiments of the invention can be applied to the semiconductor memory device area 501 and the ROM 410. The nonvolatile semiconductor memory device can operate in page mode, byte mode, or pseudo EEROM mode.

APPLICATION EXAMPLE 13

Figure 67:
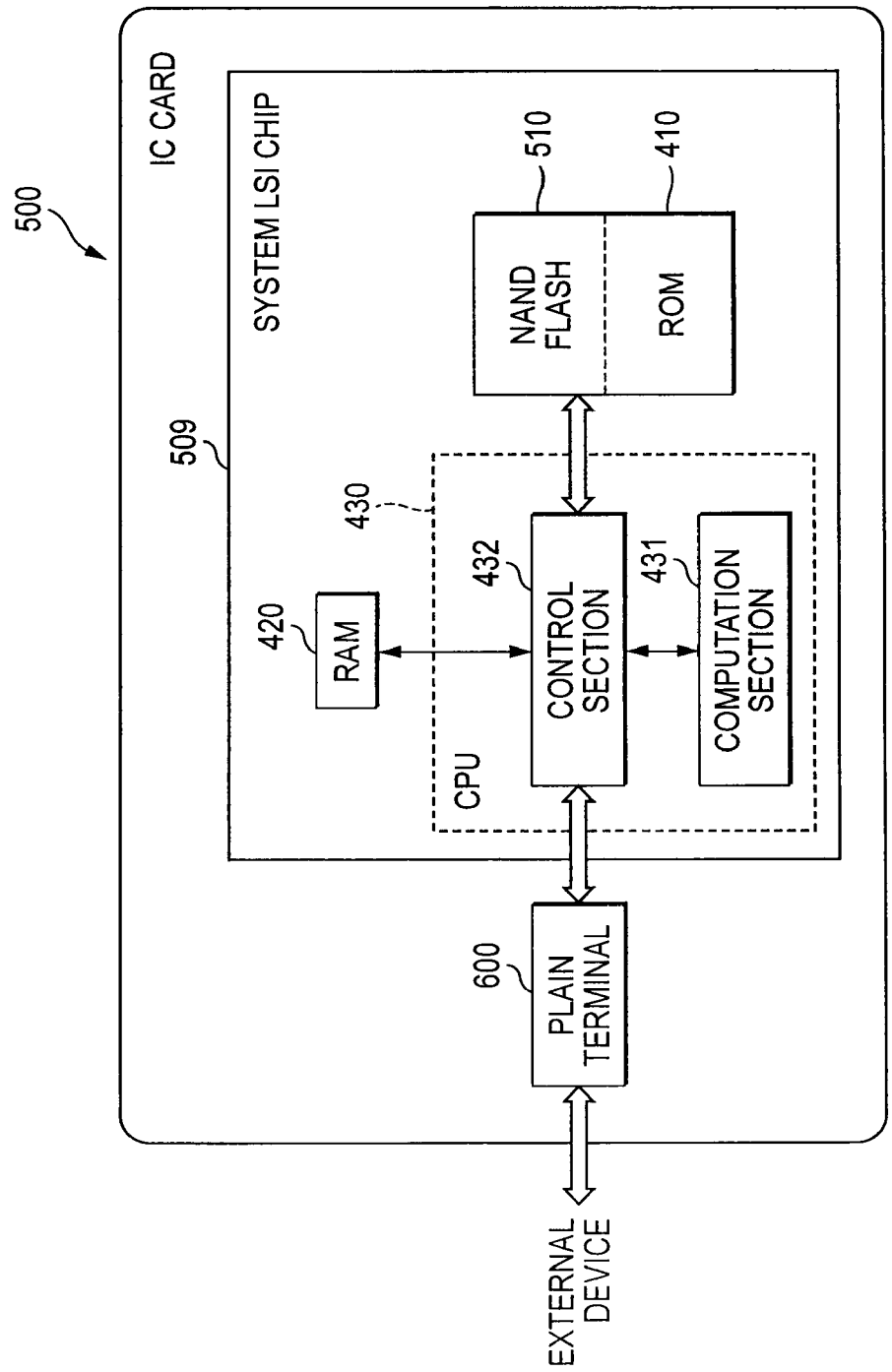
FIG. 67 is a schematic block diagram to show the internal structure of an IC card incorporating the nonvolatile semiconductor memory device according to the first to ninth embodiment of the invention.

As still another configuration example of IC card 500, ROM 410 is contained in a semiconductor memory device area 501 to form a flash memory 510 in the EEPROM mode having a ROM area as a whole, as shown in FIG. 67.

Further, the flash memory 510 in the EEPROM mode having a ROM area, RAM 420, and a CPU 430 are integrated into one chip as a system LSI chip 509. Such a system LSI chip 509 is contained in the IC card 500.

APPLICATION EXAMPLE 14

Figure 68:
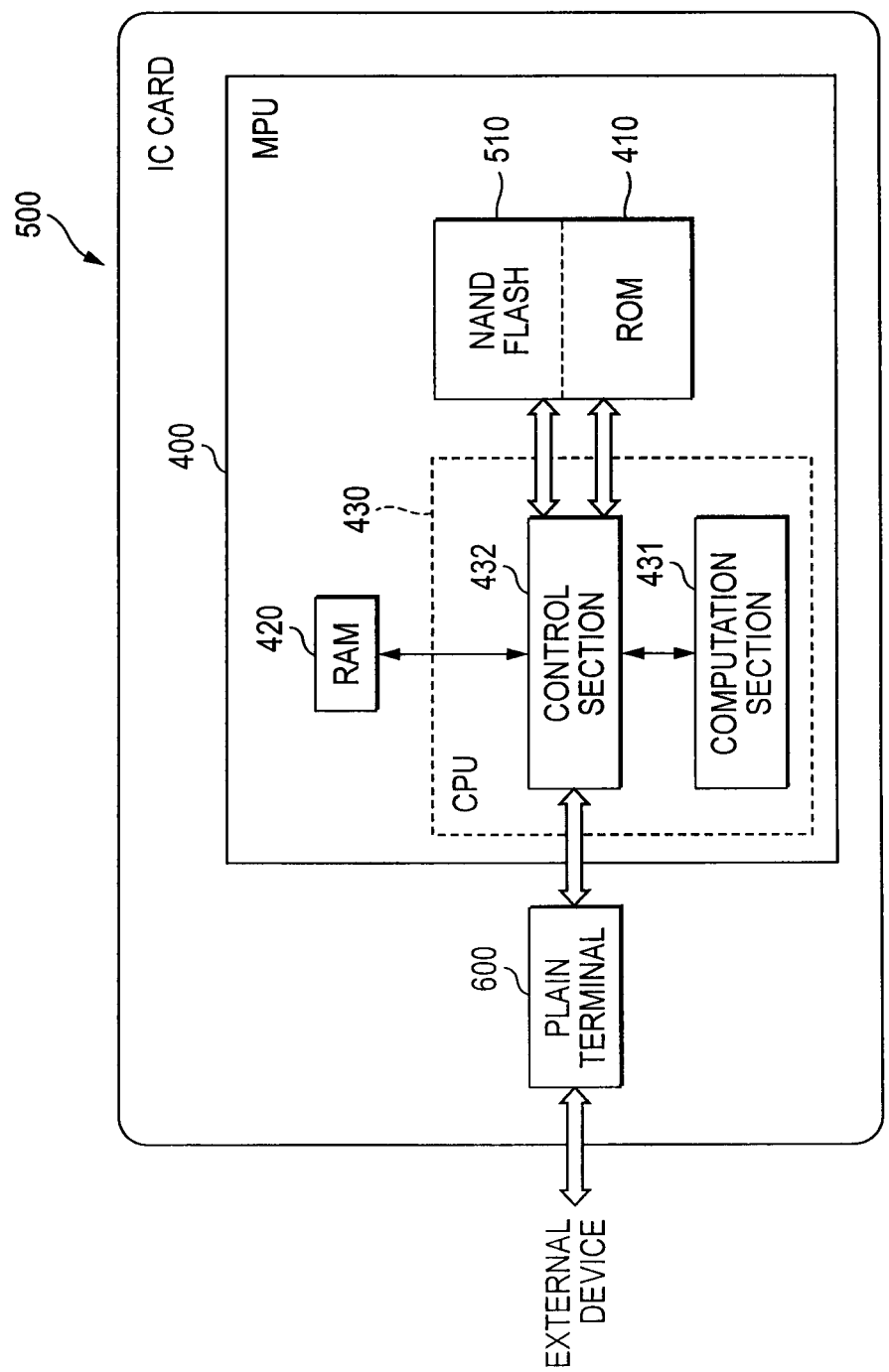
FIG. 68 is a schematic block diagram to show the internal structure of an IC card incorporating the nonvolatile semiconductor memory device according to the first to ninth embodiment of the invention.

As still another configuration example of IC card 500, ROM 410 is contained in the semiconductor memory device 250 shown in FIG. 65 to form a flash memory 510 in the EEPROM mode having a ROM area as a whole, as shown in FIG. 68. The flash memory 510 in the EEPROM mode having a ROM area is contained in an MPU 400 as with FIG. 65.

OTHER EMBODIMENTS

Although the invention has been described with the first to ninth embodiments, it is to be understood that the description and the drawings forming parts of the disclosure do not limit the invention. From the disclosure, various alternative embodiments, examples, and operational arts will be apparent to those skilled in the art.

Various modified examples are also possible in the manufacturing process of the memory cell transistors of the nonvolatile semiconductor memory device according to the first to ninth embodiments.

Further, the memory cell transistors of the nonvolatile semiconductor memory device according to the first to ninth embodiments of the invention are not limited to a binary logic memory. For example, the memory cell transistors can also be applied to a multivalued logic memory of ternary or more. For example, a nonvolatile semiconductor memory device of four-valued storage would accomplish a memory capacity twice that of a nonvolatile semiconductor memory device of binary storage. Further, the invention can also be applied to a nonvolatile semiconductor memory device of multivalued storage of m-valued or more-valued storage (m>3).

The invention contains various embodiments, etc., not described herein. Therefore, the technical scope of the invention is to be determined solely by the inventive concepts which are delineated by the claims adequate from the description given above.

What is claimed is:

1. A nonvolatile semiconductor memory device comprising:
   a semiconductor region;
   device isolation regions placed in the semiconductor region and extending in a column direction;
   a semiconductor layer placed on the semiconductor region and between the device isolation regions, and having a substantially trapezoidal convex shape in cross section along a row direction;
   source/drain regions placed in the semiconductor layer and spaced from each other;
   a gate insulating film placed on the semiconductor layer between the source/drain regions;
   a floating gate electrode layer placed on the gate insulating film;
   an intergate insulating film placed on the floating gate electrode layer and upper surfaces of the device isolation regions; and
   a control gate electrode layer placed on the intergate insulating film and extending in the row direction,
   wherein the semiconductor layer has a convex shape in cross section along the column direction.

2. The device according to claim 1, wherein the gate insulating film has a smaller thickness in a vicinity of a top of the convex shape of the semiconductor layer and a larger thickness in a vicinity of a bottom of the convex shape of the semiconductor layer.

3. The device according to claim 1, wherein an upper surface of the device isolation region is substantially flush with an upper surface of the floating gate electrode layer.

4. The device according to claim 1, wherein an upper portion of the floating gate electrode layer has a convex shape.

5. A nonvolatile semiconductor memory device comprising:
   a semiconductor region;
   device isolation regions placed in the semiconductor region and extending in a column direction;
   a semiconductor layer placed on the semiconductor region and between the device isolation regions, and having a convex shape in cross section along a row direction;
   source/drain regions placed in the semiconductor layer and spaced from each other;
   a gate insulating film placed on the semiconductor layer between the source/drain regions;
   a floating gate electrode layer placed on the gate insulating film;
   an intergate insulating film placed on the floating gate electrode layer and upper surfaces of the device isolation regions; and
   a control gate electrode layer placed on the intergate insulating film and extending in the row direction,
   wherein the convex shape is a substantially triangular shape.

6. The A nonvolatile semiconductor memory device comprising:
   a semiconductor region;
   device isolation regions placed in the semiconductor region and extending in a column direction;
   a semiconductor layer placed on the semiconductor region and between the device isolation regions, and having a substantially trapezoidal convex shape in cross section along a row direction;
   source/drain regions placed in the semiconductor layer and spaced from each other;
   a gate insulating film placed on the semiconductor layer between the source/drain regions;
   a floating gate electrode layer placed on the gate insulating film;
   an intergate insulating film placed on the floating gate electrode layer and upper surfaces of the device isolation regions; and
   a control gate electrode layer placed on the intergate insulating film and extending in the row direction,
   wherein the floating gate electrode layer has a substantially inverted Y shape.

* * * * *